United States Patent
Lee et al.

(10) Patent No.: US 12,543,499 B2
(45) Date of Patent: Feb. 3, 2026

(54) ORGANIC ELECTRIC ELEMENT COMPRISING A LIGHT-EMITTING AUXILIARY LAYER AND ELECTRONIC DEVICE COMPRISING THE SAME

(71) Applicant: DUK SAN NEOLUX CO., LTD., Chungcheongnam-do (KR)

(72) Inventors: Bum Sung Lee, Chungcheongnam-do (KR); Min Ji Jo, Chungcheongnam-do (KR); Soung Yun Mun, Chungcheongnam-do (KR); Sun Hee Lee, Chungcheongnam-do (KR); Je Woo Lee, Chungcheongnam-do (KR); Young Hoon Kang, Chungcheongnam-do (KR)

(73) Assignee: DUK SAN NEOLUX CO., LTD., Chungcheongnam-Do (KR)

( * ) Notice: Subject to any disclaimer, the term of this patent is extended or adjusted under 35 U.S.C. 154(b) by 965 days.

(21) Appl. No.: 17/769,482

(22) PCT Filed: Sep. 4, 2020

(86) PCT No.: PCT/KR2020/011954
§ 371 (c)(1),
(2) Date: Apr. 15, 2022

(87) PCT Pub. No.: WO2021/075718
PCT Pub. Date: Apr. 22, 2021

(65) Prior Publication Data
US 2024/0164207 A1     May 16, 2024

(30) Foreign Application Priority Data
Oct. 15, 2019 (KR) .................. 10-2019-0127428

(51) Int. Cl.
*H10K 85/60* (2023.01)
*C07B 59/00* (2006.01)

(52) U.S. Cl.
CPC ....... *H10K 85/6572* (2023.02); *C07B 59/004* (2013.01); *H10K 85/622* (2023.02); *H10K 85/633* (2023.02); *H10K 85/654* (2023.02); *H10K 85/6574* (2023.02); *H10K 85/6576* (2023.02); *C07B 2200/05* (2013.01)

(58) Field of Classification Search
CPC ............. H10K 85/6572; H10K 85/622; H10K 85/633; H10K 85/654; H10K 85/6574; H10K 85/6576; H10K 50/11; H10K 2101/40; H10K 50/156; H10K 50/14; H10K 85/657; H10K 30/865; C07B 59/004; C07B 2200/05

See application file for complete search history.

(56) References Cited

U.S. PATENT DOCUMENTS

| | | | |
|---|---|---|---|
| 2014/0008633 A1* | 1/2014 | Kato | ................... H10K 85/615 548/440 |
| 2016/0204370 A1* | 7/2016 | Park | ...................... H10K 50/11 438/46 |
| 2018/0040827 A1 | 2/2018 | Choi et al. | |

FOREIGN PATENT DOCUMENTS

| | | |
|---|---|---|
| CN | 107667099 A | 2/2018 |
| JP | 2015128115 A * | 7/2015 |
| KR | 10-2014-0080685 A | 7/2014 |
| KR | 10-2015-0125158 A | 11/2015 |
| KR | 10-2015-0137012 A | 12/2015 |
| KR | 10-2016-0087991 A | 7/2016 |
| KR | 10-2017-0037082 A | 4/2017 |
| KR | 10-2017-0080287 A | 7/2017 |
| KR | 10-2017-0134215 A | 12/2017 |
| KR | 10-2019-0044148 A | 4/2019 |
| KR | 10-2019-0078040 A | 7/2019 |

OTHER PUBLICATIONS

Translation of JP-2015128115-A (publication date: Jul. 9, 2015). (Year: 2015).*
Office action issued on Oct. 24, 2023 from Korean Patent Office in a counterpart Korean Patent Application No. 10-2019-0127428 (English translation is also submitted herewith.).
International Search Report for PCT/KR2020/011954 mailed on Dec. 21, 2020.

* cited by examiner

*Primary Examiner* — Dawn L Garrett
(74) *Attorney, Agent, or Firm* — The PL Law Group, PLLC

(57) ABSTRACT

An organic electric element according to an embodiment of the present disclosure includes a first electrode, a second electrode, and an organic material layer formed between the first electrode and the second electrode. The organic material layer may include a plurality of light-emitting auxiliary layers and the LUMO/HOMO energy levels of the plurality of light-emitting auxiliary layers are limited to specific conditions in relation to the neighboring organic material layers, thereby the driving voltage, the luminous efficiency and the lifetime of the organic electric element can be improved.

19 Claims, 6 Drawing Sheets

ORGANIC ELECTRIC ELEMENT COMPRISING A LIGHT-EMITTING AUXILIARY LAYER AND ELECTRONIC DEVICE COMPRISING THE SAME

CROSS REFERENCE TO RELATED APPLICATIONS AND CLAIM OF PRIORITY

This application claims benefit under 35 U.S.C. 119, 120, 121, or 365(c), and is a National Stage entry from International Application No. PCT/KR2020/011954, filed Sep. 4, 2020, which claims priority to the benefit of Korean Patent Application No. 10-2019-0127428 filed in the Korean Intellectual Property Office on Oct. 15, 2019, the entire contents of which are incorporated herein by reference.

BACKGROUND

1. Technical Field

The present invention relates to an organic electric element comprising a light-emitting auxiliary layer and an electronic device including the same, and more particularly, to an organic electric element including a light-emitting auxiliary layer having a LUMO energy level higher than that of a hole transport layer and an electronic device including the same.

2. Background Art

Hereinafter, the configuration of the organic light emitting element will be described with reference to FIG. 1. FIG. 1 shows a schematic configuration of an organic light emitting element.

Referring to FIG. 1, in general, an organic light emitting element includes an anode 11, a cathode 17 and an organic material layer formed therebetween, and the organic material layer includes a hole injection layer 12, a hole transport layer 13 and a light emitting layer 14, an electron transport layer 15, an electron injection layer 16 and the like.

The organic electroluminescent element, when an electric charge is injected into the light emitting layer formed between the anode and the cathode, electrons and holes form a pair to form excitons, is an element that emits energy of the excitons as light.

As can be seen from FIG. 1, in general, the HOMO (Highest Occupied Molecular Orbital) energy level of the light emitting layer 14 is lower than that of the hole transport layer 13 and the Lowest Unoccupied Molecular Orbital (LUMO) energy level of the light emitting layer 14 is higher than that of the electron transport layer 15.

The light emitting site moves according to the magnitude of the number of electrons and holes injected into the light emitting layer 14. Therefore, it is important to control the balance of electrons and holes injected into the light emitting layer 14 well in order to improve the luminous efficiency of the organic light emitting element. For example, the light emitting site moves from the light emitting layer 14 to a region close to the electron transport layer 15 when there are more holes than electrons, and the light emitting site moves from the light emitting layer 14 to a region close to the hole transport layer 13 when there are more electrons than holes.

Like this, when the light emitting site moves as described above, characteristics such as efficiency and lifespan of the organic light emitting element are changed.

In general, a method of changing the material of the organic material layer is used to control the charge balance of electrons and holes injected into the light emitting layer, but there is a limit to only changing the material. Accordingly, there is a need for a more improved method for controlling the balance between the organic material layers.

SUMMARY

The present invention has been proposed to solve the above problems, and an object of the present invention is to provide an organic electric element having improved efficiency and lifespan, and an electronic device including the same, wherein the element comprises a plurality of light-emitting auxiliary layers having different energy levels that are formed between the hole transporting layer and the light-emitting layer, the HOMO/LUMO energy level of each light-emitting auxiliary layer is adjusted in consideration of the physical properties of the adjacent hole transport layer and/or the light emitting layer, thereby improving the charge balance between electrons and holes in the light emitting layer, as a result, the efficiency and lifespan are improved.

In one aspect of the present invention, the present invention provides a blue organic electric element comprising at least one light-emitting auxiliary layer having a plurality of light-emitting auxiliary layers that have a LUMO energy level higher than the LUMO energy level of the hole transport layer.

In another aspect of the present invention, the present invention provides an electronic device comprising the blue organic electric element.

According to the present invention, the efficiency and lifespan of the organic electric element can be improved by forming a plurality of light-emitting auxiliary layers having an energy level controlled in relation to adjacent organic material layers to improve the charge balance of electrons and holes in the light-emitting layer.

DETAILED DESCRIPTION

Figure 1:
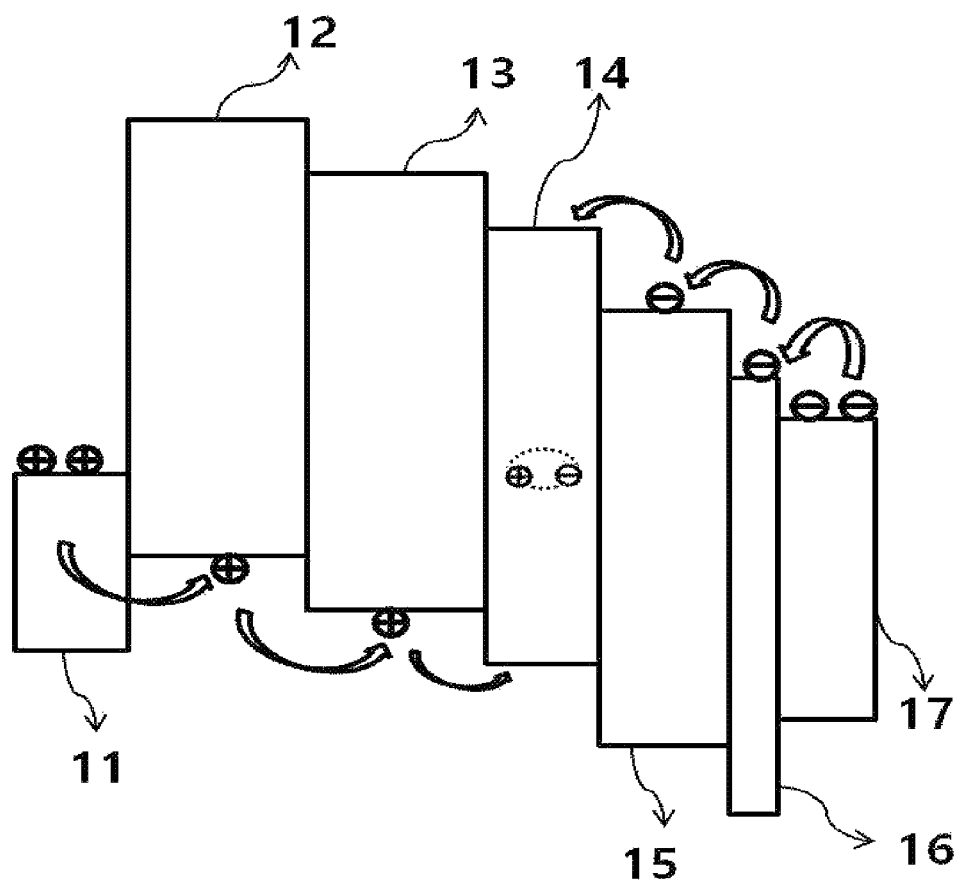
FIG. 1 is a schematic diagram of a conventional organic electric element.

Hereinafter, the present invention will be described with reference to the accompanying drawings.

In the reference numbers assigned to the components of each drawing, it should be noted that the same elements will be designated by the same reference numerals although they are shown in different drawings. In addition, in the following description of the present invention, a detailed description of known functions and configurations incorporated herein will be omitted when it may make the subject matter of the present invention rather unclear.

In describing the components of the present invention, terms such as first, second, A, B, (a), (b) or the like may be used. Each of these terminologies is not used for defining an essence, order or sequence of a corresponding component but used merely to distinguish the corresponding component from other component(s). It will be understood that the expression "one component is "connected," "coupled" or "joined" to another component" comprises the case where a third component may be "connected," "coupled," and "joined" between the first and second components as well as the case where the first component may be directly connected, coupled or joined to the second component.

In addition, it will be understood that when an element such as a layer, film, region or substrate is referred to as being "on" or "over" another element, it can be directly on the other element or intervening elements may also be present. In contrast, when an element is referred to as being "directly on" another element, there are no intervening elements present.

Unless otherwise stated, the term "aryl group" and "arylene group" as used herein has, but not limited to, 6 to 60 carbon atoms. The aryl group or arylene group in the present invention may comprise a monocyclic ring, ring assemblies, a fused polycyclic system, spiro compounds and the like. In addition, unless otherwise stated, a fluorenyl group may be comprised in an aryl group and a fluorenylene group may be comprised in an arylene group.

Unless otherwise stated, the term "fluorenyl group", "fluorenylene group" or "fluorenetriyl group" as used herein means univalent, bivalent or trivalent functional group in which R, R' and R" are all hydrogen in the following structure, "substituted fluorenyl group", "substituted fluorenylene group" or "substituted fluorenetriyl group" means that at least any one of R, R' and R" is a substituent other than hydrogen, and the case where R and R' are bonded to each other to form the spiro compound together with the carbon bonded to them is comprised. In this specification, a fluorene group, a fluorenylene group, and a fluorenetriyl group may be referred to as a fluorene group regardless of the valence.

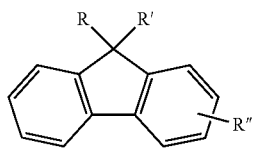

The term "spiro compound" as used herein has a spiro union which means union having one atom as the only common member of two rings. The common atom is designated as 'spiro atom'. The compounds are defined as 'monospiro-', 'dispiro-' or 'trispiro-' depending on the number of spiro atoms in one compound.

The term "heterocyclic group" used in the specification comprises a non-aromatic ring as well as an aromatic ring like "heteroaryl group" or "heteroarylene group". Unless otherwise stated, the term "heterocyclic group" means, but not limited to, a ring containing one or more heteroatoms and having 2 to 60 carbon atoms. Unless otherwise stated, the term "heteroatom" as used herein represents N, O, S, P or Si and the heterocyclic group means a monocyclic, ring assemblies, fused polycyclic system or spiro compound containing a heteroatom. In addition, heterocyclic group comprises the compound comprising the heteroatom group such as $SO_2$, $P=O$ and the like instead of carbon forming a ring like the following compound.

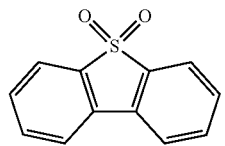 [SMILES: O=S1(=O)c2ccccc2-c2ccccc21]

The term "aliphatic ring group" as used herein refers to a cyclic hydrocarbon except for aromatic hydrocarbons, and comprises a monocyclic ring, ring assemblies, a fused polycyclic system, spiro compounds, and the like, and unless otherwise specified, it means a ring of 3 to 60 carbon atoms, but not limited thereto. For example, a fused ring formed by benzene being an aromatic ring with cyclohexane being a non-aromatic ring corresponds to aliphatic ring group.

In this specification, a 'group name' corresponding to an aryl group, an arylene group, a heterocyclic group, and the like exemplified for each symbol and its substituent may be written in the name of functional group reflecting the valence, and may also be described as the name of a parent compound. For example, in the case of phenanthrene which is a kind of aryl group, it may be described by distinguishing valence such as 'phenanthryl (group)' when it is 'monovalent group', and as 'phenanthrylene (group)' when it is 'divalent group', and it may also be described as a parent compound name, 'phenanthrene', regardless of its valence. Similarly, in the case of pyrimidine, it may be described as 'pyrimidine' regardless of its valence, and it may also be described as the name of corresponding functional group such as pyrimidinyl (group) when it is 'monovalent group', and as 'pyrimidylene (group)' when it is 'divalent group'.

In addition, in the present specification, the numbers and alphabets indicating a position may be omitted when describing a compound name or a substituent name, For example, pyrido[4,3-d]pyrimidine, benzopuro[2,3-d] pyrimidine and 9,9-dimethyl-9H-fluorene can be described as pyridopyrimidine, benzofurropyrimidine and dimethylfluorene, respectively. Therefore, both benzo[g]quinoxaline and benzo[f] quinoxaline can be described as benzoquinoxaline.

In addition, unless otherwise expressed, where any formula of the present invention is represented by the following formula, the substituent according to the index may be defined as follows.

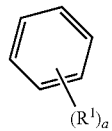

In the above formula, when a is an integer of zero, the substituent $R^1$ is absent, that is, hydrogen atoms are bonded to all the carbon constituting the benzene ring. Here, chemical formulas or compounds may be written without explicitly describing the hydrogen. In addition, one substituent $R^1$ is bonded to any carbon of the carbons forming the benzene ring when "a" is an integer of 1, when "a" is an integer of 2 or 3, substituents $R^1$s may be bonded to the carbon of the benzene ring, for example, as followings and, when "a" is an integer of 4 to 6, substituents $R^1$s are bonded to the carbon of the benzene ring in a similar manner. Further, when "a" is an integer of 2 or more, $R^1$s may be the same or different from each other.

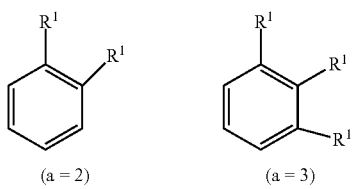

In addition, unless otherwise specified in the present specification, when referring to a condensed/fused ring, the number in the 'number-condensed/fused ring' indicates the number of condensed/fused rings. For example, a form in which three rings are condensed/fused with each other, such as anthracene, phenanthrene, and benzoquinazoline, may be represented by a 3-condensed/fused ring.

In addition, unless otherwise described herein, in the case of expressing a ring in the form of a 'number-membered' such as a 5-membered ring or a 6-membered ring, the number in the 'number-membered' represents the number of atoms forming the ring. For example, thiophene or furan may correspond to a 5-membered ring, and benzene or pyridine may correspond to a 6-membered ring.

In addition, unless otherwise specified in the present specification, the ring formed by bonding between adjacent groups may be selected from the group consisting of a $C_6$-$C_{60}$ aromatic ring group, a fluorenyl group, a $C_6$-$C_{60}$ heterocyclic group containing at least one heteroatom selected from the group consisting of O, N, S, Si, and P, and a $C_3$-$C_{60}$ aliphatic ring.

Unless otherwise stated, the term "between adjacent groups", for example, in case of the following Formulas, comprises not only "between $R_1$ and $R_2$", "between $R_2$ and $R_3$", "between $R_3$ and $R_4$", "between $R_5$ and $R_6$", but also "between $R_7$ and $R_8$" sharing one carbon, and may comprise "between substituents" attached to atom(carbon or nitrogen) consisting different ring, such as "between $R_1$ and $R_7$", "between $R_1$ and $R_8$", or "between $R_4$ and $R_5$" and the like. That is, where there are substituents bonded to adjacent elements constituting the same ring, the substituents may be correspond "adjacent groups", and even if there are no adjacent substituents on the same ring, substituents attached to the neighboring ring may correspond to "adjacent groups".

In the following Formula, when the substituents bonded to the same carbon, such as $R_7$ and $R_8$, are linked to each other to form a ring, a compound containing a spiro-moiety may be formed.

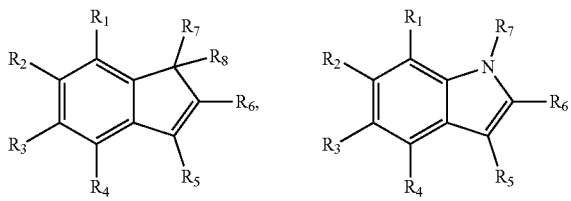

In addition, in the present specification, the expression 'neighboring groups may be linked to each other to form a ring' is used in the same sense as 'neighboring groups are linked selectively to each other to form a ring', and a case where at least one pair of neighboring groups may be bonded to each other to form a ring.

An organic electric element according to the present invention may comprise an anode, a cathode, and an organic material layer formed between the anode and the cathode.

The organic material layer may comprise a hole transport region, a light-emitting auxiliary layer, a light emitting layer, and an electron transport region. Preferably, the light emitting layer is a blue light emitting layer.

The hole transport region may comprise a hole injection layer and a hole transport layer, and the hole transport layer may be formed of one or more layers. In addition, a buffer layer may be further formed between the hole transport layer and the light-emitting auxiliary layer.

The electron transport region may comprise an electron injection layer and an electron transport layer, and an electron transport auxiliary layer may be further formed between the electron transport layer and the light emitting layer.

Specifically, a hole injection layer, a hole transport layer, a light-emitting auxiliary layer, a light emitting layer, an electron transport layer and an electron injection layer may be sequentially formed on the anode.

The light-emitting auxiliary layer may be composed of two or more layers having different energy levels. The light-emitting auxiliary layer includes at least one light-emitting auxiliary layer having a LUMO energy level higher than the LUMO energy level of the hole transport layer.

For example, the light-emitting auxiliary layer according to the present invention may include a first light-emitting auxiliary layer and a second light-emitting auxiliary layer, wherein the LUMO energy level of the first light-emitting auxiliary layer is higher than that of the hole transport layer, the second light-emitting auxiliary layer may be formed between the hole transport layer and the first light-emitting auxiliary layer or between the first light-emitting auxiliary layer and the light-emitting layer.

In fact, since the LUMO value has a negative value, 'the LUMO energy level of the first light-emitting auxiliary layer is higher than the LUMO energy level of the hole transport layer' means that the absolute value of the LUMO energy level of the first light-emitting auxiliary layer is less than the absolute value of the LUMO energy level of the hole transport layer.

When the LUMO energy level of the first light-emitting auxiliary layer is too low (deep), there is a problem in that the electron-hole balance in the light-emitting layer is lowered because electrons passing from the light-emitting layer cannot be effectively blocked, and when the LUMO energy level is too high, there is a problem in that electrons are accumulated between the light emitting layer and the light-emitting auxiliary layer and deterioration occurs. Therefore, it is necessary to appropriately adjust the LUMO value of the first light-emitting auxiliary layer in consideration of this point, and it is particularly preferable to select a material for the first light-emitting auxiliary layer having an appropriate LUMO value.

Preferably, the difference ($\Delta E_{LUMO}$) in the LUMO energy level of the first light-emitting auxiliary layer and the hole transport layer may be 0.03 eV or more, more preferably, 0.05 eV or more. Specifically, the difference ($\Delta E_{LUMO}$) in the LUMO energy level of the first light-emitting auxiliary layer and the hole transport layer may be 0.03 to 0.10 eV.

The LUMO energy level of the first light-emitting auxiliary layer may be 2.30 to 2.44 eV, preferably 2.34 to 2.41 eV, based on an absolute value. That is, the LUMO energy level of the first light-emitting auxiliary layer may be −2.44 eV or more and −2.30 eV or less, and preferably −2.41 eV or more and −2.34 eV or less.

In addition, the HOMO energy level of each light-emitting auxiliary layer according to the present invention is lower than the HOMO energy level of the hole transport layer and higher than the HOMO energy level of the light emitting layer. That is, the absolute value of the HOMO energy level of each of the light-emitting auxiliary layers is greater than the absolute value of the HOMO energy level of the hole transport layer and smaller than the absolute value of the HOMO energy level of the light emitting layer.

When the HOMO energy level of the light-emitting auxiliary layer is too low (deep), holes cannot pass efficiently to the light-emitting layer, and when it is too high, holes may be trapped between the hole transport layer and the light-emitting auxiliary layer since holes may be blocked before going to the light emitting layer. Therefore, it is preferable to select material of the light-emitting auxiliary layer so that the HOMO energy level of each of the light-emitting auxiliary layers is lower than the HOMO energy level of the hole transport layer and higher than the HOMO energy level of the light emitting layer.

In one embodiment, the difference ($\Delta E_{H1}$) in the HOMO energy level between the hole transport layer and the light-emitting auxiliary layer adjacent to the hole transport layer among the first light-emitting auxiliary layer and the second light-emitting auxiliary layer may be 0.07 eV or more, preferably 0.07 to 0.20 eV.

A difference ($\Delta E_{H2}$) in HOMO energy level between the light-emitting auxiliary layer adjacent to the hole transport layer and the light-emitting auxiliary layer adjacent to the light-emitting layer among the first light-emitting auxiliary layer and the second light-emitting auxiliary layer may be 0 eV or more. Specifically, the difference ($\Delta E_{H2}$) in the HOMO energy level between the first light-emitting auxiliary layer and the second light-emitting auxiliary layer may be 0.35 eV or less, preferably 0 to 0.34 eV.

Specifically, the HOMO energy level of the light-emitting auxiliary layer adjacent to the hole transport layer among the first light-emitting auxiliary layer and the second light-emitting auxiliary layer may be −5.69 eV or more and −5.55 eV or less (5.55 to 5.69 eV in absolute value), and the HOMO energy level of the light-emitting auxiliary layer adjacent to the light-emitting layer among the first light-emitting auxiliary layer and the second light-emitting auxiliary layer may be −6.00 eV or more and −5.64 eV or less (5.64 to 6.00 eV based on an absolute value). Here, the HOMO energy level of the light-emitting auxiliary layer adjacent to the hole transport layer is preferably equal to or higher than the HOMO energy level of the light-emitting auxiliary layer adjacent to the light-emitting layer, and more preferably higher.

In addition, the thickness of the first light-emitting auxiliary layer and the second light-emitting auxiliary layer is preferably 1:9 to 5:5.

Preferably, a layer for improving light efficiency may be formed on one side of the anode or the cathode and the one side, wherein the one side is not facing the organic material layer. The layer for improving light efficiency uses a difference in refractive index, and the efficiency or lifespan of the organic electric element can be improved by forming the layer for improving light efficiency.

Hereinafter, an embodiment of the present invention will be described in more detail with reference to the accompanying FIGS. 2 and 3.

Figure 2:
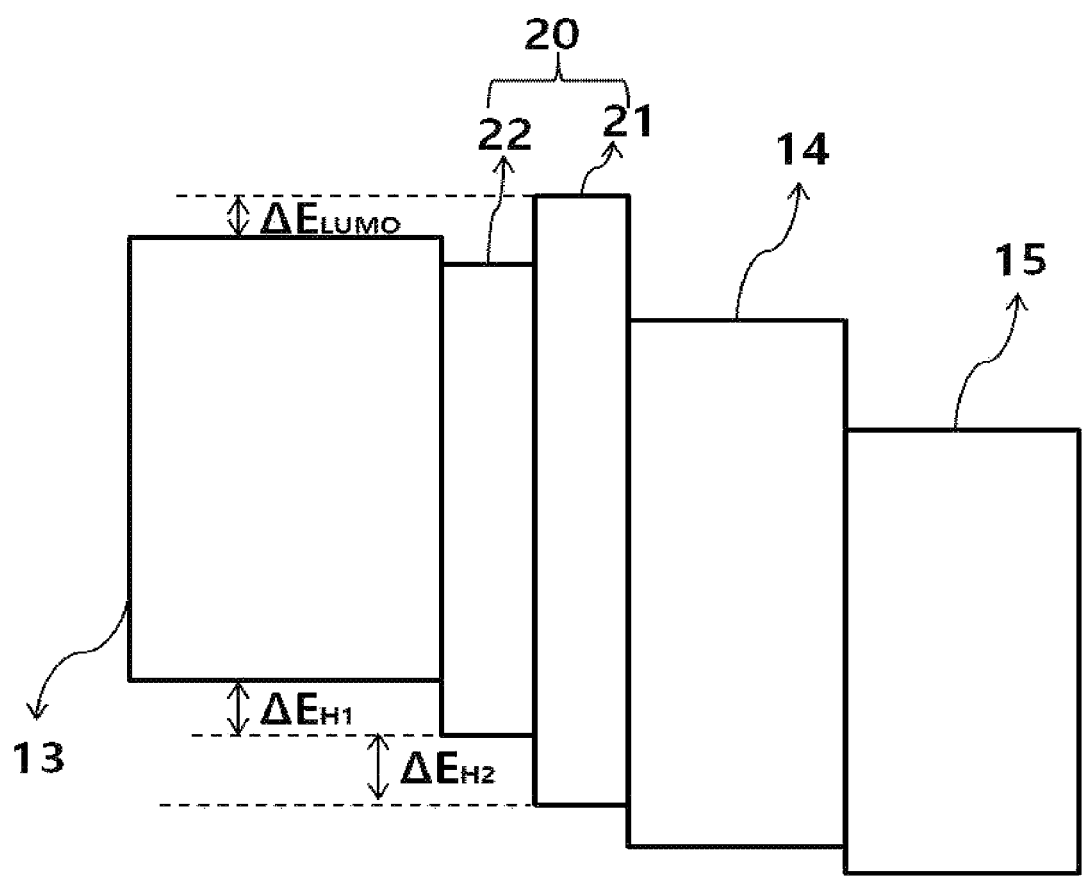
FIGS. 2 and 3 are schematic diagrams of an organic material layer showing energy levels of an organic electric element according to an embodiment of the present invention.
Figure 3:
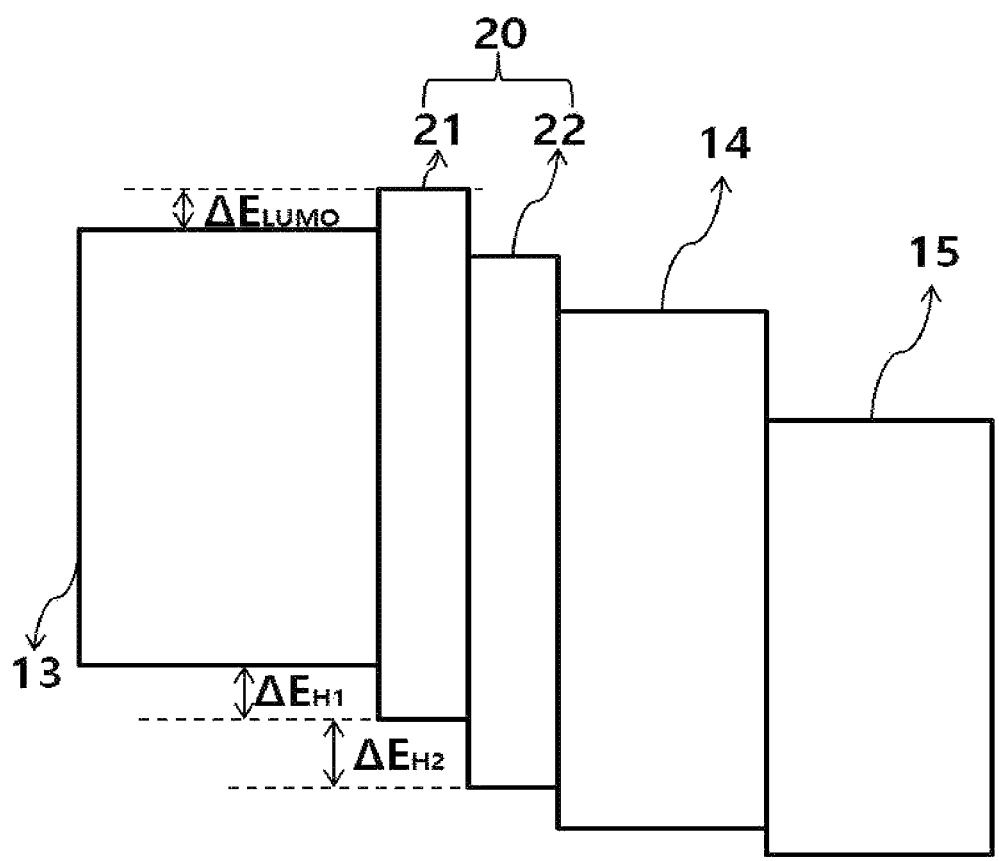

FIGS. 2 and 3 are schematic configuration of an organic material layer showing energy levels of an organic electric element according to an embodiment of the present invention.

Referring to FIG. 2, the organic material layer of the blue organic electric element according to an embodiment of the present invention comprises a hole transport layer 13, a light emitting layer 14, an electron transport layer 15, and the like, and a light-emitting auxiliary layer 20 is formed between the hole transport layer 13 and the light emitting layer 14. There may be a plurality of light-emitting auxiliary layers 20, and FIG. 2 shows an example in which two light-emitting auxiliary layers are formed.

The light-emitting auxiliary layer 20 comprises a first light light-emitting auxiliary layer 21 and a second light-emitting auxiliary layer 22, and the LUMO energy level of the first light-emitting auxiliary layer 21 is higher than that of the hole transport layer 13 and the second light-emitting auxiliary layer 22 is formed between the hole transport layer 13 and the first light-emitting auxiliary layer 21.

The first light-emitting auxiliary layer 21 may be formed adjacent to the light-emitting layer 14, and the second light-emitting auxiliary layer 22 may be formed adjacent to the hole transport layer 13.

The LUMO energy level of the first light-emitting auxiliary layer 21 may be 2.30 to 2.44 eV, preferably 2.34 to 2.41 eV, based on an absolute value. That is, the LUMO energy level of the first light-emitting auxiliary layer 21 may be −2.44 eV or more and −2.30 eV or less, and preferably −2.41 eV or more and −2.34 eV or less.

The LUMO energy level of the second light-emitting auxiliary layer 22 may be 2.40 to 2.55 eV, preferably 2.41 to 2.51 eV, based on an absolute value. That is, the LUMO energy level of the second light-emitting auxiliary layer 22 may be −2.55 eV or more and −2.40 eV or less, and preferably −2.51 eV or more and −2.41 eV or less.

The difference ($\Delta E_{LUMO}$) in the LUMO energy level of the first light-emitting auxiliary layer 21 and the hole transport layer 13 may be 0.03 eV or more, preferably 0.05 eV or more, more preferably 0.03 to 0.10 eV (0.03 eV or more and 0.10 eV or less). That is, the absolute value of the LUMO energy level of the first light-emitting auxiliary layer 21 may be smaller than that of the hole transport layer 13 by 0.03 eV or more, preferably 0.05 eV or more, more preferably 0.03 to 0.10 eV.

The HOMO energy level of the first light-emitting auxiliary layer 21 may be 5.64 to 6.00 eV (actually −6.00 eV or more and −5.64 eV or less) based on the absolute value, and the HOMO energy level of the second light-emitting auxiliary layer 22 may be 5.55 to 5.69 eV (actually −5.69 eV or more and −5.55 eV or less) based on an absolute value. Here, the HOMO energy level of the second light-emitting auxiliary layer 22 is preferably equal to or higher, more preferably higher than that of the first light-emitting auxiliary layer 21.

The difference ($\Delta E_{H1}$) in the HOMO energy level between the second light-emitting auxiliary layer 22 and the hole transport layer 13 may be 0.07 eV or more, preferably 0.07 to 0.20 eV. That is, the HOMO energy level of the hole transport layer 13 is 0.07 eV or more, preferably 0.07-0.20 eV higher than that of the second light-emitting auxiliary layer 22.

Difference ($\Delta E_{H2}$) in the HOMO energy level between the first light-emitting auxiliary layer 21 and the second light-emitting auxiliary layer 22 may be 0 eV or more, preferably 0.35 eV or less, and more preferably 0 to 0.34 eV.

Referring to FIG. 3, only the positions of the first light-emitting auxiliary layer 21 and the second light-emitting auxiliary layer 22 are different from those of FIG. 2, and the remaining organic material layers, the hole transport layer 13, the light emitting layer 14 and the electron transport layer 15 and the light-emitting auxiliary layer 20, are the same as in FIG. 2. That is, the difference is that the first light-emitting auxiliary layer 21 is formed adjacent to the hole transport layer 13 and the second light-emitting auxiliary layer 22 is formed adjacent to the light-emitting layer 14.

Therefore, the LUMO energy level of the first light-emitting auxiliary layer 21, the LUMO energy level of the second light-emitting auxiliary layer 22, and the LUMO energy level difference between the first light-emitting auxiliary layer 21 and the hole transport layer 13 ($\Delta E_{LUMO}$), and the HOMO energy level difference ($\Delta E_{H2}$) between the first light-emitting auxiliary layer and the second light-emitting auxiliary layer are the same as described in FIG. 2.

Only the description of the HOMO energy level of the light-emitting auxiliary layer in FIG. 3 is different from FIG. 2 since the first light-emitting auxiliary layer 21 is formed adjacent to the hole transport layer 13 and the second light-emitting auxiliary layer 22 is formed adjacent to the light-emitting layer 14.

That is, the HOMO energy level of the first light-emitting auxiliary layer 21 may be 5.55 to 5.69 eV (actually −5.69 eV or more and −5.55 eV or less) based on the absolute value, and the HOMO energy level of the second light-emitting auxiliary layer 22 may be 5.64 to 6.00 eV (actually −6.00 eV or more and −5.64 eV or less) based on the value. Here, the HOMO energy level of the first light-emitting auxiliary layer 21 may be preferably equal to or higher, more preferably higher than that of the second light-emitting auxiliary layer 22.

The difference ($\Delta E_{H1}$) in the HOMO energy level of the first light-emitting auxiliary layer 21 and the hole transport layer 13 may be 0.07 eV or more, preferably 0.07 to 0.20 eV. That is, the HOMO energy level of the hole transport layer 13 is 0.07 eV or more, preferably 0.07 to 0.20 eV higher than that of the first light-emitting auxiliary layer 21.

According to another embodiment of the present invention, the organic material layer may be formed in a plurality of stacks, wherein the stacks comprise a hole transport layer, a light emitting layer, and an electron transport layer.

In general, an organic light emitting element can be divided into a single light emitting element (Single OLED) and a multilayer light emitting element (Tandem OLED) according to the number of light emitting units. A multilayer light emitting element (Tandem OLED) is an OLED element composed of two or more light emitting units (stack), and it is easier to improve the driving voltage and efficiency compared to the conventional single OLED.

Specifically, the organic electric element according to an embodiment of the present invention may include a first electrode, a first stack formed on the first electrode, a second stack formed on the first stack, and a second electrode. Here, the stack may correspond to an organic material layer, and a layer for improving light efficiency may be further formed on one side of both sides of the first electrode and/or the second electrode, wherein the one side is not facing with the organic material layer.

Each of the first and the second stacks is an organic material layer comprising a hole injection layer, a hole transport layer, a light emitting layer and an electron transport layer, and the first and the second stacks may be formed in the same or different stacked structures.

At least one of the first stack and the second stack includes a plurality of light-emitting auxiliary layers according to the present invention. That is, a plurality of light-emitting auxiliary layers according to the present invention are comprised between the hole transport layer and the light emitting layer, and these light-emitting auxiliary layers may be included in the first stack and/or the second stack.

In addition, a charge generation layer (CGL) may be formed between the first stack and the second stack. The charge generation layer CGL may include a first charge generation layer and a second charge generation layer. The charge generating layer (CGL) is formed between the light emitting layer of the first stack and the light emitting layer of the second stack to increase current efficiency generated in each light emitting layer and smoothly distribute charges.

Two or more stacks of the organic material layer may be formed. For example, in a case where three stacks are formed, a charge generating layer (CGL) and a third stack may be additionally stacked on the second stack.

Like this, when a plurality of light emitting layers are formed by the multilayer stack structure method, it is possible to manufacture an organic electroluminescent element that emits white light by the mixing effect of the light emitted from each light emitting layer, as well as to emit light of various colors.

The organic layer with a smaller number of layers according to the present invention may be manufactured by a solution process or a solvent process such as a spin coating process, a nozzle printing process, an inkjet printing process, a slot coating process, a dip coating process, a roll-to-roll process, doctor blading process, a screen printing process, or a thermal transfer method using various polymer materials rather than a deposition method. Since the organic material layer according to the present invention may be formed in various ways, the scope of protection of the present invention is not limited by a method of forming the organic material layer.

The organic electric element according to an embodiment of the present invention may be of a top emission type, a bottom emission type, or a dual emission type depending on the material used.

In addition, the organic electric element according to an embodiment of the present invention may be selected from the group consisting of an organic electroluminescent element, an organic solar cell, an organic photo conductor, an organic transistor, an element for monochromatic illumination and an element for quantum dot display.

Another embodiment of the present invention provides an electronic device including a display device which includes the above described organic electric element, and a control unit for controlling the display device. Here, the electronic device may be a wired/wireless communication terminal which is currently used or will be used in the future, and covers all kinds of electronic devices including a mobile communication terminal such as a cellular phone, a personal digital assistant (PDA), an electronic dictionary, a point-to-multipoint (PMP), a remote controller, a navigation unit, a game player, various kinds of TVs, and various kinds of computers.

According to the present invention, the light-emitting auxiliary layer 20 includes a first light-emitting auxiliary layer 21 and a second light-emitting auxiliary layer 22, and the LUMO energy level of the first light-emitting auxiliary layer is higher than that of the hole transport layer 13, and the HOMO energy levels of the first light-emitting auxiliary layer and the second light-emitting auxiliary layer have a value between the HOMO energy level of the hole transport layer 13 and the light-emitting layer 14. That is, the HOMO energy level of each of the light-emitting auxiliary layers 20 is lower than that of the hole transport layer 13 and higher than that of the light emitting layer 14.

Here, various methods may be applied to measure the HOMO/LUMO energy level of a material constituting the organic material layer, and a method according to an embodiment of the present invention will be described.

Method Measuring Energy Level

The HOMO energy level may be measured using a CV-graph, and the LUMO energy level may be obtained using the HOMO level and the bandgap.

1. Method Measuring HOMO Energy Level

A measurement sample in which the electrolyte and the compound to be measured are dissolved is prepared. Illustratively, 0.1 M TBAP in ACN (acetonitrile) electrolyte may be prepared, and 2.5 mg of the compound to be measured may be dissolved in chloroform as a solvent to prepare a measurement sample.

Thereafter, the cyclic voltammetry of the measurement sample is measured at room temperature, and the HOMO energy level can be obtained using the CV-graph (current-voltage graph). The vertical axis of the CV-graph represents the current and the horizontal axis represents the voltage (potential), and the HOMO energy level is calculated using the lower curve among the two curves. That is, a graph in the case of reverse scanning of the voltage is used, and the HOMO energy level can be obtained from the potential value at the intersection of two straight lines. That is, the unit of the potential value can be changed to the energy unit eV.

The above two straight lines refer to the tangent line (horizontal line) drawn to the graph in the section before the meaningful reaction starts (the section with little change in current) and the tangent line drawn to the curve (the section in which the current rapidly decreases as the voltage is applied) between the points where a meaningful reaction starts and the maximum oxidation current flows.

On the other hand, in order to obtain the HOMO energy level of the compound to be measured, it is necessary to correct the HOMO energy level of the reference sample. That is, the HOMO energy level of the compound to be measured is calculated by adding the correction value, which is the difference in CV value between the reference sample and the measurement sample, to HOMO energy level intrinsic to the reference sample as s shown in the following conversion formula.

Conversion formula:

HOMO energy level of the compound to be measured=HOMO energy level unique to the reference sample+correction value In the conversion equation, the correction value is obtained by the following equation.

Correction value=(HOMO energy level in CV-graph of reference sample)−(HOMO level in CV-graph of measurement sample)

For example, when $Alq_3$ is used as a reference sample, the HOMO energy level of the compound to be measured can be obtained by the following conversion equation. The intrinsic HOMO energy level of $Alq_3$ is −5.8 eV.

HOMO energy level of the compound to be measured=−5.8 (eV)+correction value

[Correction value=(HOMO energy level in CV-graph of $Alq_3$)−(HOMO energy level in CV-graph of sample to be measured)]

2. Method Measuring Band Gap

A sample is prepared by dissolving the compound to be measured in a solvent. The absorption spectrum of the sample is measured at room temperature. Specifically, a sample may be prepared by further adding 10 ml of THF to 1 ml of a solution prepared by dissolving 2.5 mg of a compound to be measured in 10 ml of THF.

In the absorption spectrum graph, the vertical axis represents the absorbance and the horizontal axis represents the wavelength. Two straight lines are determined, and the value obtained by converting the wavelength at the intersection of these straight lines into an energy value is defined as the band gap.

One of the two straight lines is a tangent line (horizontal line) to the graph in the wavelength section before meaningful absorption occurs, and the other is a tangent to the curve in the section up to the point where the absorbance is maximal for the first time (the section that increases rapidly) after significant absorption has occurred.

After finding the wavelength (λ edge [nm]) at the intersection of two straight lines, the band gap can be obtained by converting the wavelength into an energy value.

$E=h*(c/\lambda)$ (h: Plank constant, c: luminous flux, λ: wavelength)

Using the above formula, the band gap can be calculated by the following conversion formula.

Conversion formula:

$Eg=1240/\lambda edge$ (eV)

3. Method Measuring LUMO Energy Level

Since the energy band gap is the difference between the LUMO energy level and the HOMO energy level (Eg=LUMO energy level−HOMO energy level), the LUMO energy level can be calculated by the following equation.

LUMO energy level of the compound to be measured=HOMO energy level of the compound to be measured+$Eg$ Preferably, the light-emitting auxiliary layer may comprise a compound represented by the following formula 1.

<Formula 1>

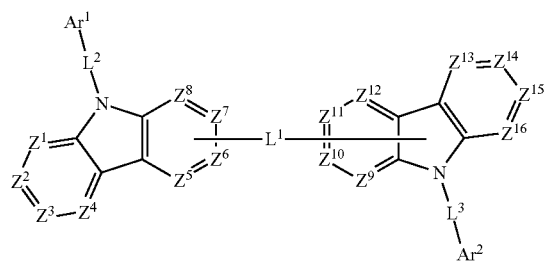

In Formula 1, each of symbols may be defined as follows.

$Z^1$ to $Z^4$, and $Z^{13}$ to $Z^{16}$ are each independently C(R') or N, and $Z^5$ to $Z^8$, $Z^9$ to $Z^{12}$ are each independently C, C(R') or N.

R' is selected from the group consisting of hydrogen, deuterium, halogen, a cyano group, a nitro group, a $C_6$-$C_{60}$ aryl group, a fluorenyl group, a $C_2$-$C_{60}$ heterocyclic group comprising at least one heteroatom selected from the group consisting of O, N, S, Si and P, a $C_3$-$C_{60}$ aliphatic ring, a $C_1$-$C_{30}$ alkyl group, a $C_2$-$C_{30}$ alkenyl group, a $C_2$-$C_{30}$ alkynyl group, a $C_1$-$C_{30}$ alkoxyl group, a $C_6$-$C_{30}$ aryloxy group and -L'-N($R_a$)($R_b$), and adjacent groups may be optionally bonded to each other to form a ring.

$L^1$ to $L^3$ are each independently selected from the group consisting of a single bond, a $C_6$-$C_{60}$ arylene group, a fluorenylene group, a $C_3$-$C_{60}$ aliphatic ring, a $C_2$-$C_{60}$ heterocyclic group comprising at least one heteroatom selected from the group consisting of O, N, S, Si and P, and a combination thereof.

$L^1$ may be bonded to one of $Z^5$ to $Z^8$, and one of $Z^9$ to $Z^{12}$, $L^3$ and $Ar^2$.

When $L^1$ to $L^3$ are each an arylene group, the arylene group may be preferably a $C_6$-$C_{30}$ arylene group, more preferably a $C_6$-$C_{18}$ arylene group, for example, phenylene, naphthalene, biphenyl, terphenyl, and the like.

When $L^1$ to $L^3$ are each a heterocyclic group, the heterocyclic group may be preferably a $C_2$-$C_{30}$ heterocyclic group, more preferably a $C_2$-$C_{30}$ heterocyclic group, for example, dibenzothiophene, dibenzofuran, carbazole, phenylcarbazole, and the like.

$Ar^1$ and $Ar^2$ are each independently selected from the group consisting of a $C_6$-$C_{60}$ aryl group, a fluorenyl group, a $C_2$-$C_{60}$ heterocyclic group comprising at least one heteroatom selected from the group consisting of O, N, S, Si and P, and a $C_3$-$C_{60}$ aliphatic ring.

When $Ar^1$ and $Ar^2$ are each an aryl group, the aryl group may be preferably a $C_6$-$C_{30}$ aryl group, more preferably a $C_6$-$C_{18}$ aryl group, for example, phenyl, naphthyl, biphenyl, terphenyl, and the like.

When $Ar^1$ and $Ar^2$ are each a heterocyclic group, the heterocyclic group may be preferably a $C_2$-$C_{30}$ heterocyclic group, more preferably a $C_2$-$C_{18}$ heterocyclic group, for example, dibenzothiophene, dibenzofuran, carbazole, phenylcarbazole, and the like.

L' is selected from the group consisting of a single bond, a $C_6$-$C_{60}$ arylene group, a fluorenylene group, a $C_2$-$C_{30}$ aliphatic ring, and a $C_2$-$C_{60}$ heterocyclic group comprising at least one heteroatom selected from the group consisting of O, N, S, Si and P.

$R_a$ and $R_b$ are each independently selected from the group consisting of a $C_6$-$C_{60}$ aryl group, a fluorenyl group, a $C_3$-$C_{60}$ aliphatic ring, and a $C_2$-$C_{60}$ heterocyclic group comprising at least one heteroatom selected from the group consisting of O, N, S, Si and P.

R', $L^1$ to $L^3$, $Ar^1$, $Ar^2$ and the ring formed by adjacent groups may be each optionally substituted with one or more substituents selected from the group consisting of deuterium, halogen, a silane group unsubstituted or substituted with a $C_1$-$C_{20}$ alkyl group or a $C_6$-$C_{20}$ aryl group, a siloxane group, a cyano group, a nitro group, a $C_1$-$C_{20}$ alkylthio group, a $C_1$-$C_{20}$ alkoxy group, a $C_6$-$C_{20}$ aryloxy group, a $C_6$-$C_{20}$ arylthio, a $C_1$-$C_{20}$ alkyl group, a $C_2$-$C_{20}$ alkenyl group, a $C_2$-$C_{20}$ alkynyl group, a $C_6$-$C_{20}$ aryl group, a fluorenyl group, a $C_2$-$C_{20}$ heterocyclic group containing at least one heteroatom of O, N, S, Si, and P, a $C_6$-$C_{20}$ aliphatic ring group, a $C_7$-$C_{20}$ arylalkyl group and $C_8$-$C_{20}$ arylalkenyl.

Specifically, the compound represented by Formula 1 may be one of the following compounds, but there is no limitation thereto.

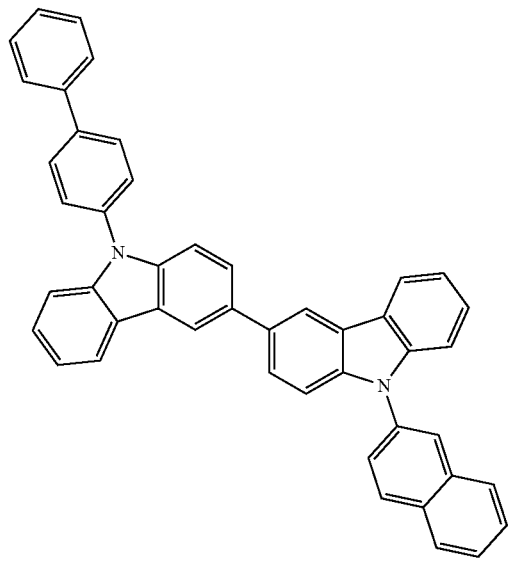

1-1

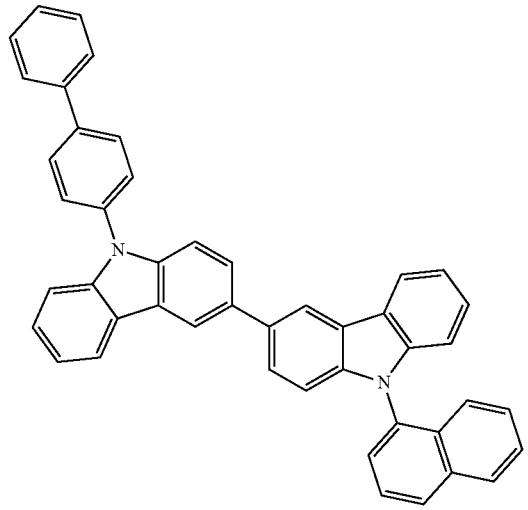

1-2

1-3
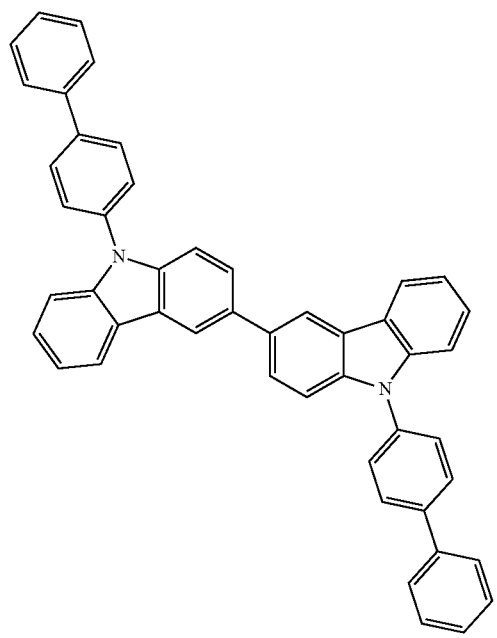
1-4
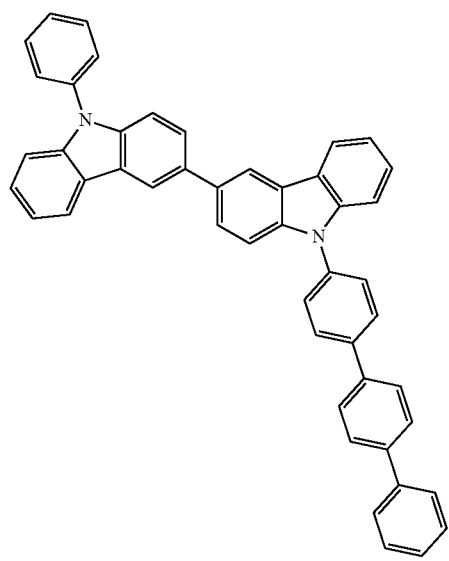
1-5
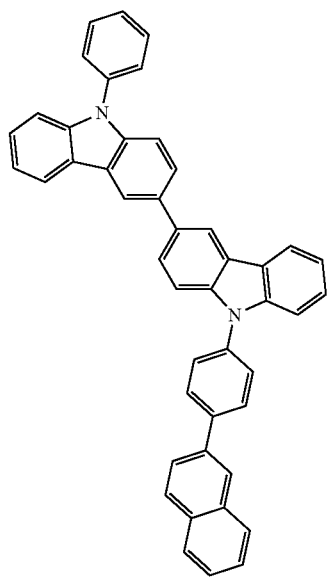
1-6
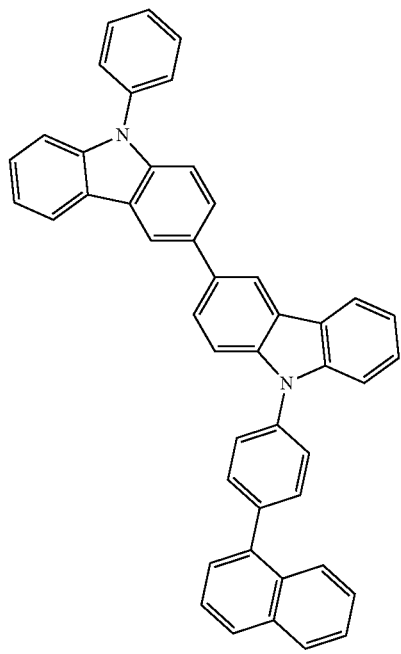

1-7
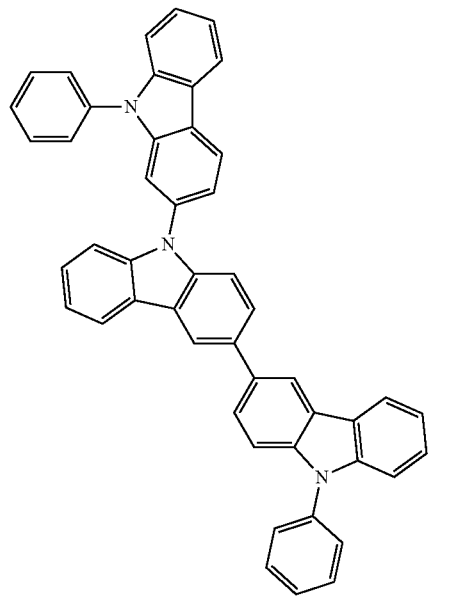
1-8
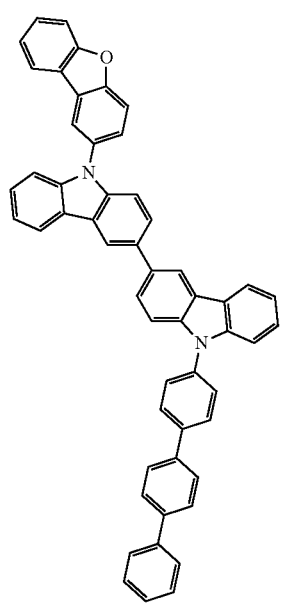
1-9
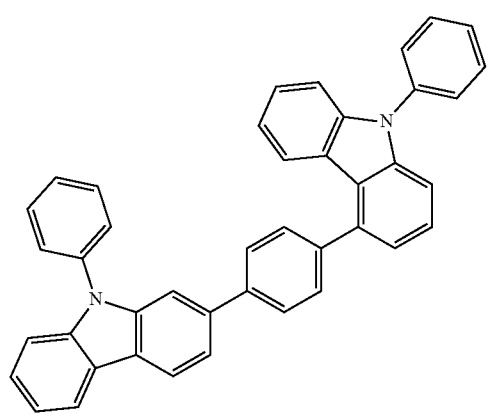
1-10
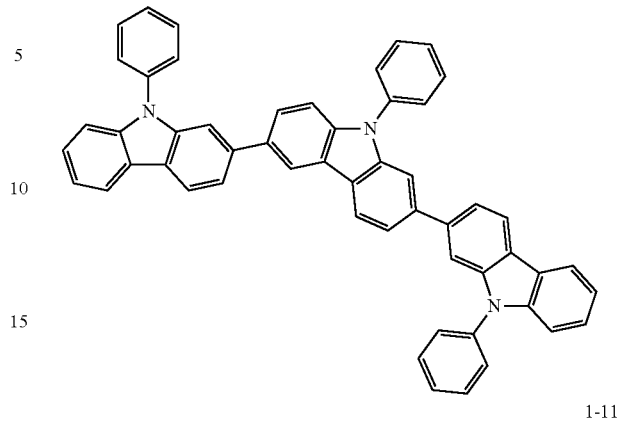
1-11
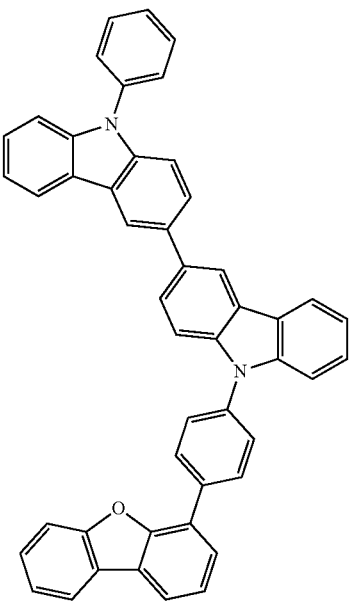
1-12
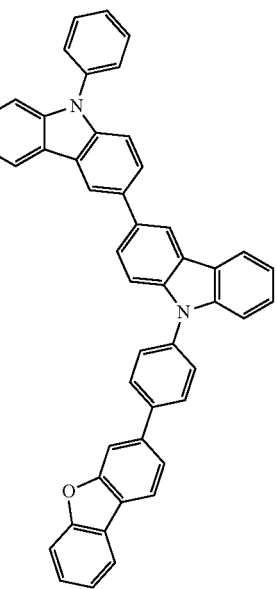

1-13
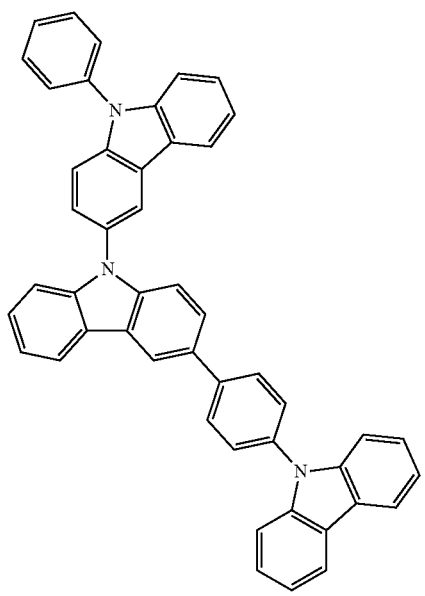
1-14
1-15
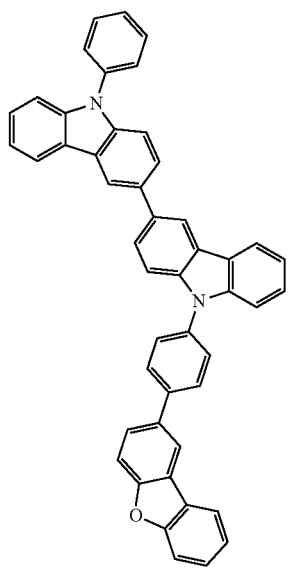
1-16

1-17
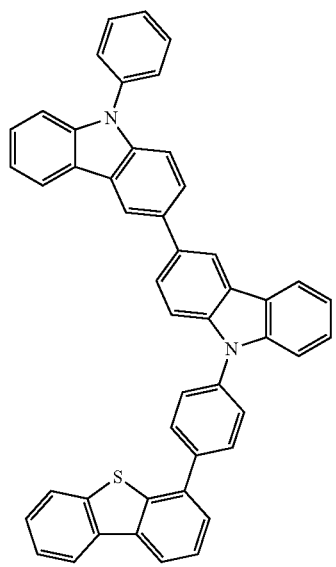
1-18
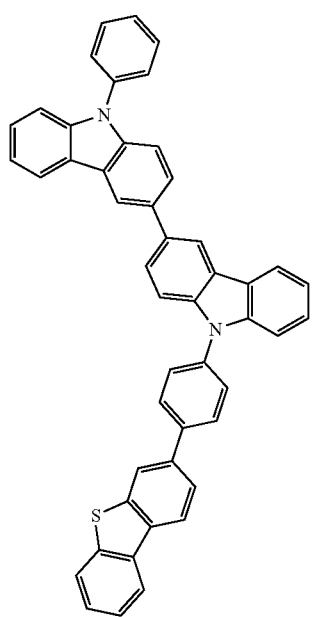
1-19
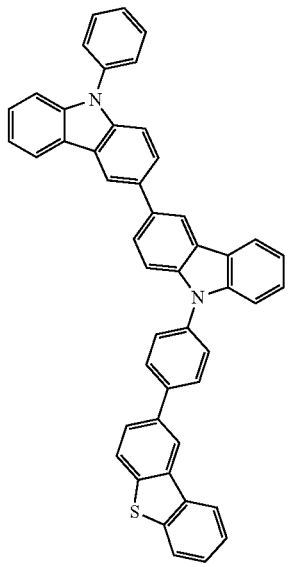
1-20
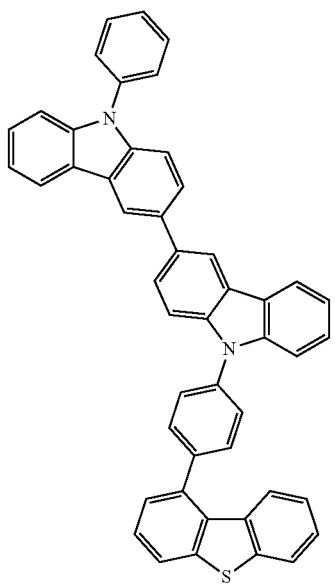

1-21
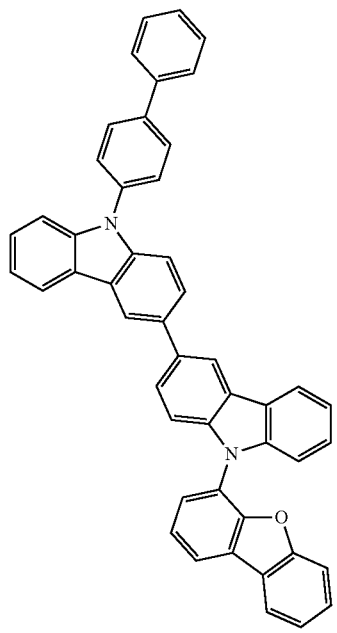
1-22
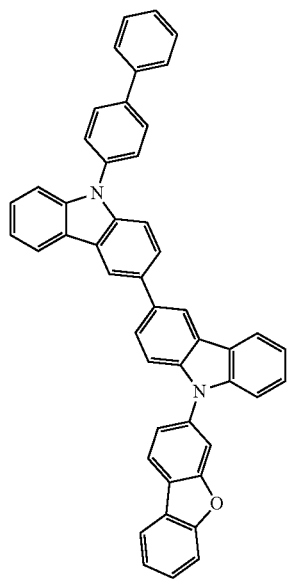
1-23
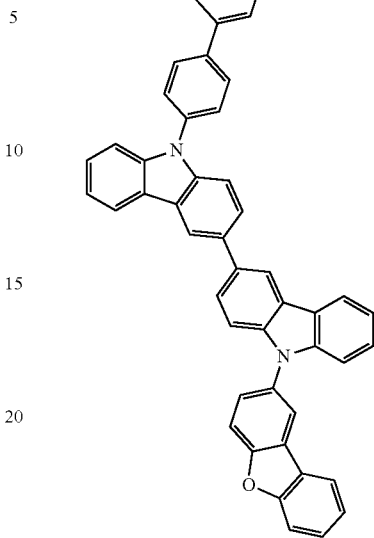
1-24
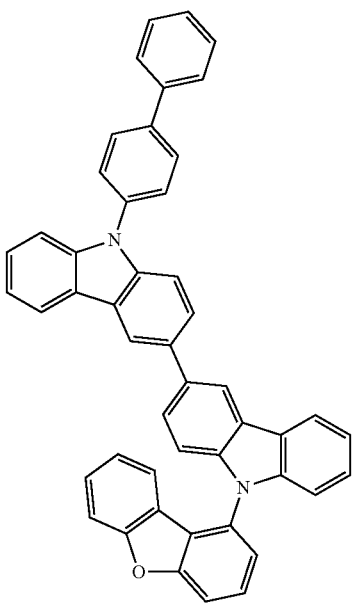

1-25
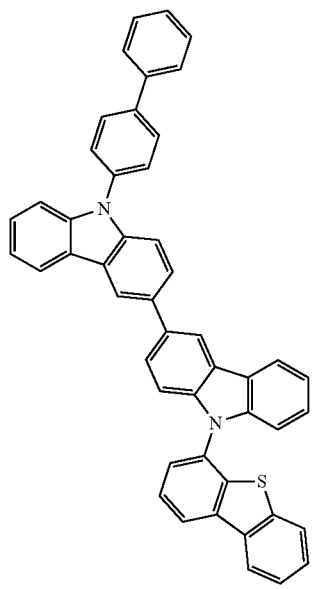
1-26
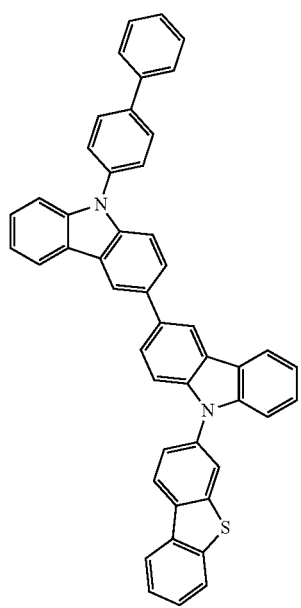
1-27
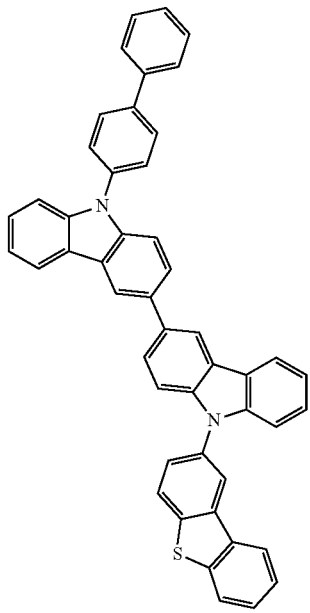
1-28
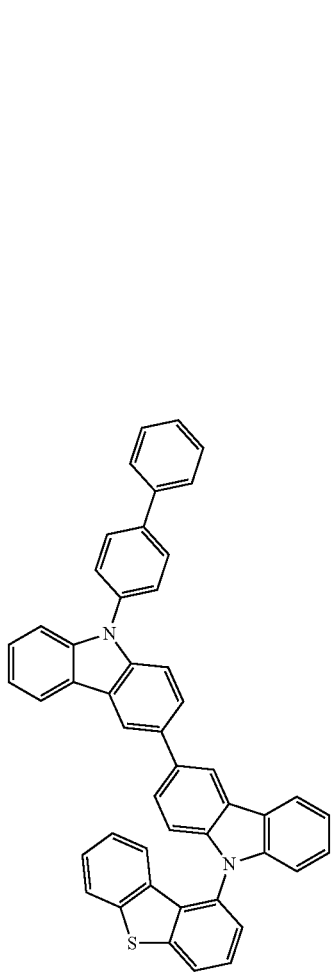

1-29
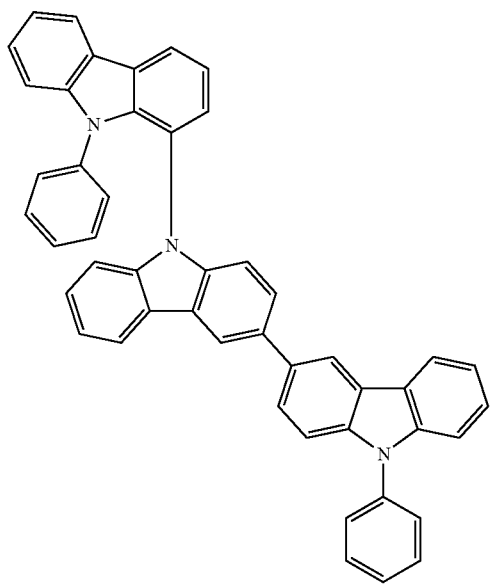
1-30
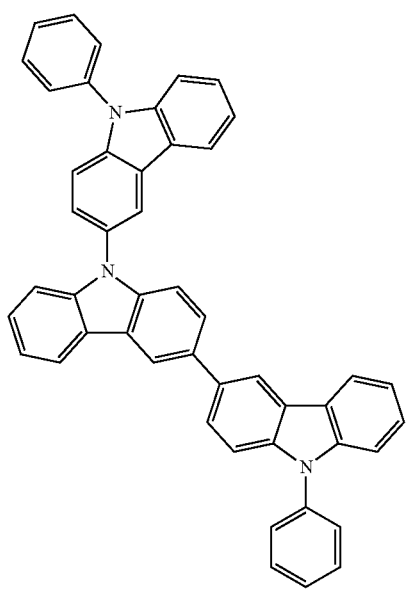
1-31
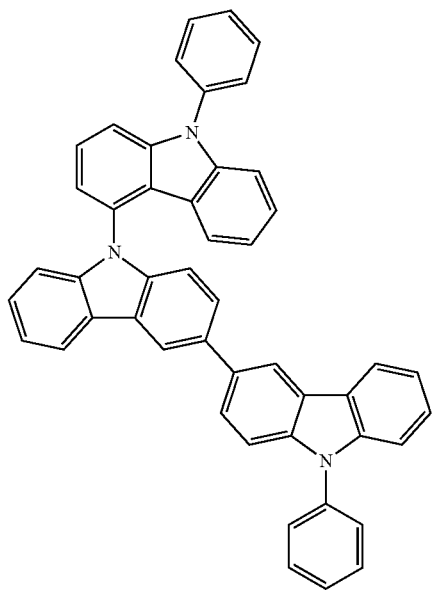
1-32
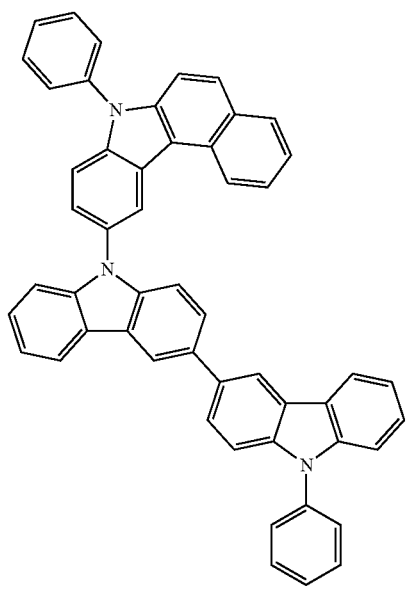

1-33
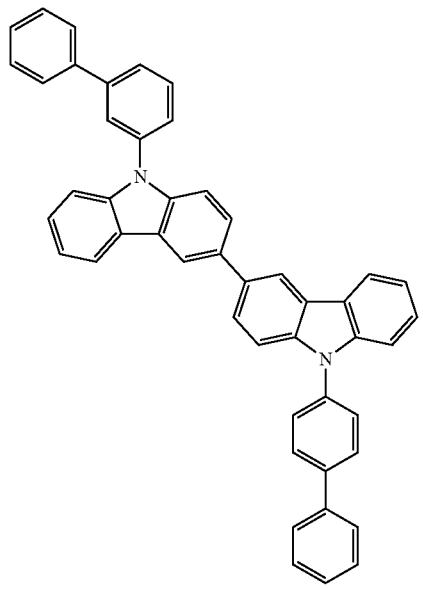
1-35
1-36
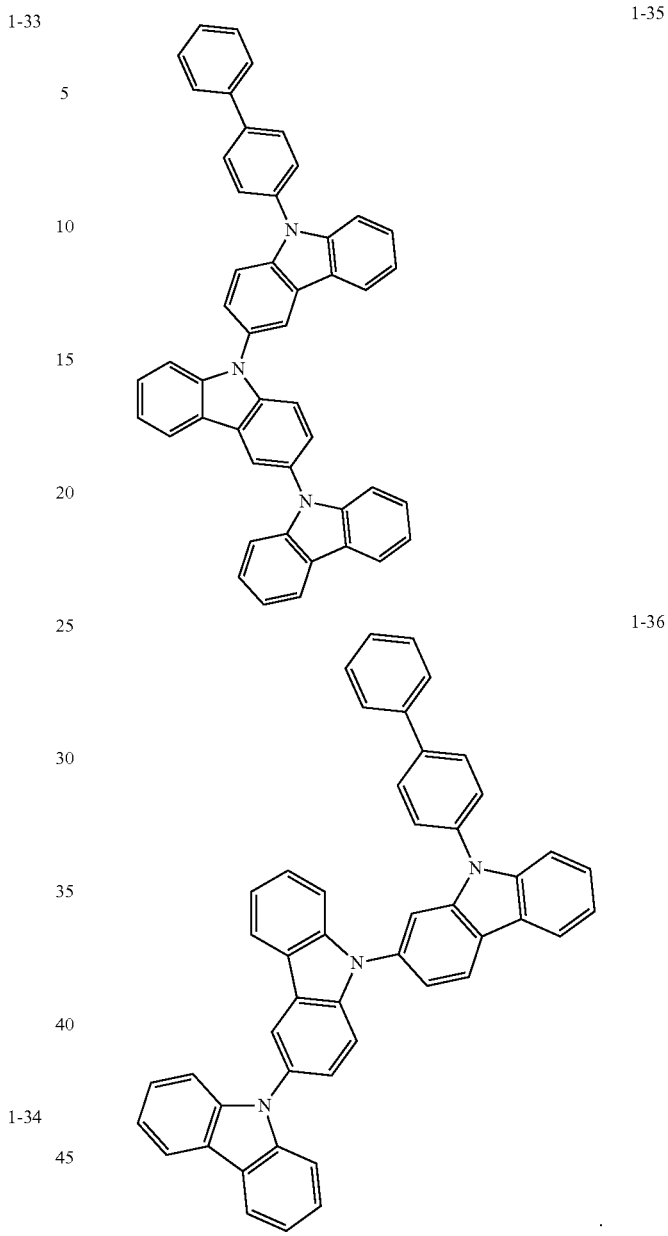
1-34
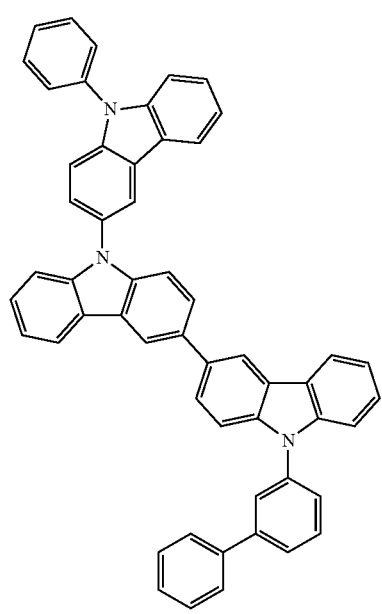
Preferably, the light-emitting auxiliary layer may comprise a compound represented by the following formula 2.
<Formula 2>
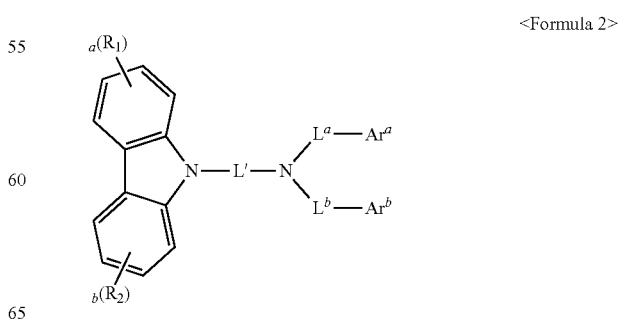
In Formula 2, each of symbols may be defined as follows.

$R_1$ and $R_2$ are each independently elected from the group consisting of hydrogen, deuterium, halogen, a cyano group, a nitro group, a $C_6$-$C_{60}$ aryl group, a fluorenyl group, a $C_2$-$C_{20}$ heterocyclic group comprising at least one heteroatom selected from the group consisting of O, N, S, Si and P, a $C_3$-$C_{60}$ aliphatic ring, a $C_1$-$C_{30}$ alkyl group, a $C_2$-$C_{30}$ alkenyl group, a $C_2$-$C_{30}$ alkynyl group, a $C_1$-$C_{30}$ alkoxyl group, a $C_6$-$C_{30}$ aryloxy group and -L'-N($R_a$)($R_b$), and adjacent groups may be optionally bonded to each other to form a ring.

The ring formed by bonding between neighboring groups may be selected from the group consisting of a $C_6$-$C_{60}$ aromatic ring group, or a $C_6$-$C_{20}$ heterocyclic group containing at least one heteroatom of O, N, S, Si and P, and when an aromatic ring is formed by neighboring groups, the aromatic ring may be preferably a $C_6$-$C_{20}$ aromatic ring, more preferably, a $C_6$-$C_{14}$ aromatic ring, for example, benzene, naphthalene, phenanthrene or the like.

a and b are each an integer of 0 to 4, and when each of these is an integer of 2 or more, $R_1$s are each the same as or different from each other and $R_2$s are each the same as or different from each other, When $R_1$ and $R_2$ are each an aryl group, the aryl group may be preferably a $C_6$-$C_{30}$ aryl group, more preferably a $C_6$-$C_{18}$ aryl group, for example, phenyl, naphthyl, biphenyl, terphenyl, and the like.

When $R_1$ and $R_2$ are each a heterocyclic group, the heterocyclic group may be preferably a $C_2$-$C_{30}$ heterocyclic group, more preferably a $C_2$-$C_{18}$ heterocyclic group, for example, pyridine, quinoline, quinazoline, dibenzothiophene, dibenzofuran, carbazole, phenylcarbazole, and the like.

When $R_1$ and $R_2$ are each alkenyl group, the alkenyl group may be preferably $C_2$-$C_{10}$ alkenyl groups, for example propene.

L', $L^a$ and $L^b$ are each independently selected from the group consisting of a single bond, a $C_6$-$C_{60}$ arylene group, a fluorenylene group, a $C_3$-$C_{60}$ aliphatic ring and a $C_2$-$C_{60}$ heterocyclic group comprising at least one heteroatom selected from the group consisting of O, N, S, Si and P.

When L', $L^a$ and $L^b$ are each an arylene group, the arylene group may be preferably a $C_6$-$C_{30}$ arylene group, more preferably a $C_6$-$C_{18}$ arylene group, for example, phenylene, napthalene, biphenyl, terphenyl, and the like.

When L', $L^a$ and $L^b$ are each a heterocyclic group, the heterocyclic group may be preferably a $C_2$-$C_{30}$ heterocyclic group, more preferably a $C_2$-$C_{18}$ heterocyclic group, for example, pyridine, pyrimidine, dibenzothiophene, napthobenzothiophene, dibenzofuran, naphthobenzofuran, carbazole, phenylcarbazole, and the like.

$Ar^a$ and $Ar^b$ are each independently selected from the group consisting of a $C_6$-$C_{60}$ aryl group, a fluorenyl group, a $C_2$-$C_{60}$ heterocyclic group comprising at least one heteroatom selected from the group consisting of O, S, Si and P, and a $C_3$-$C_{60}$ aliphatic ring.

When $Ar^a$ and $Ar^b$ are each an aryl group, the aryl group may be preferably a $C_6$-$C_{30}$ aryl group, more preferably a $C_2$-$C_{18}$ aryl group, for example, phenyl, naphthyl, biphenyl, terphenyl, phenanthrene, pyrene and the like.

When $Ar^a$ and $Ar^b$ are each a heterocyclic group, the heterocyclic group may be preferably a $C_2$-$C_{30}$ heterocyclic group, more preferably a $C_2$-$C_{18}$ heterocyclic group, for example, pyridine, pyrimidine, quinoline, isoquinoline, quinazoline, benzofuropyrimidine, benzothiopyrimidine, dibenzothiophene, naphthobenzothiophene, dibenzofuran, naphthobenzofuran, carbazole, phenylcarbazole or the like.

L is selected from the group consisting of a single bond, a $C_6$-$C_{60}$ arylene group, a fluorenylene group, a $C_3$-$C_{60}$ aliphatic ring and a $C_2$-$C_{60}$ heterocyclic group comprising at least one heteroatom selected from the group consisting of O, N, S, Si and P.

$R_a$ and $R_b$ are each independently selected from the group consisting of a $C_6$-$C_{60}$ aryl group, a fluorenyl group, a $C_3$-$C_{60}$ aliphatic ring, and a $C_2$-$C_{60}$ heterocyclic group comprising at least one heteroatom selected from the group consisting of O, N, S, Si and P.

$R_1$, $R_2$, L', $L^a$, $L^b$, $Ar^a$, $Ar^b$ and the ring formed by adjacent groups may be each optionally substituted with one or more substituents selected from the group consisting of deuterium, halogen, a silane group unsubstituted or substituted with a $C_1$-$C_{20}$ alkyl group or a $C_6$-$C_{20}$ aryl group, a siloxane group, a cyano group, a nitro group, a $C_1$-$C_{20}$ alkylthio group, a $C_1$-$C_{20}$ alkoxy group, a $C_6$-$C_{20}$ aryloxy group, a $C_6$-$C_{20}$ arylthio, a $C_1$-$C_{20}$ alkyl group, a $C_2$-$C_{20}$ alkenyl group, a $C_2$-$C_{20}$ alkynyl group, a $C_6$-$C_{20}$ aryl group, a fluorenyl group, a $C_2$-$C_{20}$ heterocyclic group containing at least one heteroatom of O, N, S, Si, and P, a $C_3$-$C_{20}$ aliphatic ring group, a $C_7$-$C_{20}$ arylalkyl group and $C_8$-$C_{20}$ arylalkenyl.

Specifically, the compound represented by Formula 2 may be one of the following compounds, but there is no limitation thereto.

2-1

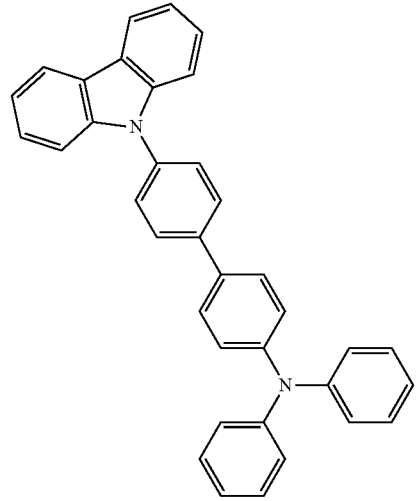

2-2

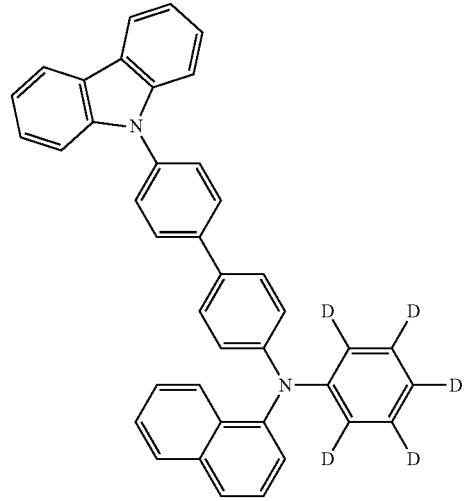

2-3
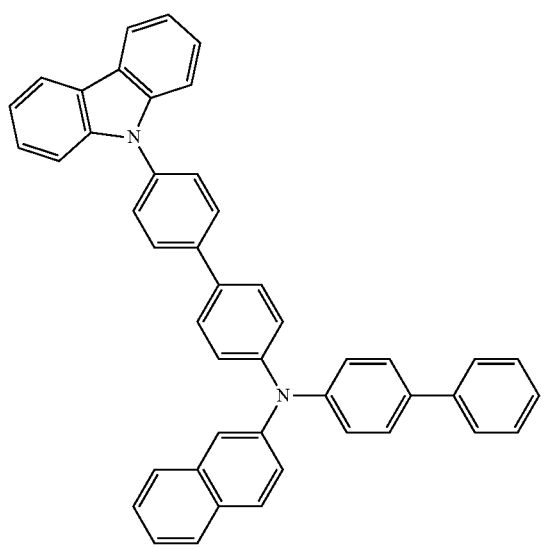
2-5
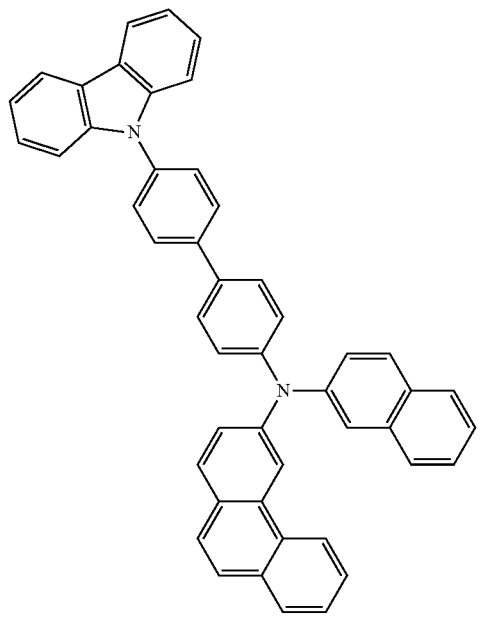
2-4
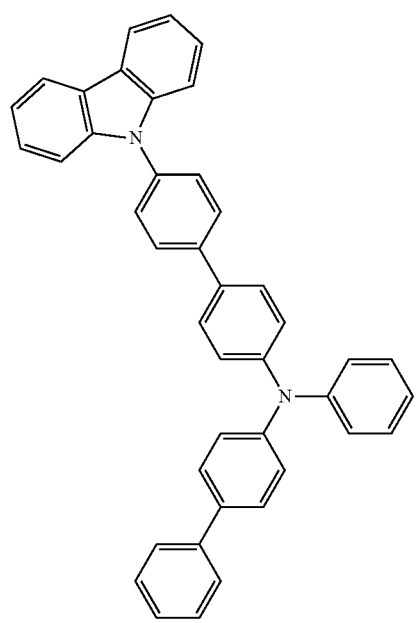
2-6
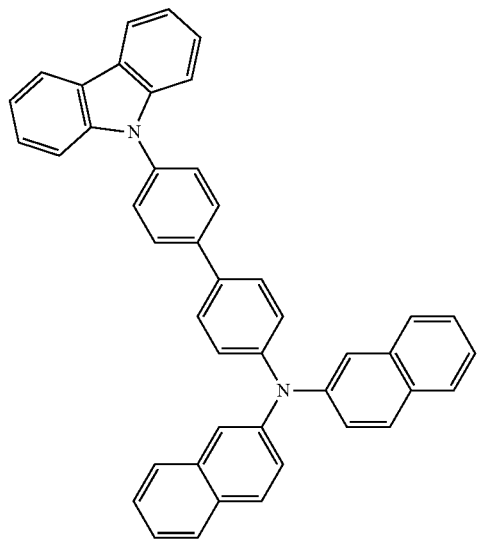

2-7
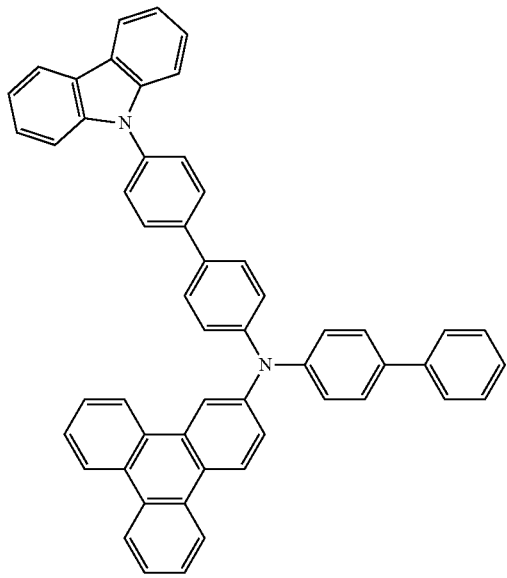
2-8
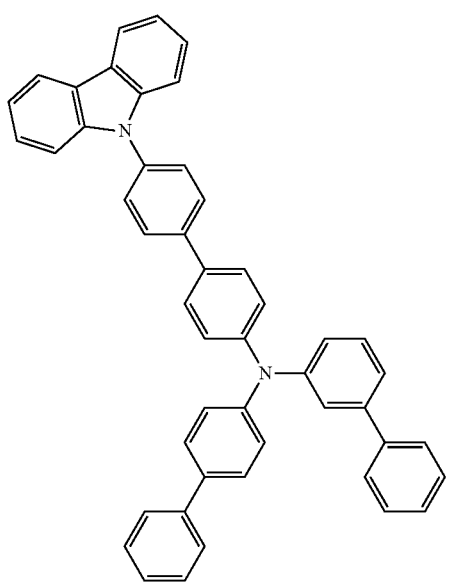
2-9
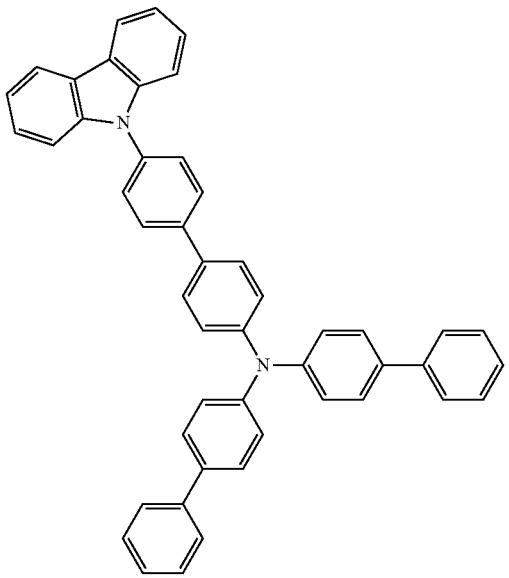
2-10
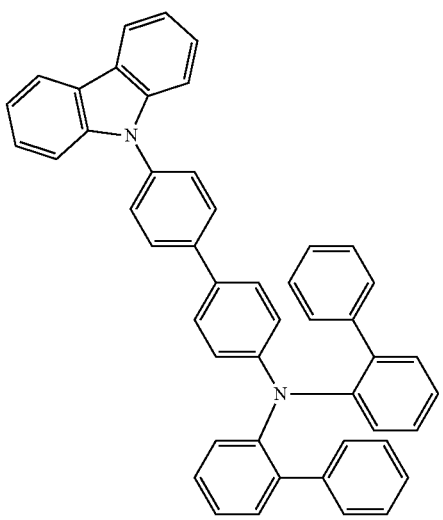
2-11

2-12
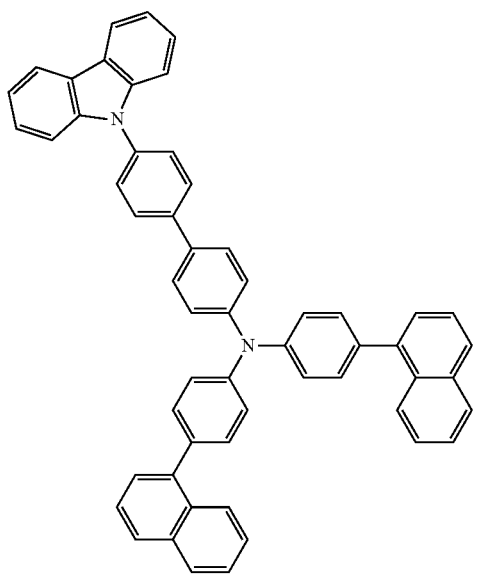
2-14
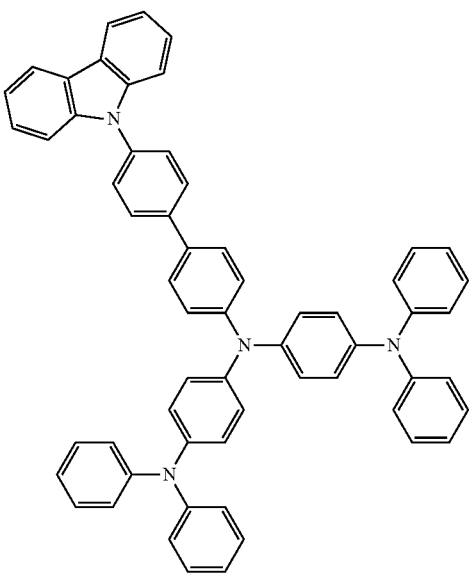
2-13
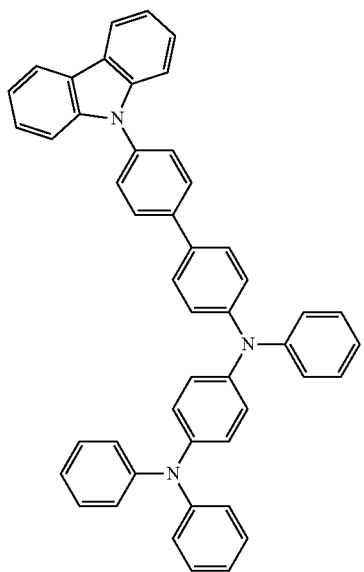
2-15

2-16
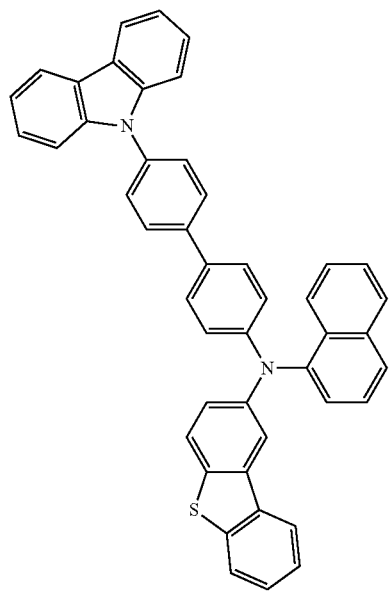
2-17
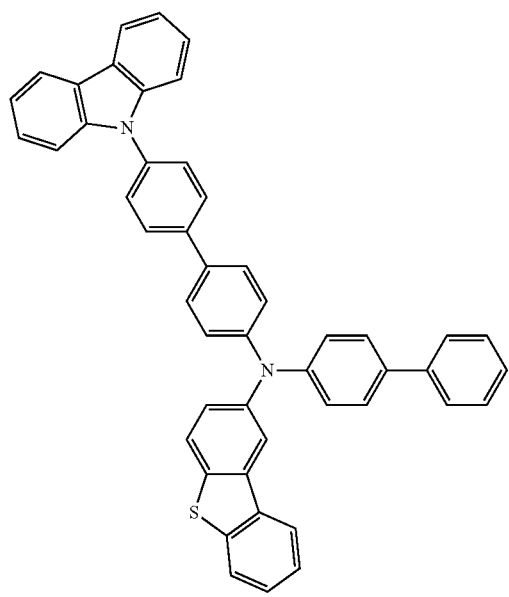
2-18
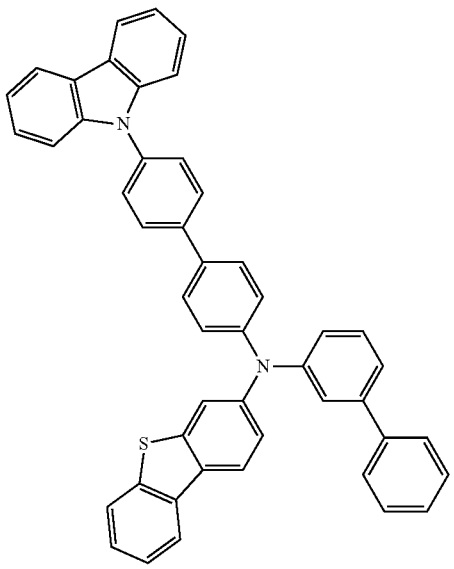
2-19
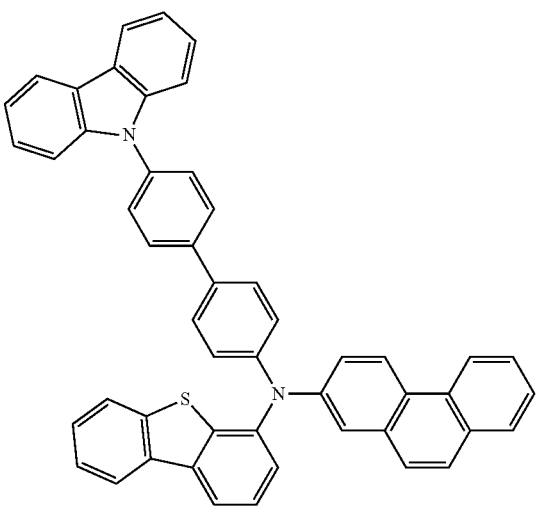

2-20
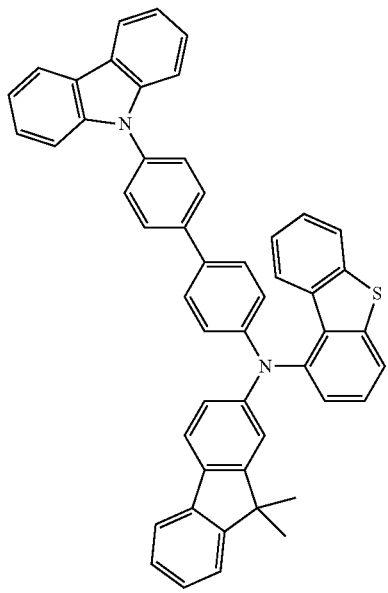
2-21
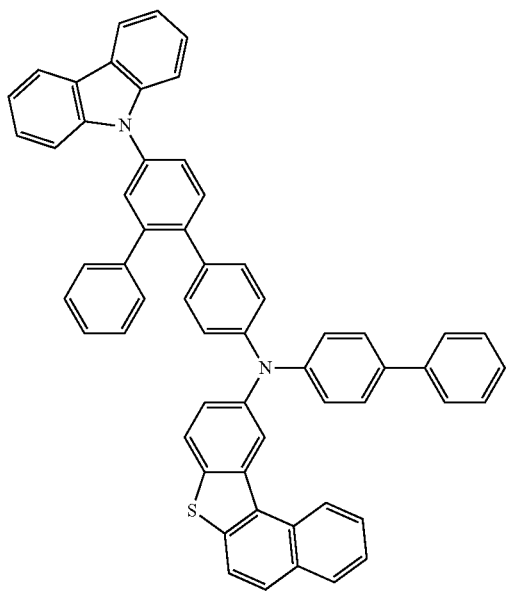
2-22
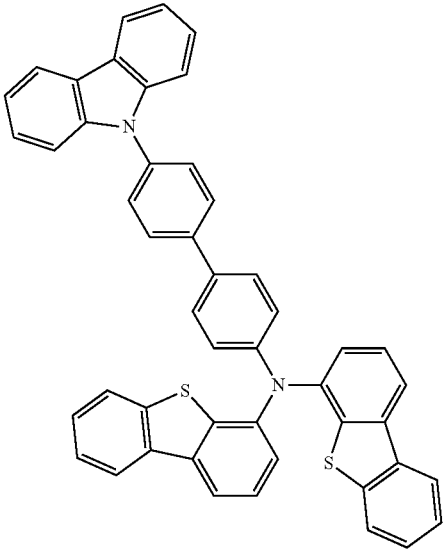
2-23
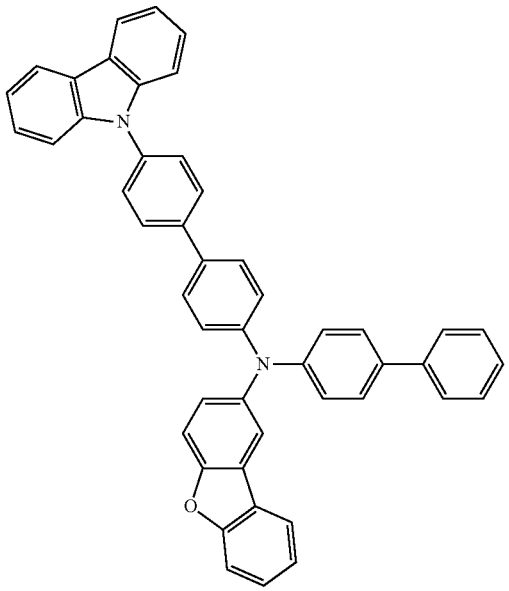

2-24
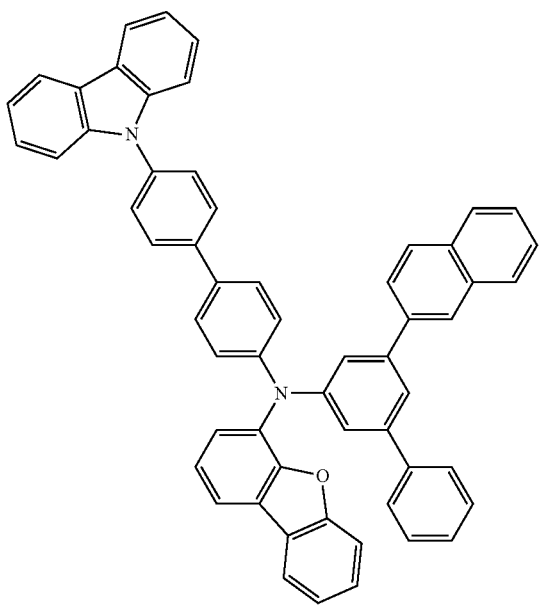
2-25
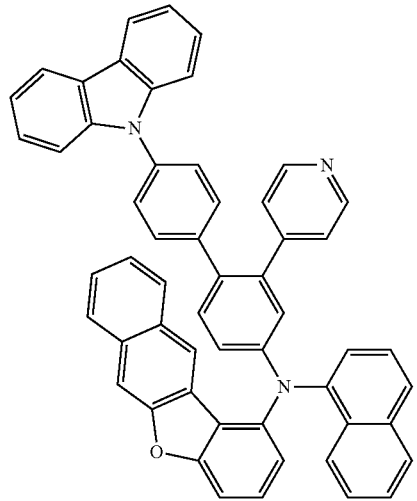
2-26
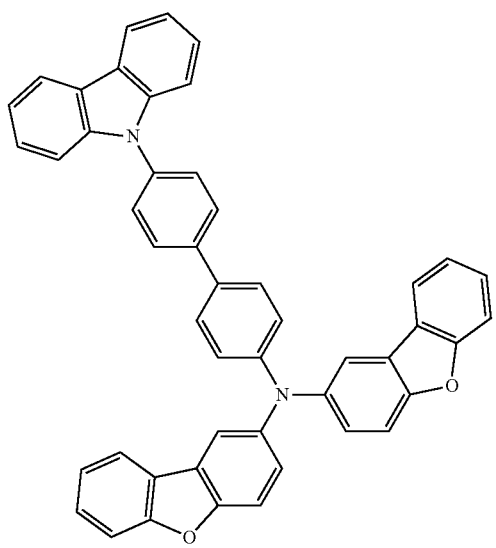
2-27
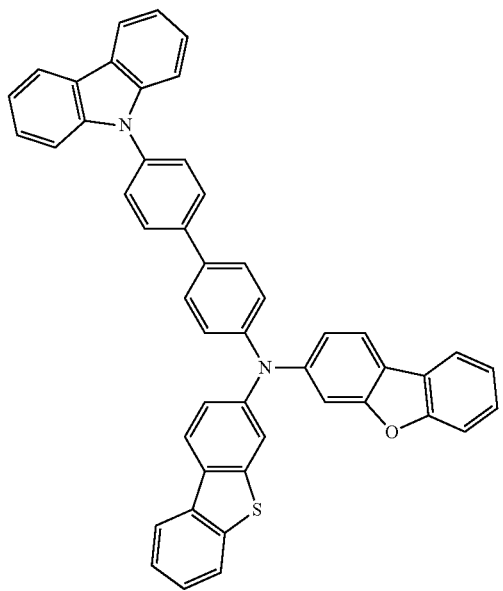

2-28
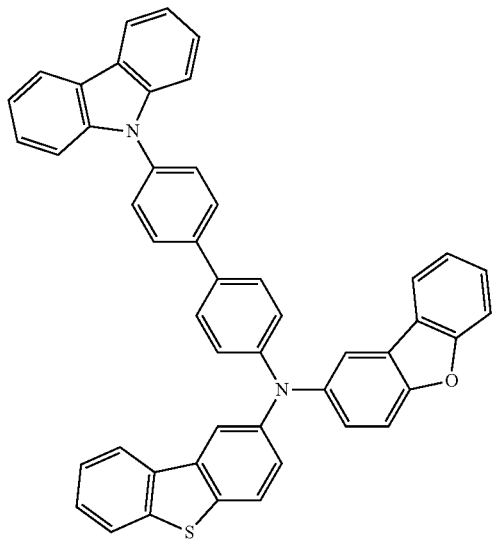
2-30
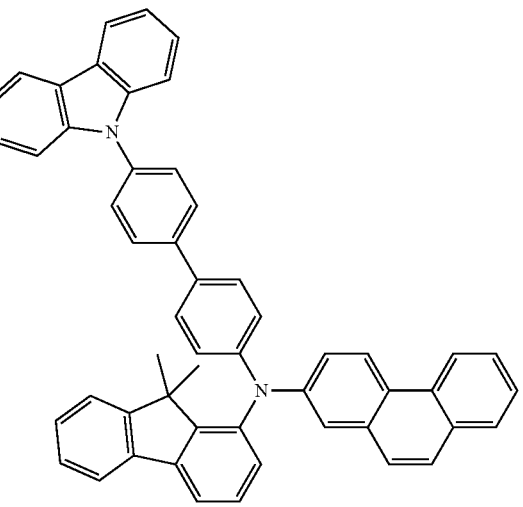
2-29
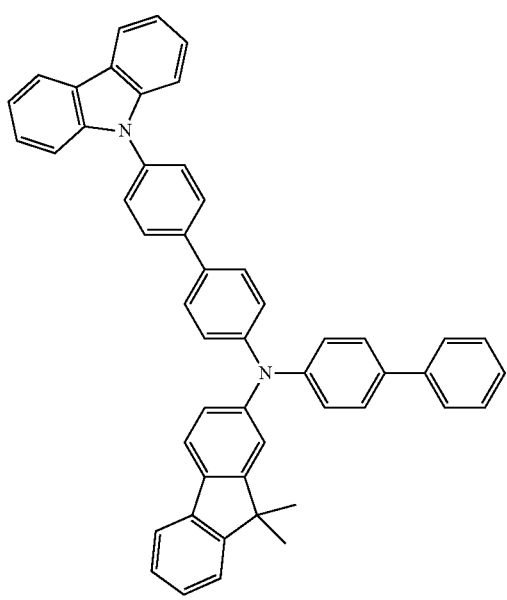
2-31
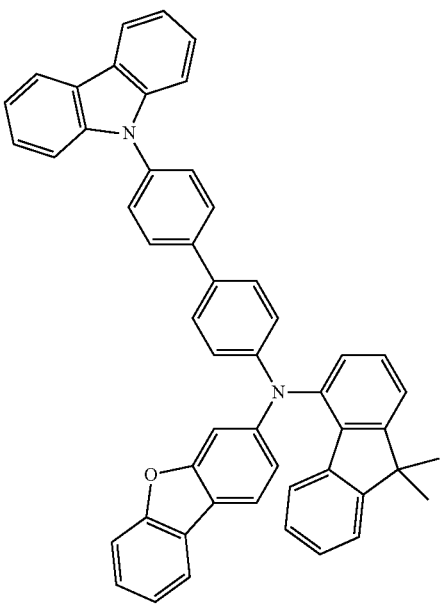

2-32
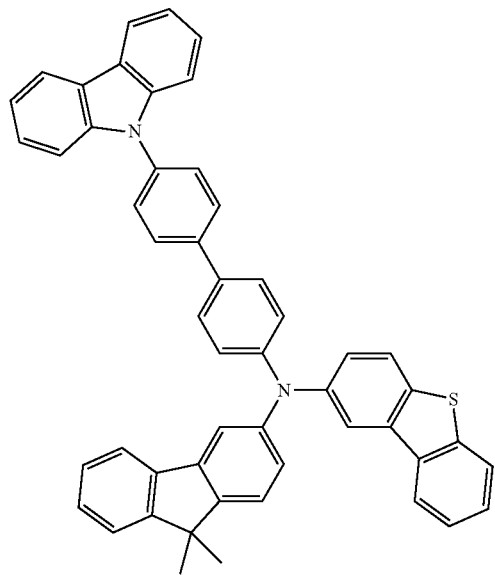
2-34
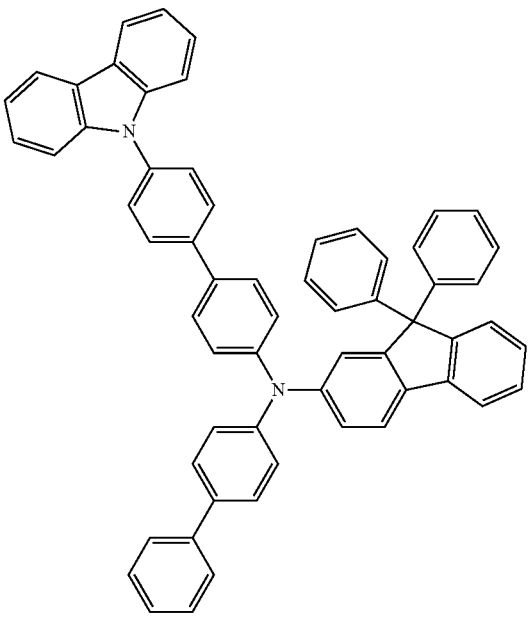
2-33
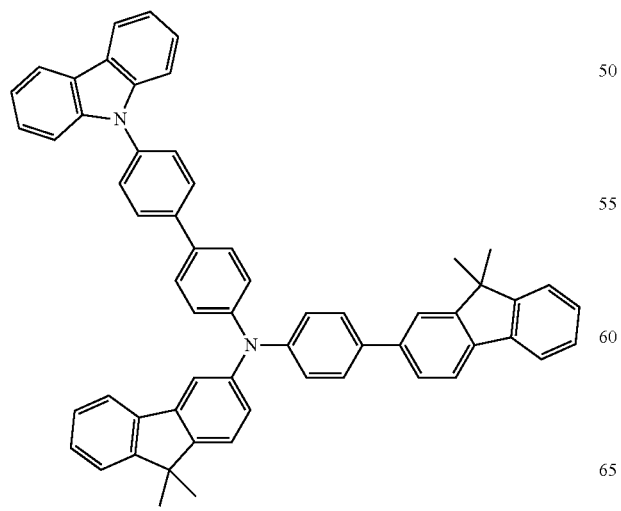
2-35
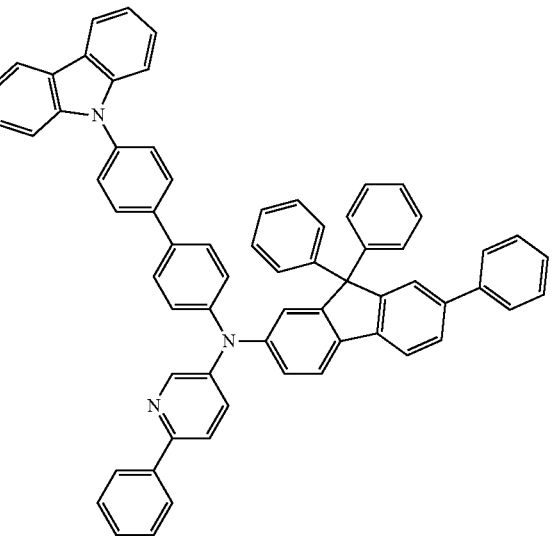

2-36
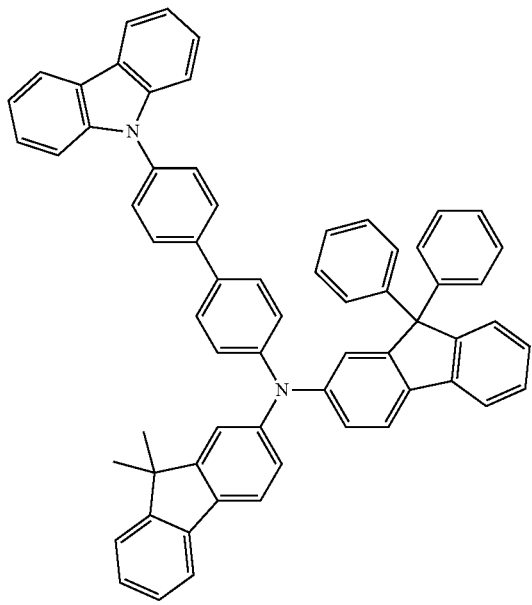
2-38
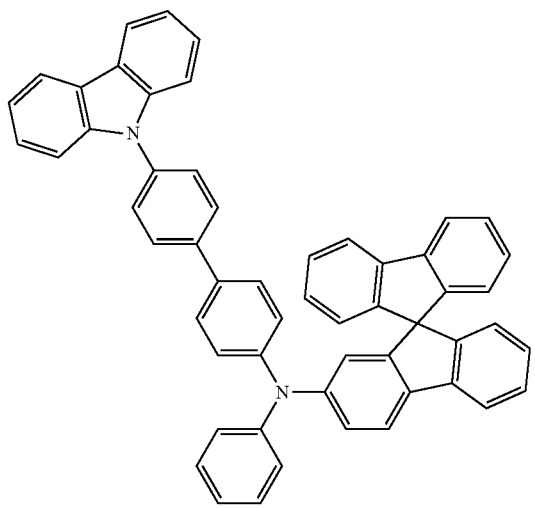
2-37
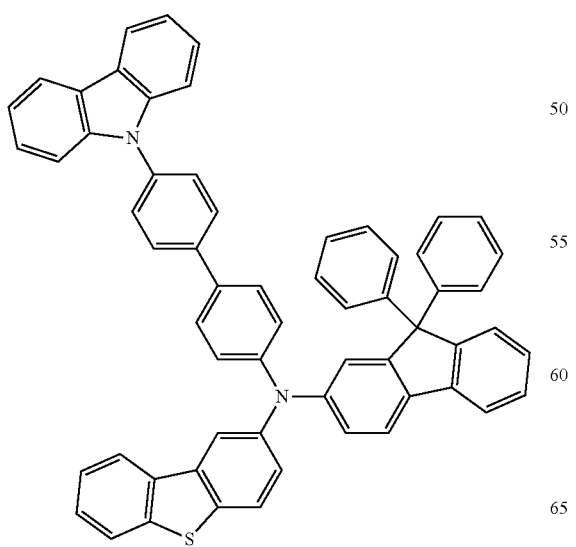
2-39
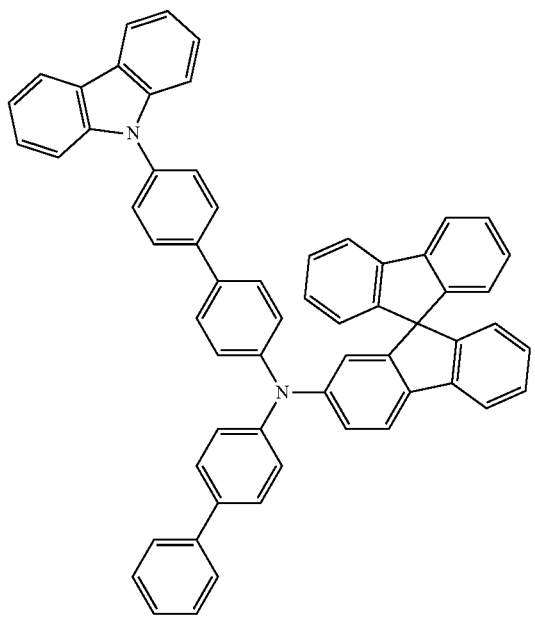

2-40
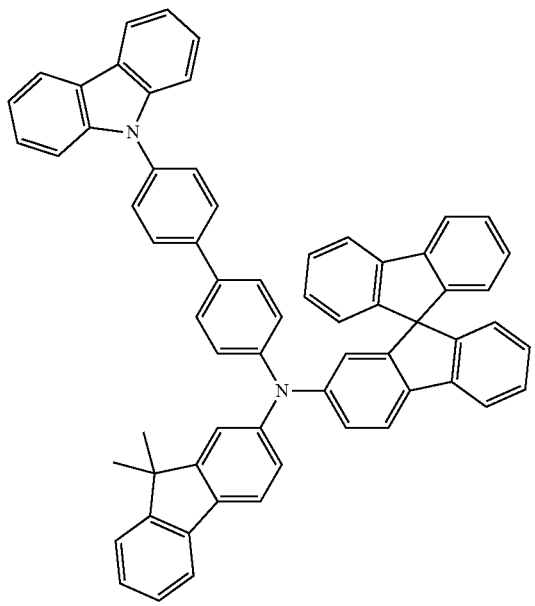
2-42
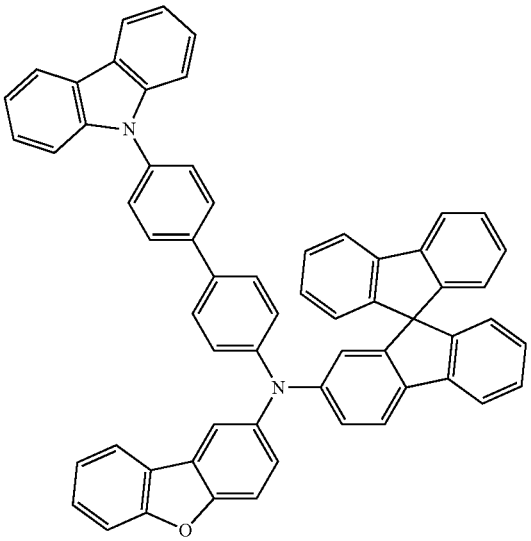
2-41
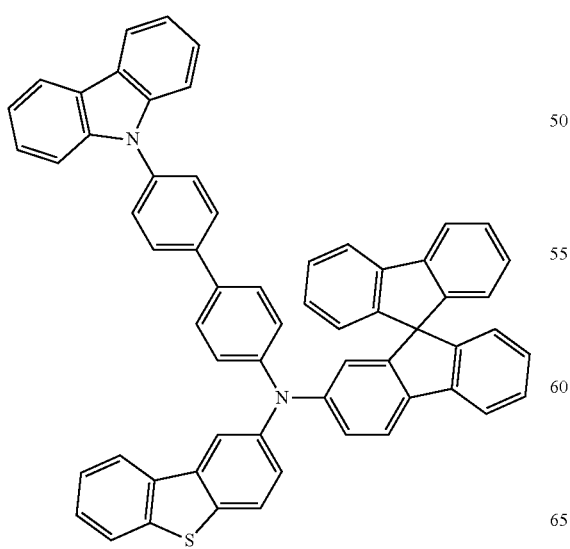
2-43
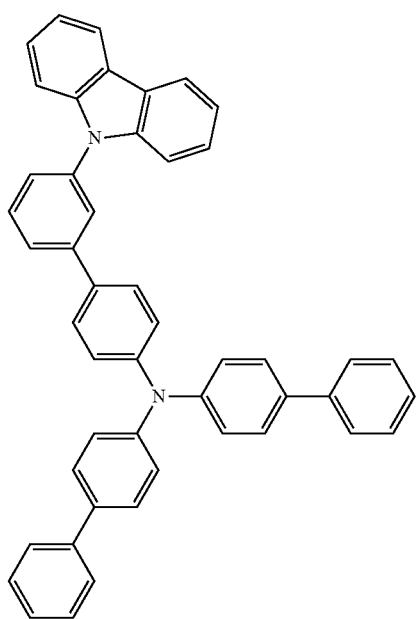

2-44
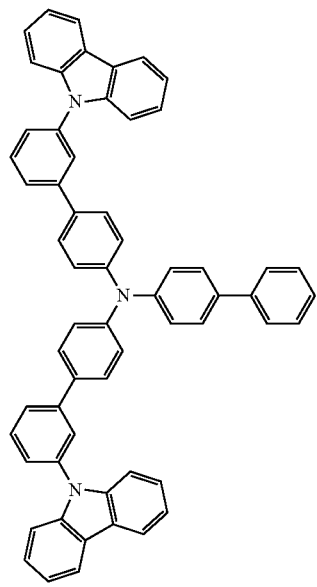
2-46
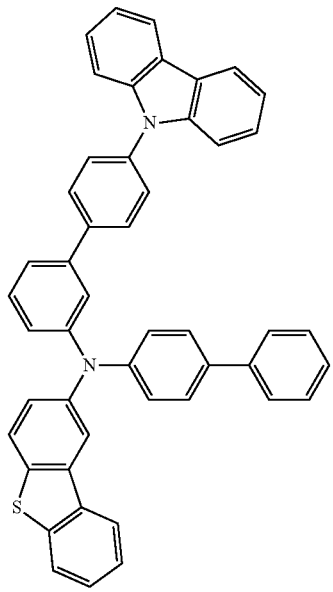
2-45
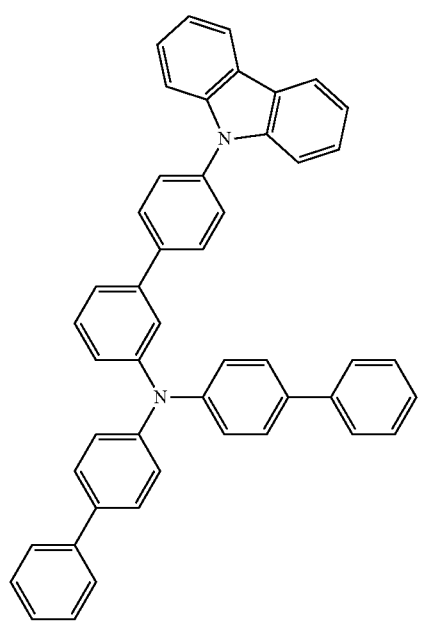
2-47
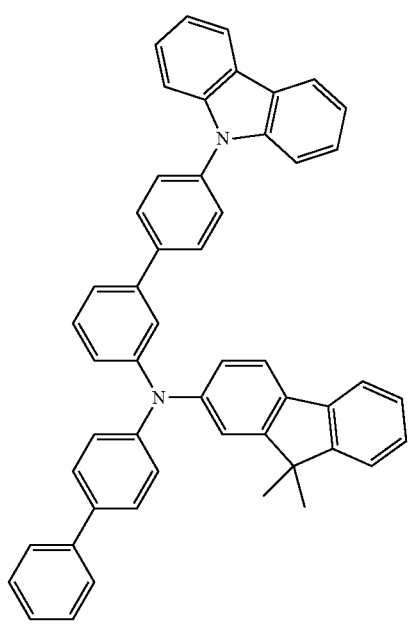

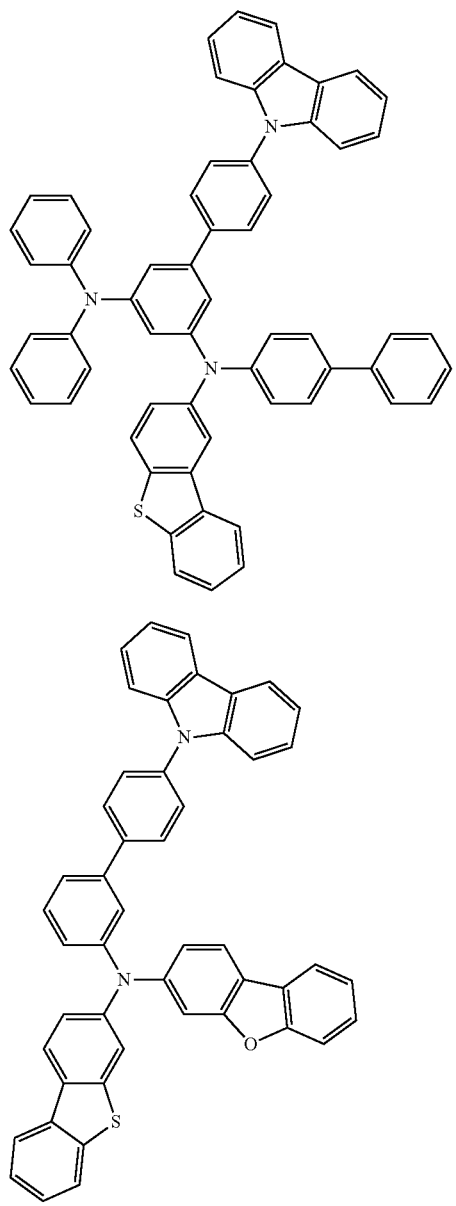
2-48
2-49
2-50
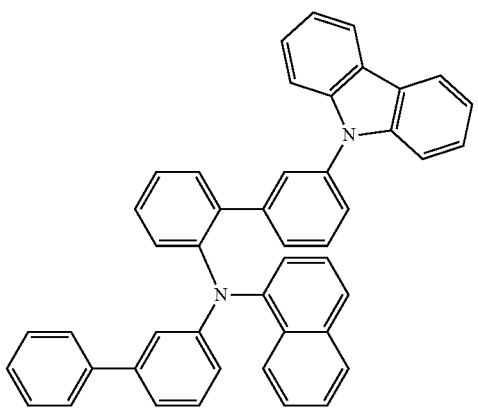
2-51
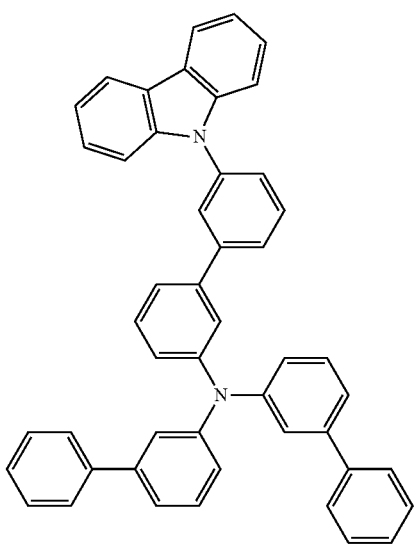
2-52
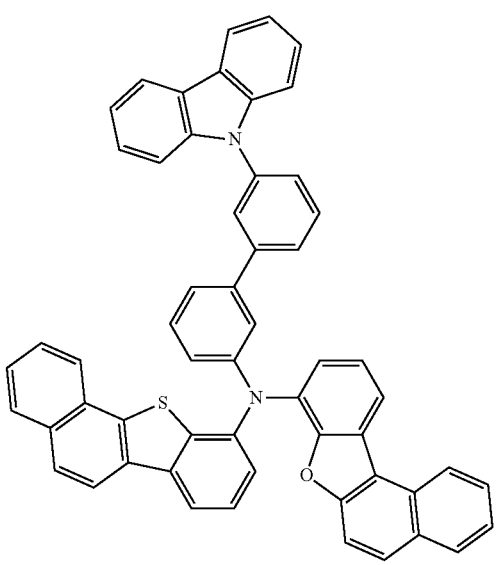
2-53

2-54
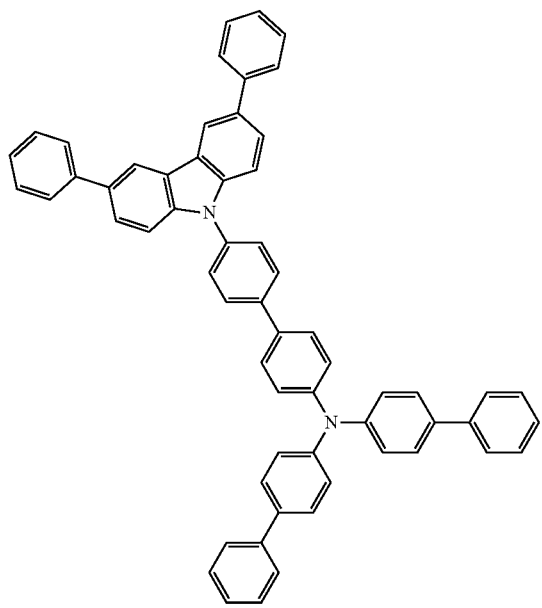
2-55
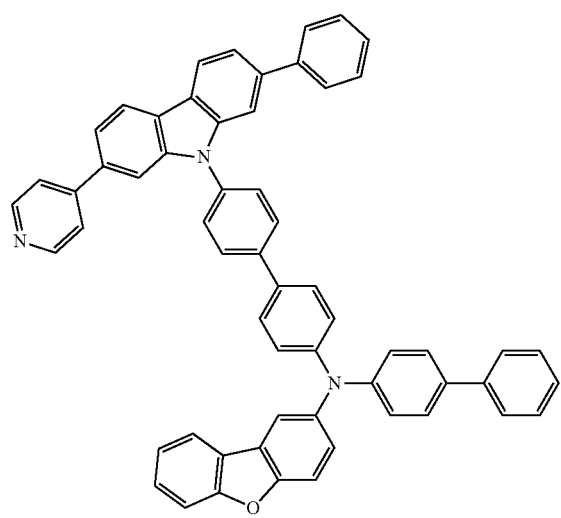
2-56
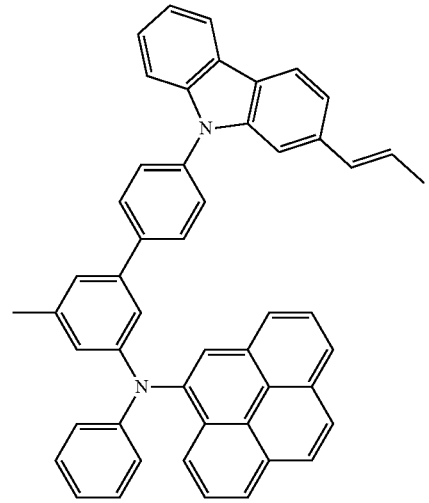
2-57
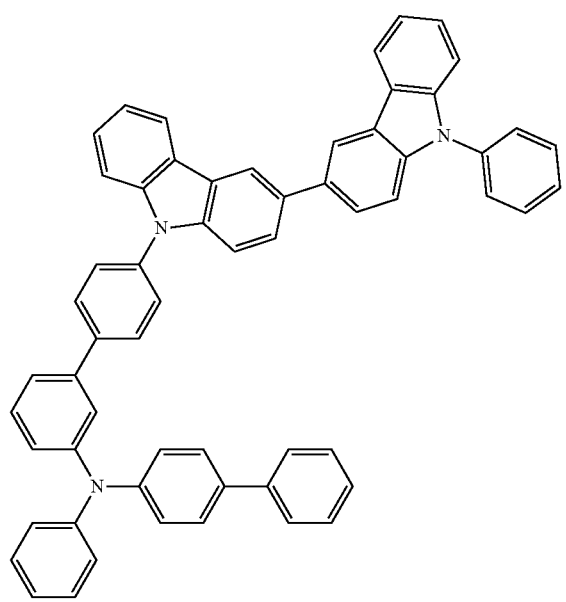
2-58
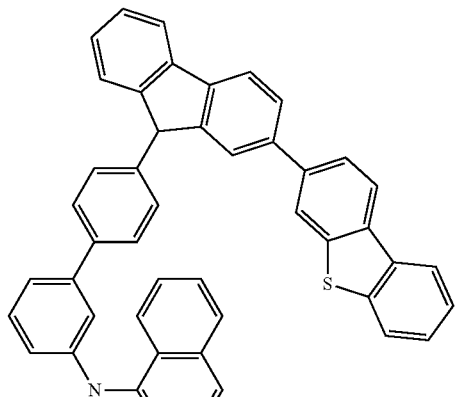
2-59
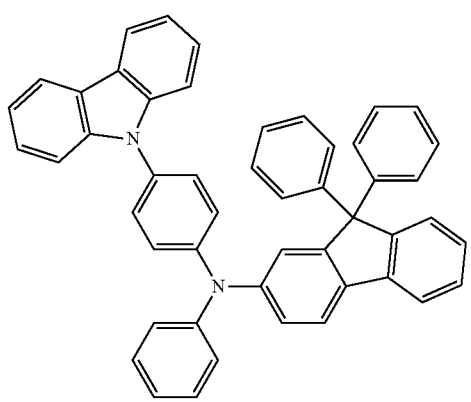

2-60
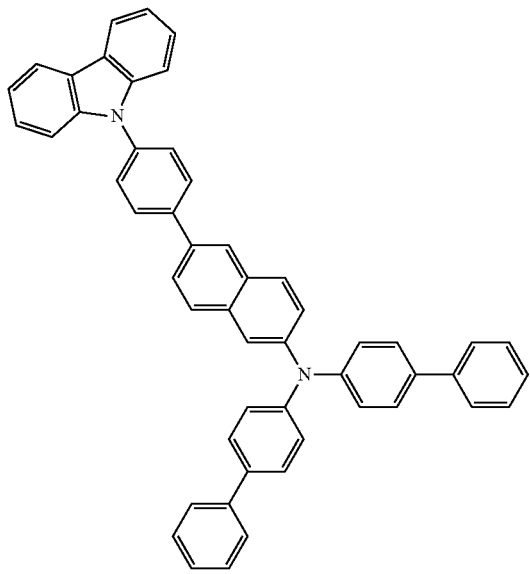
2-61
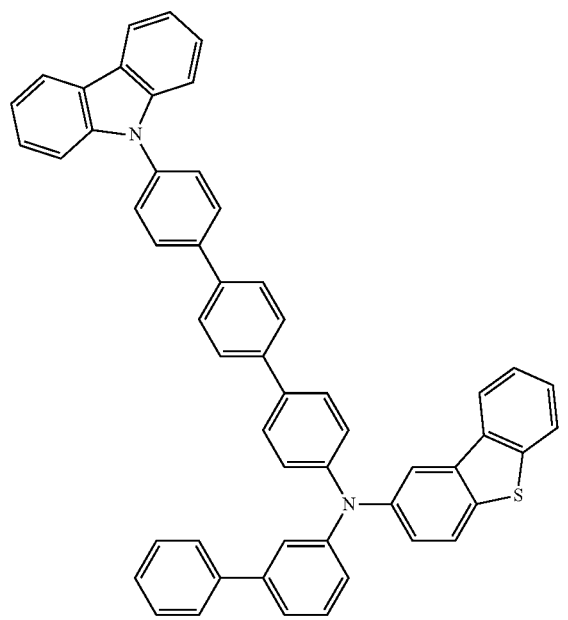
2-62
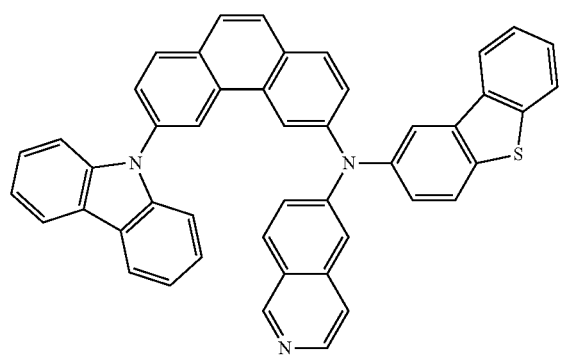
2-63
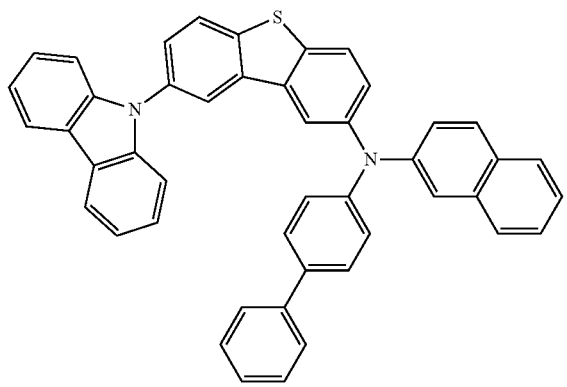
2-64
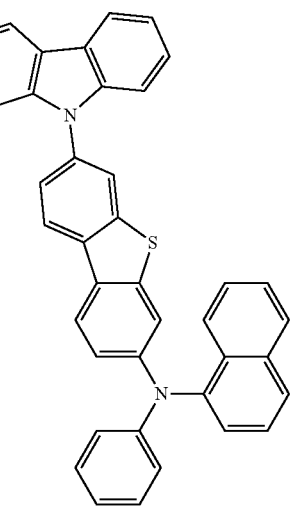
2-65
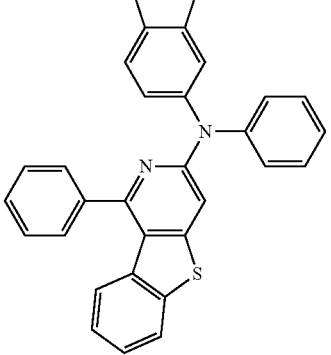

2-66
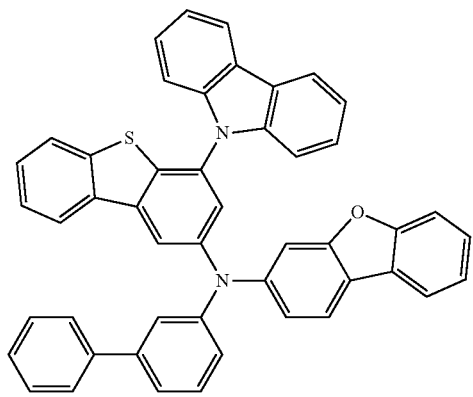
2-67
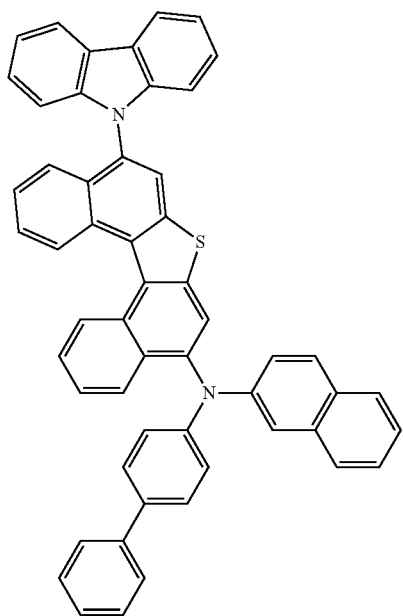
2-68
2-69
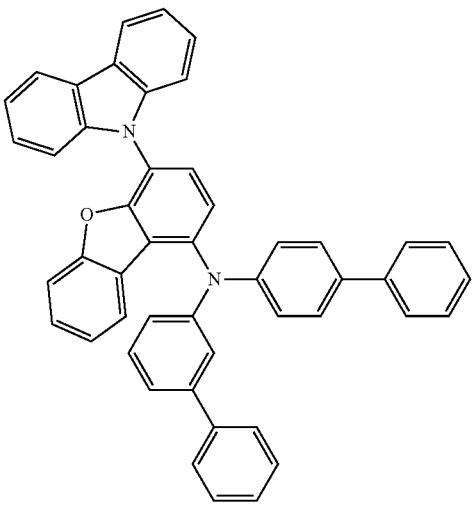
2-70
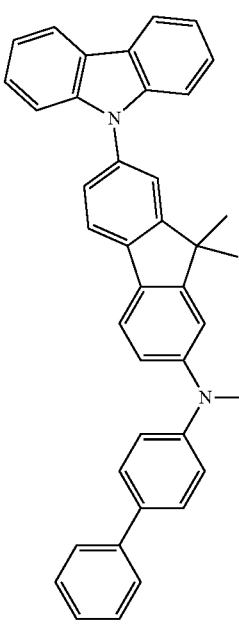

2-71
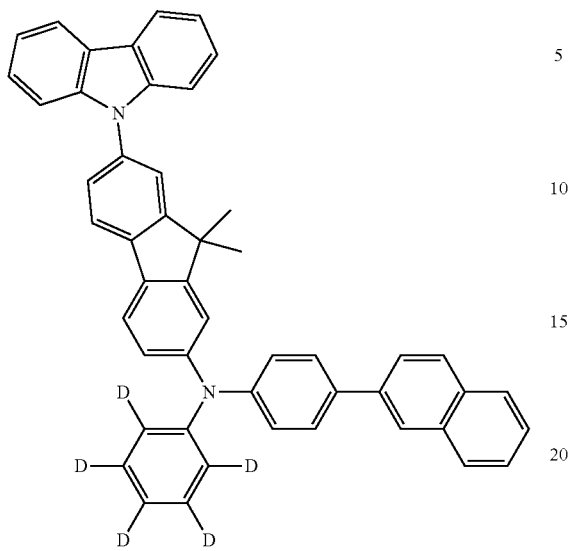
2-72
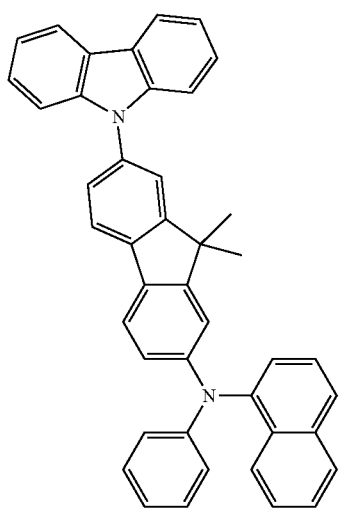
2-73
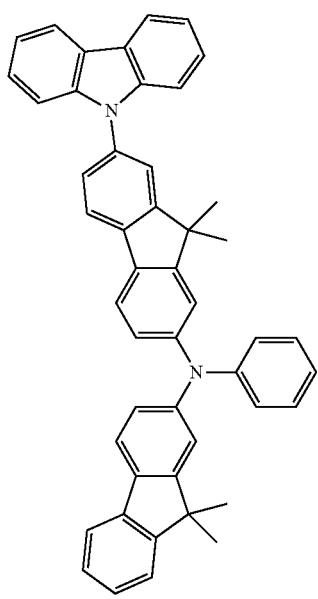
2-74
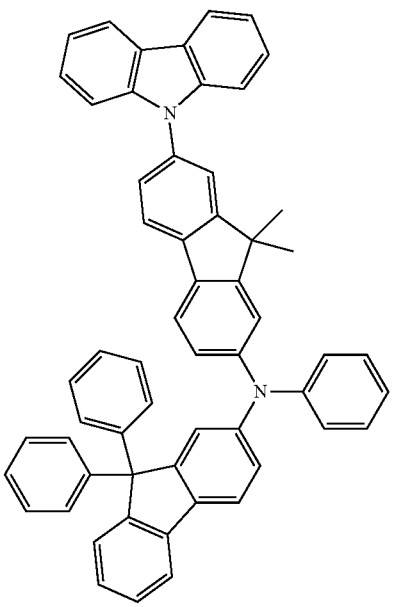
2-75
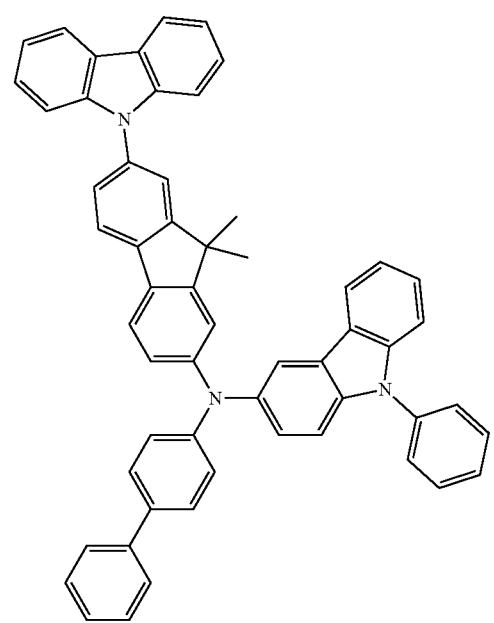

2-76
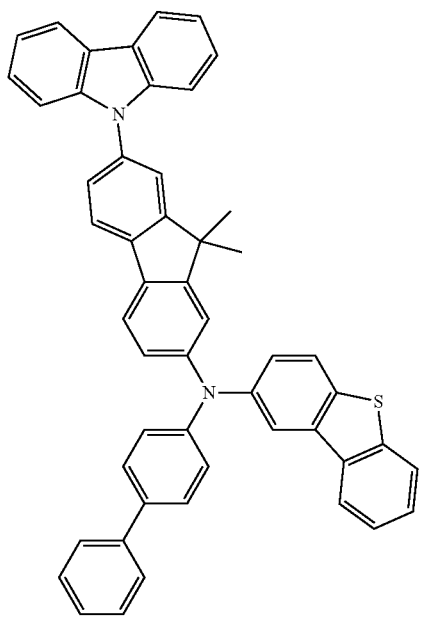
2-77
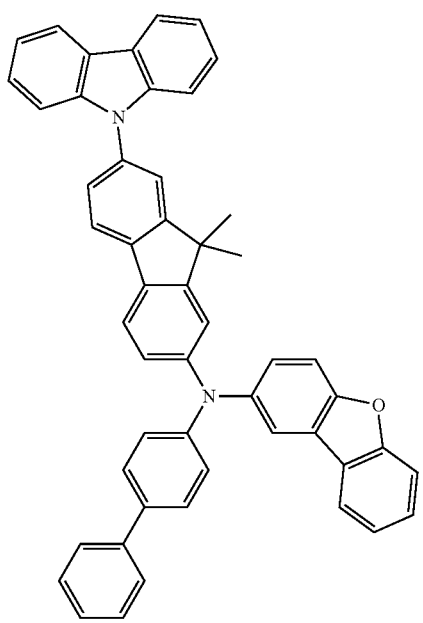
2-78
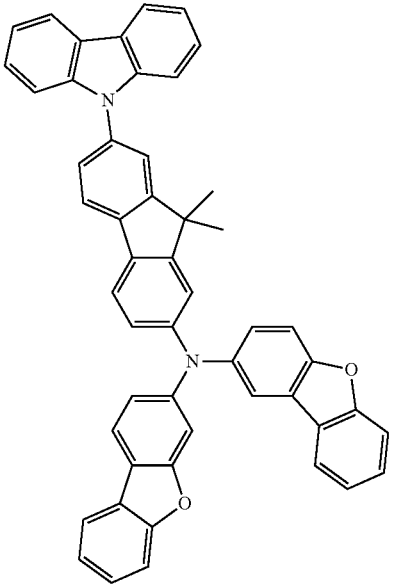
2-79
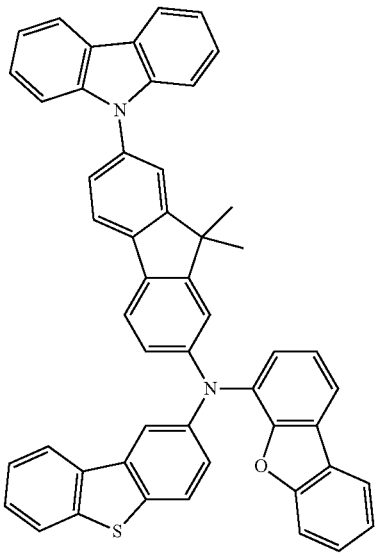

2-80
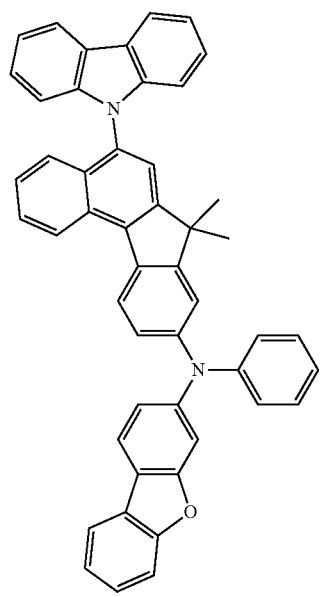
2-81
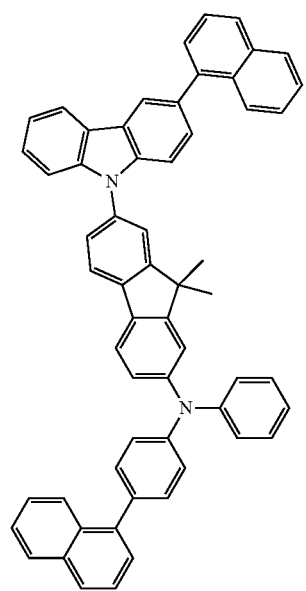
2-82
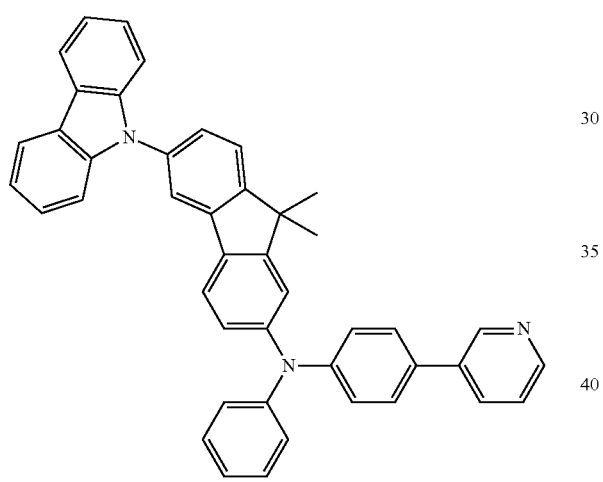
2-83
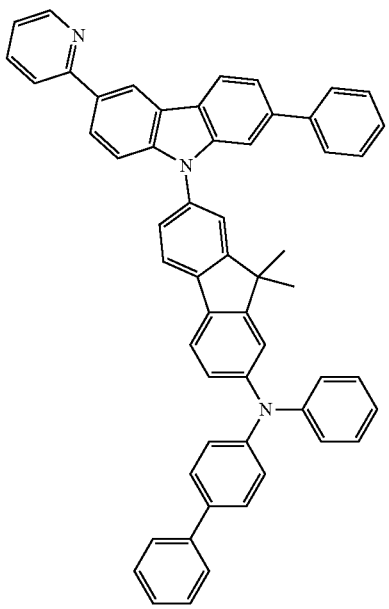
2-84
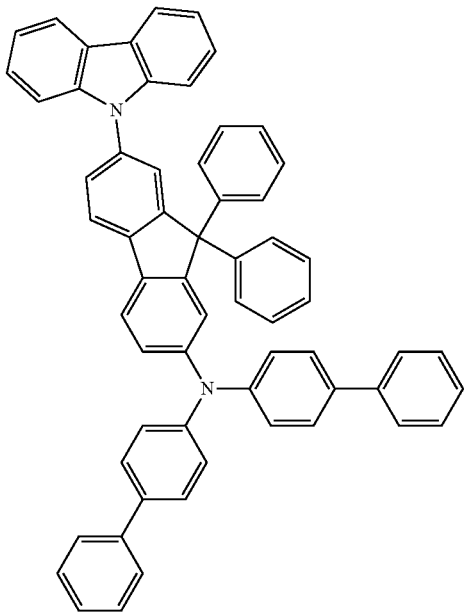

2-85
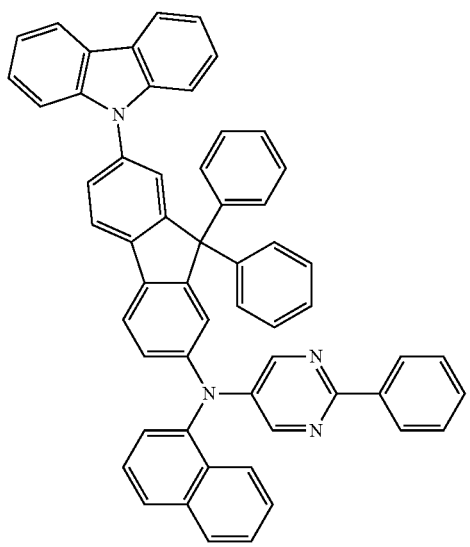
2-86
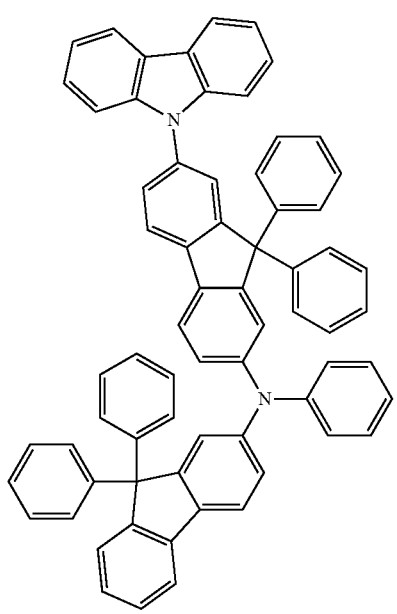
2-87
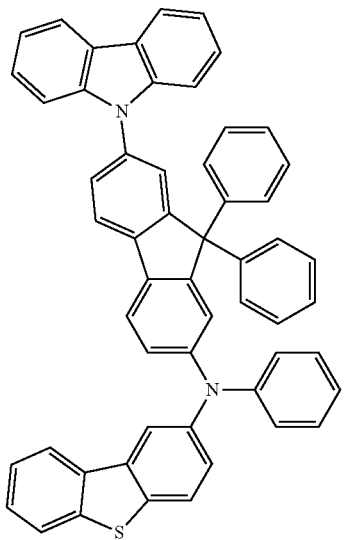
2-88
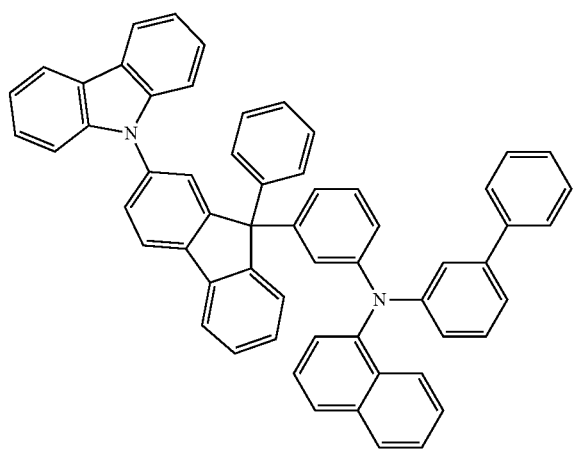
2-89

2-90
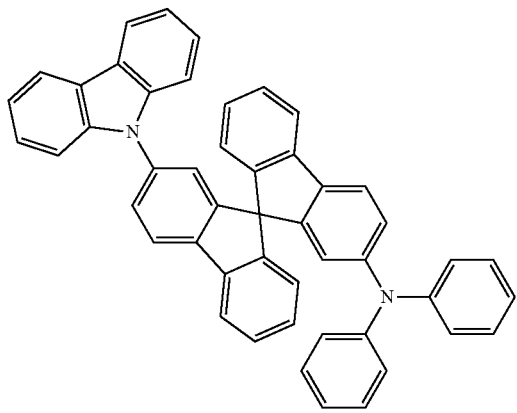
2-91
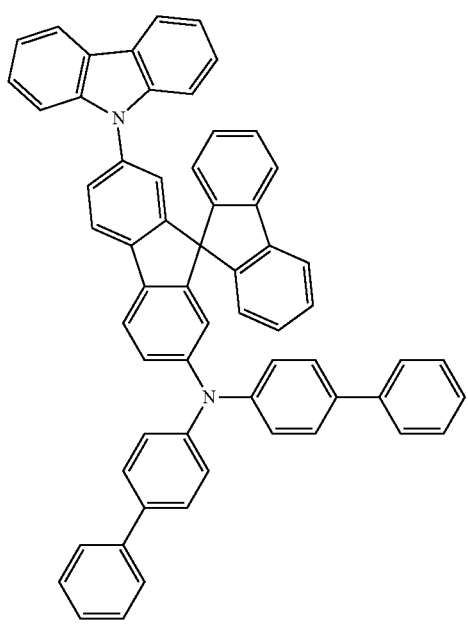
2-92
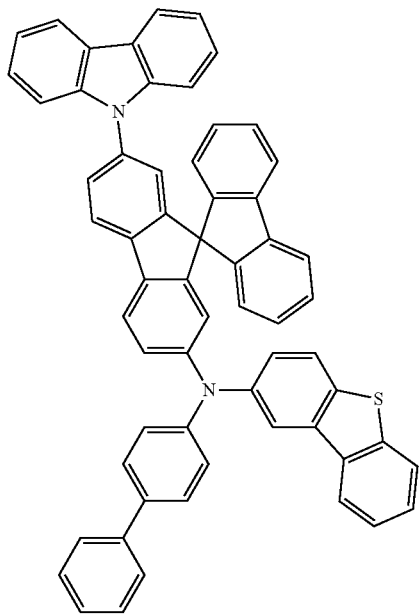
2-93
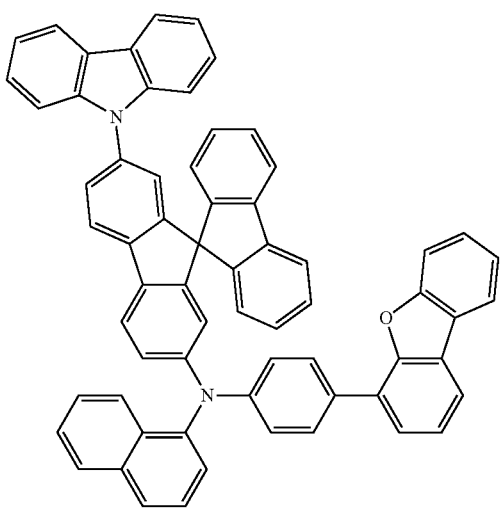
2-94
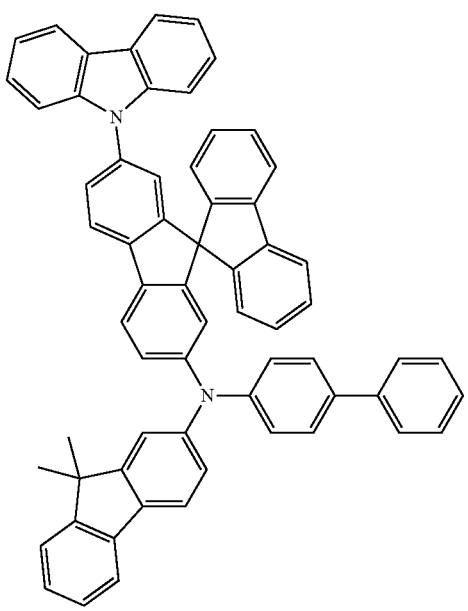

2-95
2-97
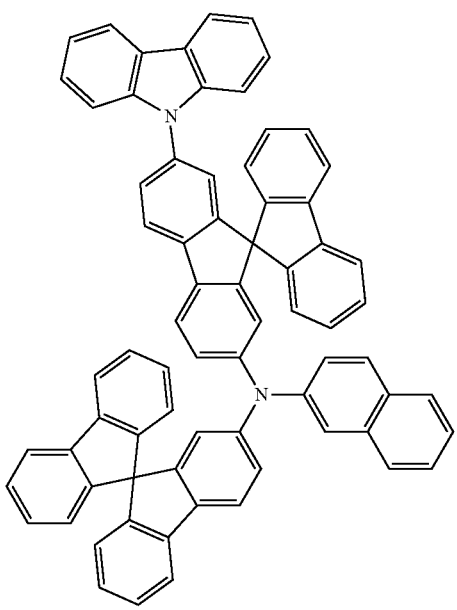
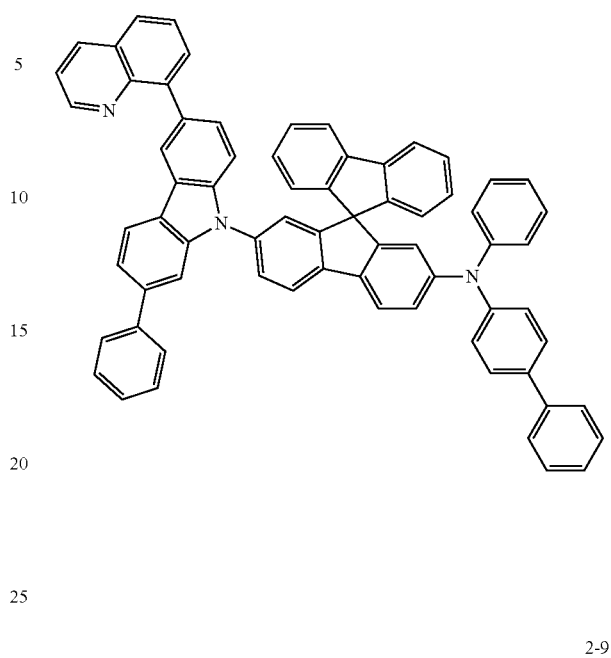
2-96
2-98
2-99

-continued
2-100
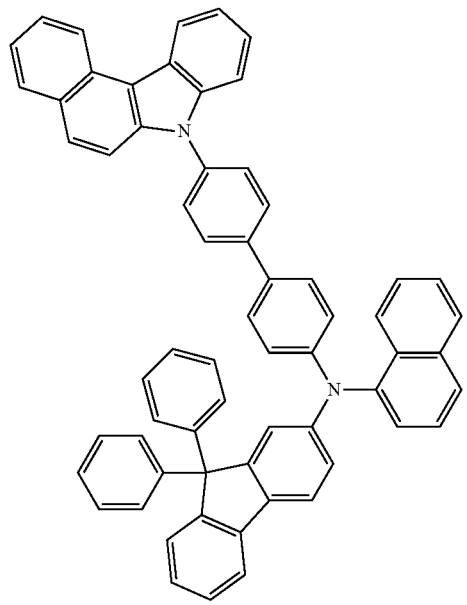
2-101
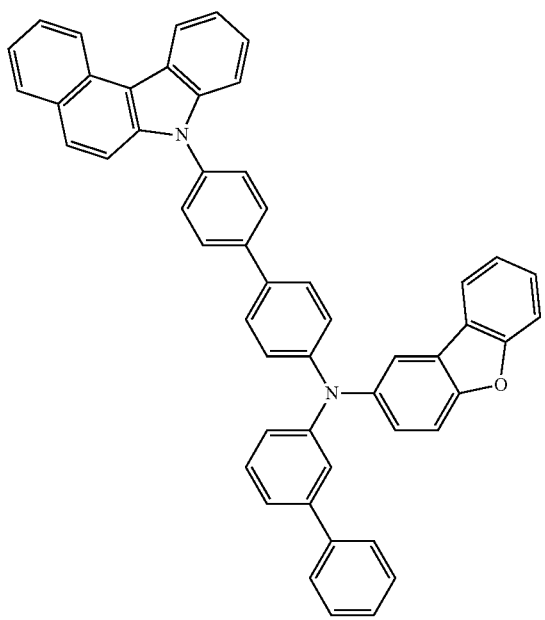
2-102
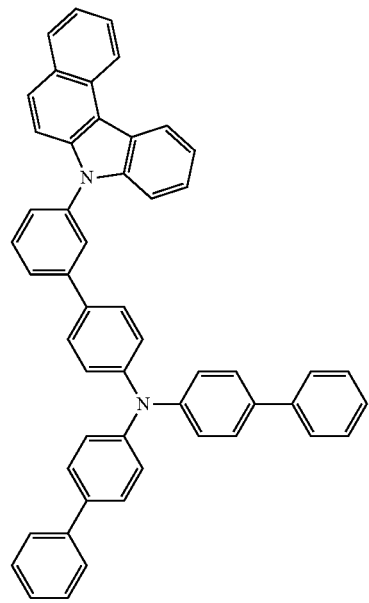
2-103
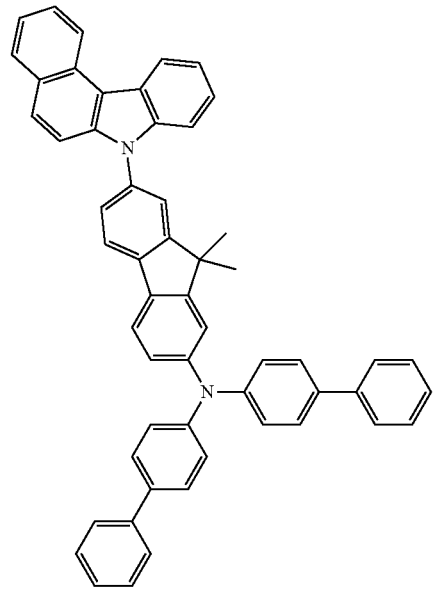

2-104
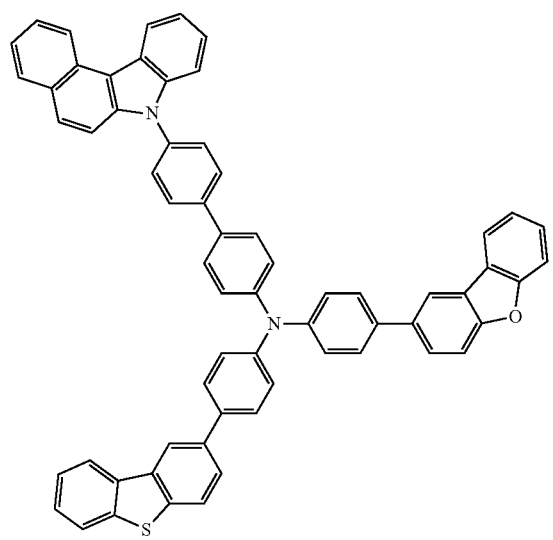
2-107
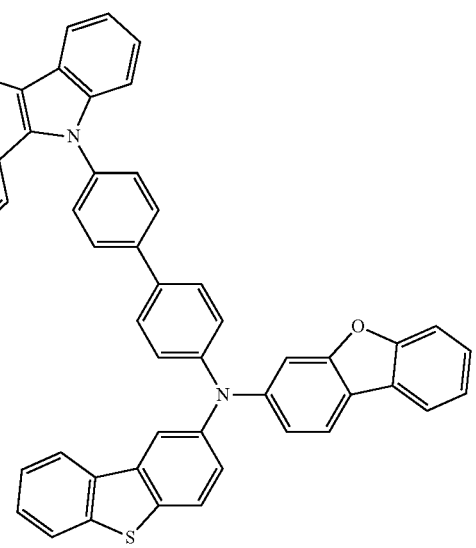
2-105
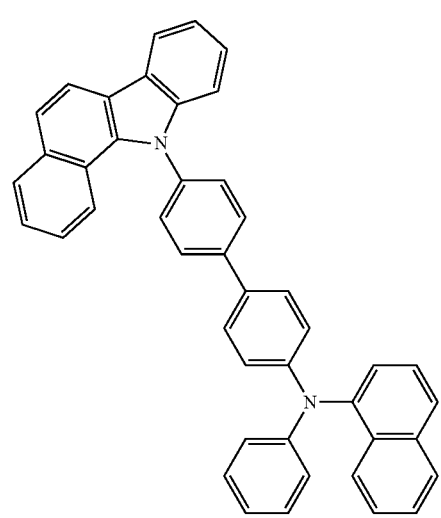
2-106
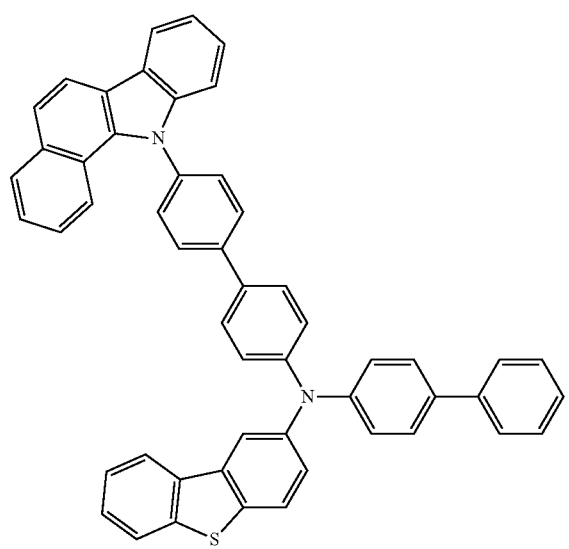
2-108
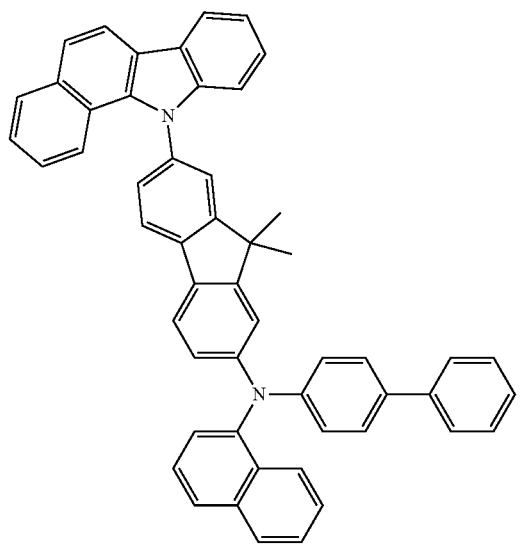

2-109
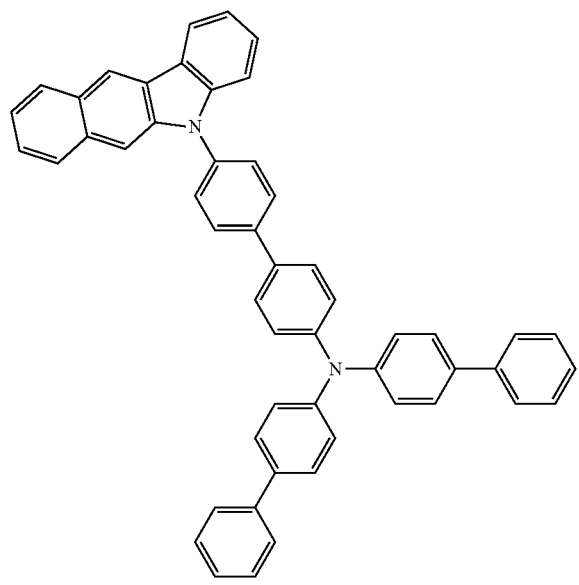
2-111
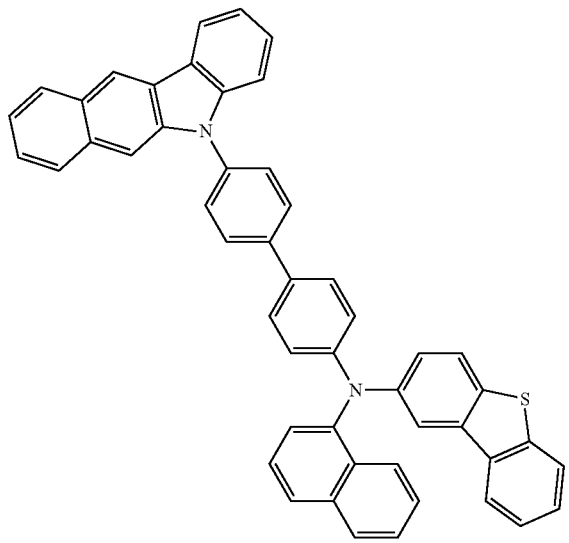
2-110
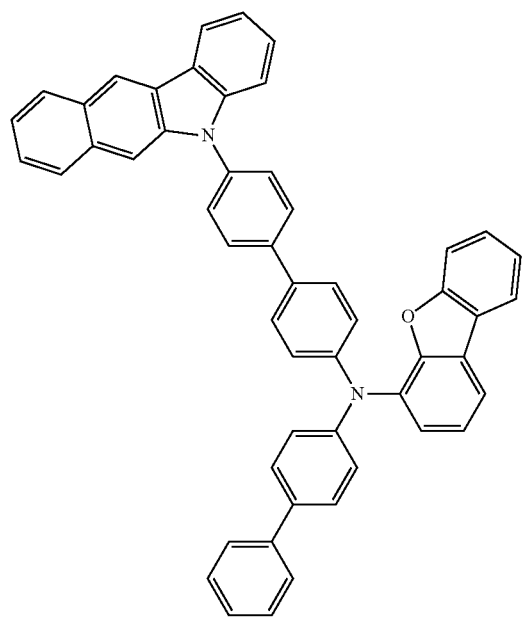
2-112
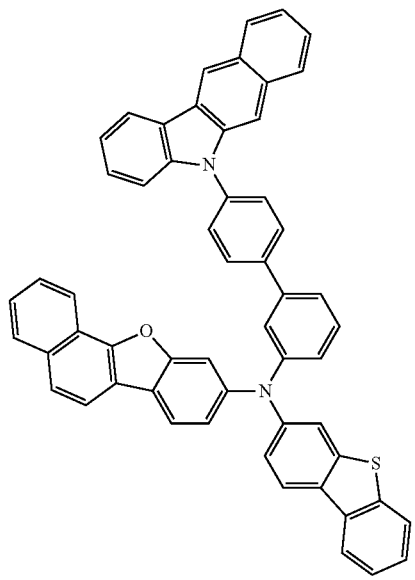

2-113
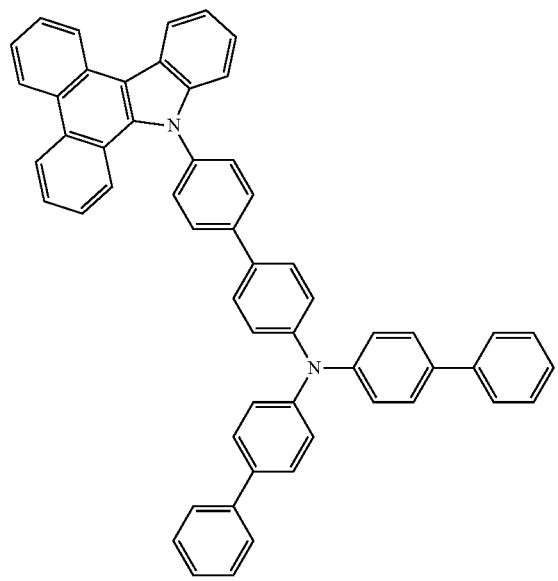
2-115
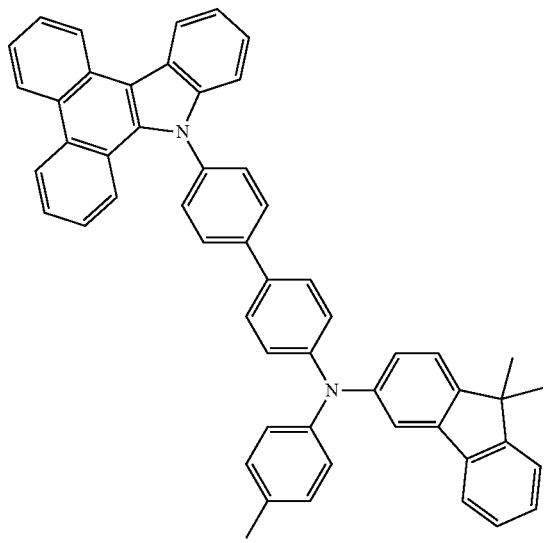
2-114
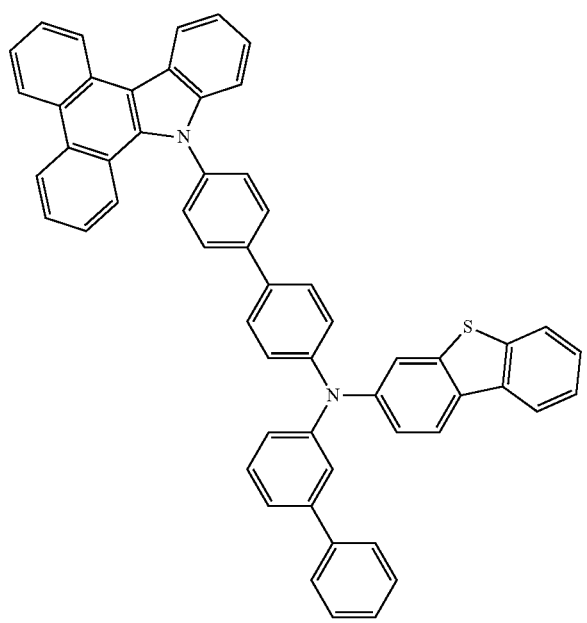
2-116
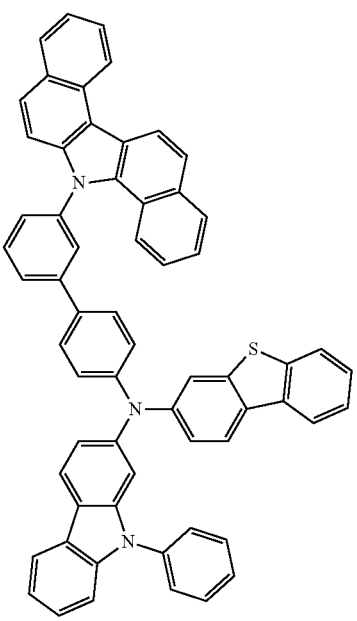

2-117
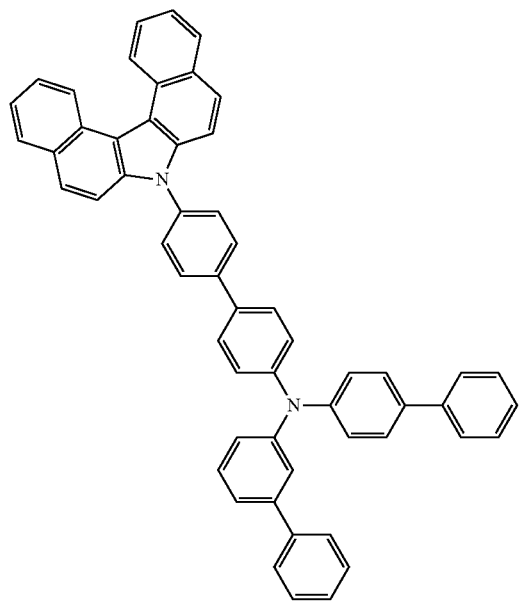
2-119
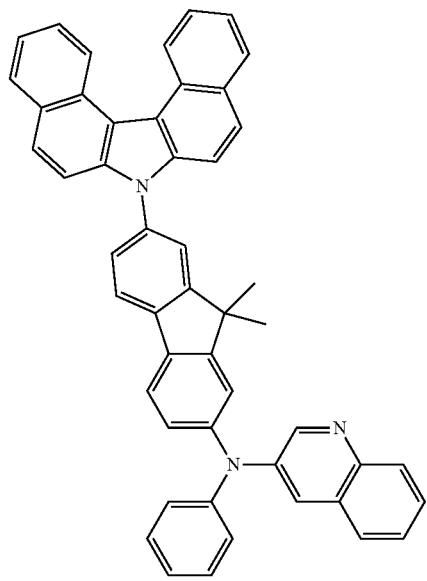
2-118
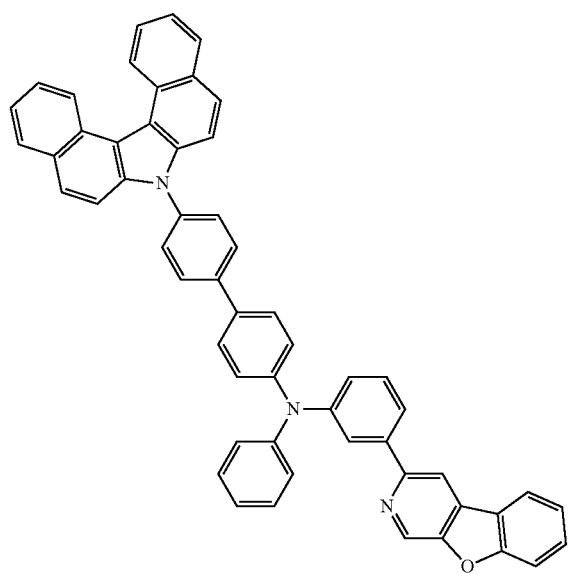
2-120
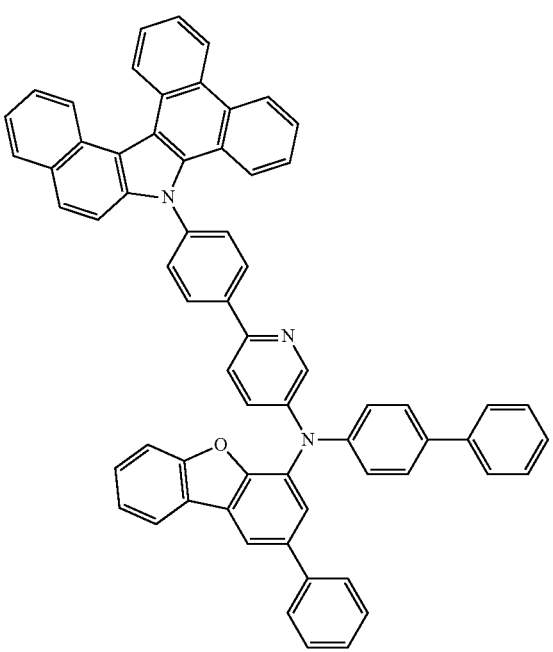

2-121
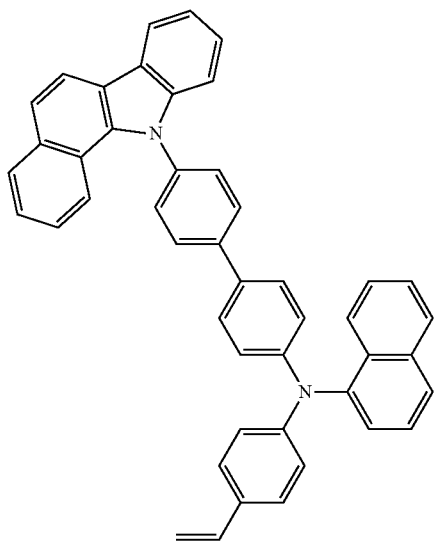
2-123
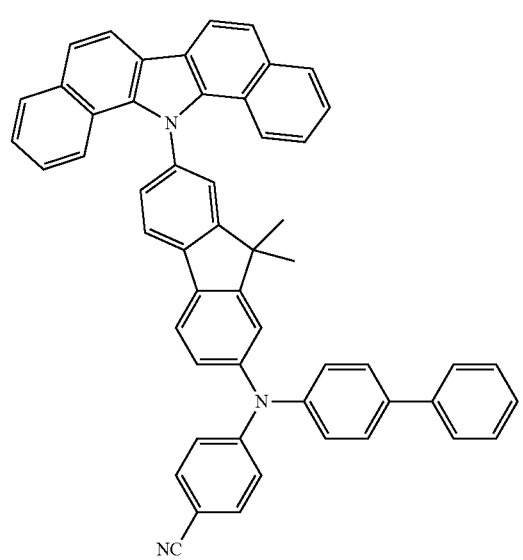
2-124
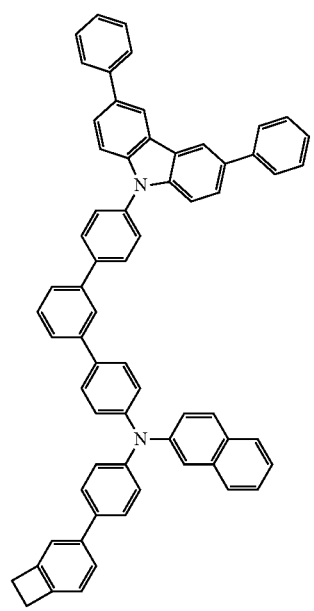
2-122
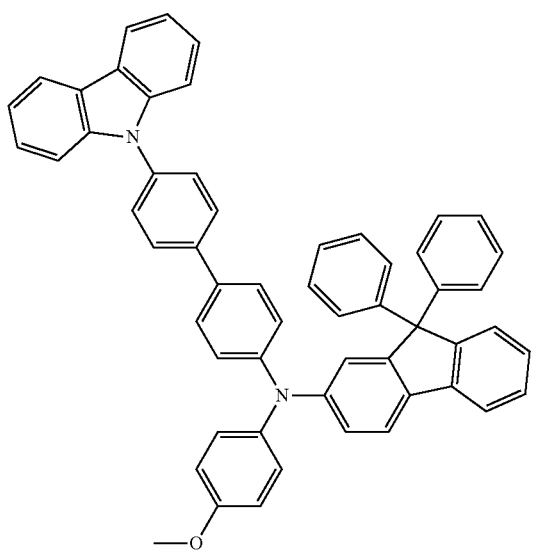
2-125
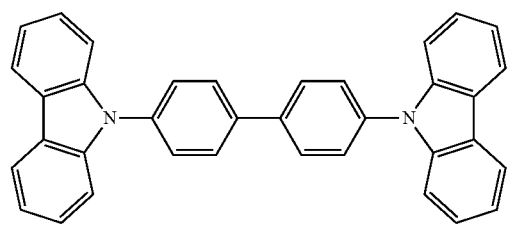

-continued 2-126

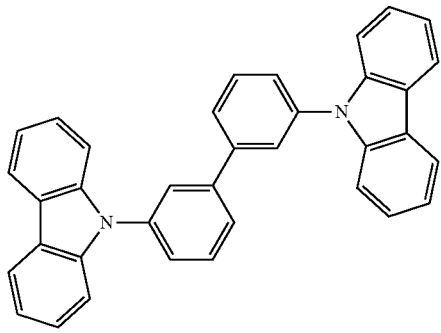

2-127

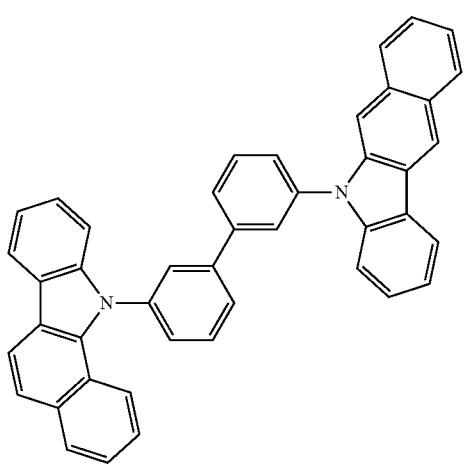

2-128

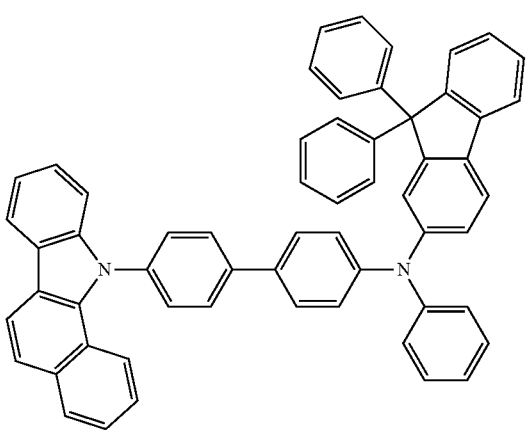

Hereinafter, synthesis example of the compound represented by Formulas 1 and 2 will be described in detail by way of examples. However, the present invention is not limited to the following examples.

SYNTHESIS EXAMPLE

[Synthesis Example 1] Compound Represented by Formula 1

The compound(final products) represented by Formula 1 according to the present invention may be prepared by reacting Sub 1 and Sub 2 as shown in Reaction Scheme 1 below, but is not limited thereto.

<Reaction Scheme 1>

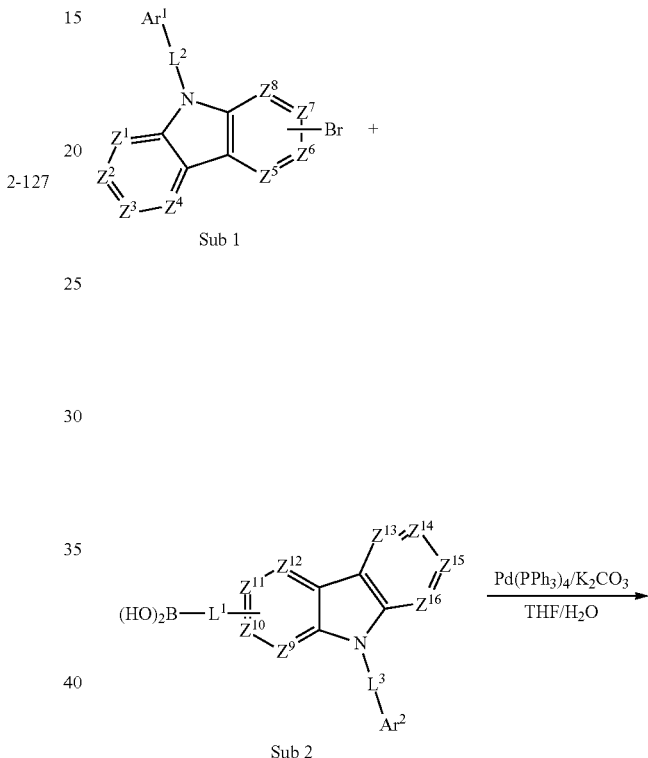

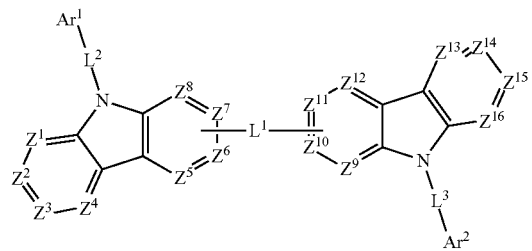

Final product 1

Synthesis Example of 1-3

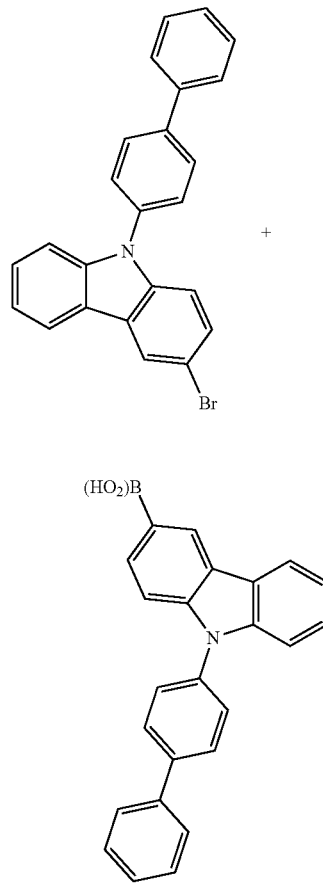

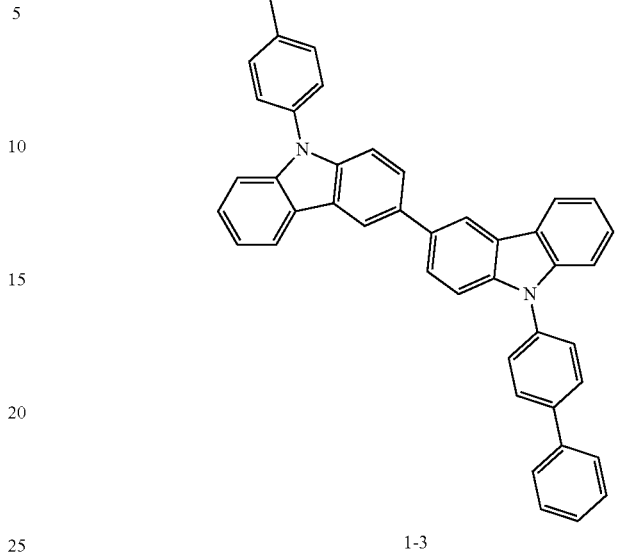

1-3

9-([1,1'-biphenyl]-4-yl)-3-bromo-9H-carbazole (50 g, 125.53 mmol) was dissolved in THF. Thereafter, (9-([1,1'-biphenyl]-4-yl)-9H-carbazol-3-yl)boronic acid (54.72 g, 150.64 mmol), Pd(PPh$_3$)$_4$ (0.04 eq.), K$_2$CO$_3$ (3 eq.) and water were added to the solution, and the mixture was stirred and refluxed. When the reaction was completed, the reaction product was extracted with ether and water and the organic layer was dried over MgSO$_4$ and concentrated. Then, the concentrate was separated by a silica gel column and recrystallized to obtain 66.35 g (yield: 83%) of product.

FD-MS values of compounds 1-1 to 1-36 prepared according to the above synthesis are shown in Table 1 below.

TABLE 1

| Compound | FD-MS | Compound | FD-MS |
|---|---|---|---|
| 1-1 | m/z = 610.24(C$_{46}$H$_{30}$N$_2$ = 610.76) | 1-2 | m/z = 610.24(C$_{46}$H$_{30}$N$_2$ = 610.76) |
| 1-3 | m/z = 636.26(C$_{48}$H$_{32}$N$_2$ = 636.80) | 1-4 | m/z = 636.26(C$_{48}$H$_{32}$N$_2$ = 636.80) |
| 1-5 | m/z = 610.24(C$_{46}$H$_{30}$N$_2$ = 610.76) | 1-6 | m/z = 610.24(C$_{46}$H$_{30}$N$_2$ = 610.76) |
| 1-7 | m/z = 649.25(C$_{48}$H$_{31}$N$_3$ = 649.80) | 1-8 | m/z = 726.27(C$_{54}$H$_{34}$N$_2$O = 726.88) |
| 1-9 | m/z = 560.23(C$_{42}$H$_{28}$N$_2$ = 560.70) | 1-10 | m/z = 725.28(C$_{54}$H$_{35}$N$_3$ = 725.90) |
| 1-11 | m/z = 650.24(C$_{48}$H$_{30}$N$_2$O = 650.78) | 1-12 | m/z = 650.24(C$_{48}$H$_{30}$N$_2$O = 650.78) |
| 1-13 | m/z = 649.25(C$_{48}$H$_{31}$N$_3$ = 649.8) | 1-14 | m/z = 649.25(C$_{48}$H$_{31}$N$_3$ = 649.8) |
| 1-15 | m/z = 650.24(C$_{48}$H$_{30}$N$_2$O = 650.78) | 1-16 | m/z = 650.24(C$_{48}$H$_{30}$N$_2$O = 650.78) |
| 1-17 | m/z = 666.21(C$_{48}$H$_{30}$N$_2$S = 666.84) | 1-18 | m/z = 666.21(C$_{48}$H$_{30}$N$_2$S = 666.84) |
| 1-19 | m/z = 666.21(C$_{48}$H$_{30}$N$_2$S = 666.84) | 1-20 | m/z = 666.21(C$_{48}$H$_{30}$N$_2$S = 666.84) |
| 1-21 | m/z = 650.24(C$_{48}$H$_{30}$N$_2$O = 650.78) | 1-22 | m/z = 650.24(C$_{48}$H$_{30}$N$_2$O = 650.78) |
| 1-23 | m/z = 650.24(C$_{48}$H$_{30}$N$_2$O = 650.78) | 1-24 | m/z = 650.24(C$_{48}$H$_{30}$N$_2$O = 650.78) |
| 1-25 | m/z = 666.21(C$_{48}$H$_{30}$N$_2$S = 666.84) | 1-26 | m/z = 666.21(C$_{48}$H$_{30}$N$_2$S = 666.84) |
| 1-27 | m/z = 666.21(C$_{48}$H$_{30}$N$_2$S = 666.84) | 1-28 | m/z = 666.21(C$_{48}$H$_{30}$N$_2$S = 666.84) |
| 1-29 | m/z = 649.25(C$_{48}$H$_{31}$N$_3$ = 649.8) | 1-30 | m/z = 649.25(C$_{48}$H$_{31}$N$_3$ = 649.8) |
| 1-31 | m/z = 649.25(C$_{48}$H$_{31}$N$_3$ = 649.8) | 1-32 | m/z = 699.27(C$_{52}$H$_{33}$N$_3$ = 699.86) |
| 1-33 | m/z = 636.26(C$_{48}$H$_{32}$N$_2$ = 636.80) | 1-34 | m/z = 725.28(C$_{54}$H$_{35}$N$_3$ = 725.90) |
| 1-35 | m/z = 649.25(C$_{48}$H$_{31}$N$_3$ = 649.8) | 1-36 | m/z = 649.25(C$_{48}$H$_{31}$N$_3$ = 649.8) |

[Synthesis Example 2] Compound Represented by Formula 2

The compound (final products 2) represented by Formula 2 according to the present invention may be prepared by reacting Sub 3 and Sub 4 as shown in Reaction Scheme 2 below, but is not limited thereto.

<Reaction Scheme 2>

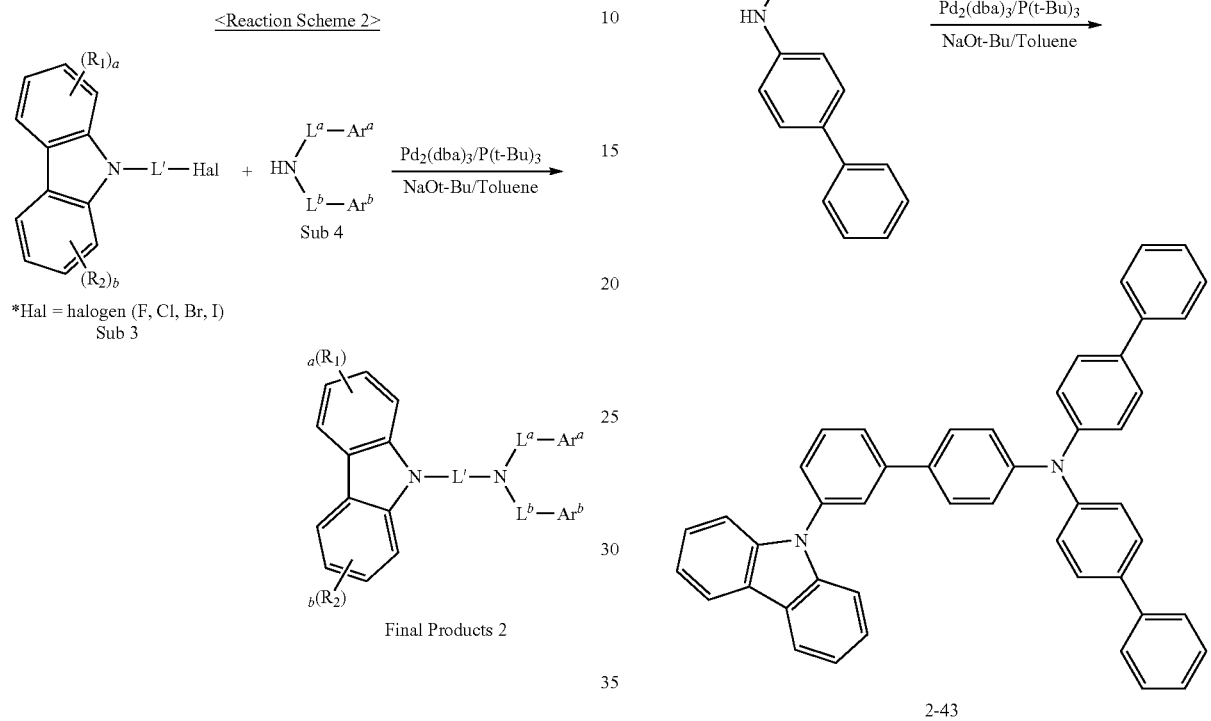

*Hal = halogen (F, Cl, Br, I)
Sub 3

Final Products 2

Synthesis Example of 2-43

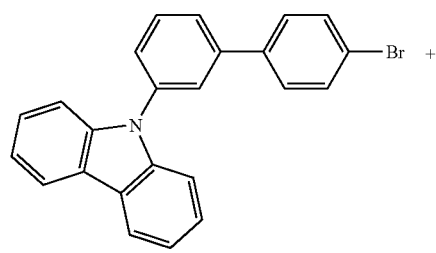

2-43

After 9-(4'-bromo-[1,1'-biphenyl]-3-yl)-9H-carbazole (35 g, 87.87 mmol) was dissolved in toluene, di([1,1'-biphenyl]-4-yl)amine (28.24 g, 87.87 mmol), $Pd_2dba)_3$ (2.41 g, 2.64 mmol), 50% $P(t-Bu)_3$ (1.42 ml, 7.03 mmol) and NaOt-Bu (25.34 g, 263.62 mmol) were added to the solution, and the mixture was stirred at 100° C. When the reaction was completed, the reaction product was extracted with $CH_2Cl_2$ and water and the organic layer was dried over $MgSO_4$ and concentrated. Then, the concentrate was separated by a silica gel column and recrystallized to obtain 44.35 g (yield: 79%) of product.

FD-MS values of compounds 2-1 to 2-128 prepared according to the above synthesis are shown in Table 2 below.

TABLE 2

| Compound | FD-MS | Compound | FD-MS |
|---|---|---|---|
| 2-1 | m/z = 486.21($C_{36}H_{26}N_2$ = 486.61) | 2-2 | m/z = 541.26($C_{40}H_{23}D_5N_2$ = 541.69) |
| 2-3 | m/z = 612.26($C_{46}H_{32}N_2$ = 612.76) | 2-4 | m/z = 562.24($C_{42}H_{30}N_2$ = 562.70) |
| 2-5 | m/z = 636.26($C_{48}H_{32}N_2$ = 636.78) | 2-6 | m/z = 586.24($C_{44}H_{30}N_2$ = 586.72) |
| 2-7 | m/z = 712.29($C_{54}H_{36}N_2$ = 712.88) | 2-8 | m/z = 638.27($C_{48}H_{34}N_2$ = 638.80) |
| 2-9 | m/z = 638.27($C_{48}H_{34}N_2$ = 638.80) | 2-10 | m/z = 638.27($C_{48}H_{34}N_2$ = 638.80) |
| 2-11 | m/z = 638.27($C_{48}H_{34}N_2$ = 638.80) | 2-12 | m/z = 738.30($C_{56}H_{38}N_2$ = 738.91) |
| 2-13 | m/z = 653.28($C_{48}H_{35}N_3$ = 653.81) | 2-14 | m/z = 820.36($C_{60}H_{44}N_4$ = 821.02) |
| 2-15 | m/z = 651.27($C_{48}H_{33}N_3$ = 651.80) | 2-16 | m/z = 642.21($C_{46}H_{30}N_2S$ = 642.81) |
| 2-17 | m/z = 668.23($C_{48}H_{32}N_2S$ = 668.85) | 2-18 | m/z = 668.23($C_{48}H_{32}N_2S$ = 668.85) |
| 2-19 | m/z = 692.23($C_{50}H_{32}N_2S$ = 692.87) | 2-20 | m/z = 708.26($C_{51}H_{36}N_2S$ = 708.91) |
| 2-21 | m/z = 794.28($C_{58}H_{38}N_2S$ = 795.00) | 2-22 | m/z = 698.19($C_{48}H_{30}N_2S_2$ = 698.90) |
| 2-23 | m/z = 652.25($C_{48}H_{32}N_2O$ = 652.78) | 2-24 | m/z = 778.30($C_{58}H_{38}N_2O$ = 778.94) |
| 2-25 | m/z = 753.28($C_{55}H_{35}N_3O$ = 753.89) | 2-26 | m/z = 666.23($C_{48}H_{30}N_2O_2$ = 666.76) |
| 2-27 | m/z = 682.21($C_{48}H_{30}N_2OS$ = 682.83) | 2-28 | m/z = 682.21($C_{48}H_{30}N_2OS$ = 682.83) |

TABLE 2-continued

| Compound | FD-MS | Compound | FD-MS |
|---|---|---|---|
| 2-29 | m/z = 678.30($C_{51}H_{38}N_2$ = 678.86) | 2-30 | m/z = 702.30($C_{53}H_{38}N_2$ = 702.88) |
| 2-31 | m/z = 692.28($C_{51}H_{36}N_2O$ = 692.84) | 2-32 | m/z = 708.26($C_{51}H_{36}N_2S$ = 708.91) |
| 2-33 | m/z = 794.37($C_{60}H_{46}N_2$ = 795.02) | 2-34 | m/z = 802.33($C_{61}H_{42}N_2$ = 803.00) |
| 2-35 | m/z = 879.36($C_{66}H_{45}N_3$ = 880.08) | 2-36 | m/z = 842.37($C_{64}H_{46}N_2$ = 843.06) |
| 2-37 | m/z = 832.29($C_{61}H_{40}N_2S$ = 833.05) | 2-38 | m/z = 724.29($C_{55}H_{36}N_2$ = 724.89) |
| 2-39 | m/z = 800.32($C_{61}H_{40}N_2$ = 800.98) | 2-40 | m/z = 840.35($C_{64}H_{44}N_2$ = 841.05) |
| 2-41 | m/z = 830.28($C_{61}H_{38}N_2S$ = 831.03) | 2-42 | m/z = 814.30($C_{61}H_{38}N_2O$ = 814.97) |
| 2-43 | m/z = 638.27($C_{48}H_{34}N_2$ = 638.80) | 2-44 | m/z = 803.33($C_{60}H_{41}N_3$ = 803.99) |
| 2-45 | m/z = 638.27($C_{48}H_{34}N_2$ = 638.80) | 2-46 | m/z = 668.23($C_{48}H_{32}N_2S$ = 668.85) |
| 2-47 | m/z = 678.30($C_{51}H_{38}N_2$ = 678.86) | 2-48 | m/z = 835.30($C_{60}H_{41}N_3S$ = 836.05) |
| 2-49 | m/z = 682.21($C_{48}H_{30}N_2OS$ = 682.83) | 2-50 | m/z = 668.23($C_{48}H_{32}N_2S$ = 668.85) |
| 2-51 | m/z = 612.26($C_{46}H_{32}N_2$ = 612.76) | 2-52 | m/z = 638.27($C_{48}H_{34}N_2$ = 638.80) |
| 2-53 | m/z = 782.24($C_{56}H_{34}N_2OS$ = 782.95) | 2-54 | m/z = 790.33($C_{60}H_{42}N_2$ = 790.99) |
| 2-55 | m/z = 805.31($C_{59}H_{39}N_3O$ = 805.96) | 2-56 | m/z = 664.29($C_{50}H_{36}N_2$ = 664.83) |
| 2-57 | m/z = 803.33($C_{60}H_{41}N_3$ = 803.99) | 2-58 | m/z = 768.26($C_{56}H_{36}N_2S$ = 768.96) |
| 2-59 | m/z = 650.27($C_{49}H_{34}N_2$ = 650.81) | 2-60 | m/z = 688.29($C_{52}H_{36}N_2$ = 688.86) |
| 2-61 | m/z = 744.26($C_{54}H_{36}N_2S$ = 744.94) | 2-62 | m/z = 667.21($C_{47}H_{29}N_3S$ = 667.82) |
| 2-63 | m/z = 642.21($C_{46}H_{30}N_2S$ = 642.81) | 2-64 | m/z = 566.18($C_{40}H_{26}N_2S$ = 566.71) |
| 2-65 | m/z = 699.18($C_{47}H_{29}N_3S_2$ = 699.88) | 2-66 | m/z = 682.21($C_{48}H_{30}N_2OS$ = 682.83) |
| 2-67 | m/z = 742.24($C_{54}H_{34}N_2S$ = 742.93) | 2-68 | m/z = 652.25($C_{48}H_{32}N_2O$ = 652.78) |
| 2-69 | m/z = 652.25($C_{48}H_{32}N_2O$ = 652.78) | 2-70 | m/z = 678.30($C_{51}H_{38}N_2$ = 678.86) |
| 2-71 | m/z = 657.32($C_{49}H_{31}D_5N_2$ = 657.85) | 2-72 | m/z = 576.26($C_{43}H_{32}N_2$ = 576.73) |
| 2-73 | m/z = 642.30($C_{48}H_{38}N_2$ = 642.83) | 2-74 | m/z = 766.33($C_{58}H_{42}N_2$ = 766.97) |
| 2-75 | m/z = 767.33($C_{57}H_{41}N_3$ = 767.96) | 2-76 | m/z = 708.26($C_{51}H_{36}N_2S$ = 708.91) |
| 2-77 | m/z = 692.28($C_{51}H_{36}N_2O$ = 692.84) | 2-78 | m/z = 706.26($C_{51}H_{34}N_2O_2$ = 706.83) |
| 2-79 | m/z = 722.24($C_{51}H_{34}N_2OS$ = 722.89) | 2-80 | m/z = 666.27($C_{49}H_{34}N_2O$ = 666.81) |
| 2-81 | m/z = 603.27($C_{44}H_{33}N_3$ = 603.75) | 2-82 | m/z = 778.33($C_{59}H_{42}N_2$ = 778.98) |
| 2-83 | m/z = 755.33($C_{56}H_{41}N_3$ = 755.94) | 2-84 | m/z = 802.33($C_{61}H_{42}N_2$ = 803.00) |
| 2-85 | m/z = 778.31($C_{57}H_{38}N_4$ = 778.94) | 2-86 | m/z = 890.37($C_{68}H_{46}N_2$ = 891.11) |
| 2-87 | m/z = 756.26($C_{55}H_{36}N_2S$ = 756.95) | 2-88 | m/z = 846.27($C_{61}H_{38}N_2OS$ = 847.03) |
| 2-89 | m/z = 776.32($C_{59}H_{40}N_2$ = 776.96) | 2-90 | m/z = 648.26($C_{49}H_{32}N_2$ = 648.79) |
| 2-91 | m/z = 800.32($C_{61}H_{40}N_2$ = 800.98) | 2-92 | m/z = 830.28($C_{61}H_{38}N_2S$ = 831.03) |
| 2-93 | m/z = 864.31($C_{65}H_{40}N_2O$ = 865.03) | 2-94 | m/z = 840.35($C_{64}H_{44}N_2$ = 841.05) |
| 2-95 | m/z = 936.35($C_{72}H_{44}N_2$ = 937.13) | 2-96 | m/z = 844.25($C_{61}H_{36}N_2OS$ = 845.02) |
| 2-97 | m/z = 927.36($C_{70}H_{45}N_3$ = 928.13) | 2-98 | m/z = 612.26($C_{46}H_{32}N_2$ = 612.78) |
| 2-99 | m/z = 728.32($C_{55}H_{40}N_2$ = 728.94) | 2-100 | m/z = 826.33($C_{63}H_{42}N_2$ = 827.02) |
| 2-101 | m/z = 702.27($C_{52}H_{34}N_2O$ = 702.84) | 2-102 | m/z = 688.29($C_{52}H_{36}N_2$ = 688.86) |
| 2-103 | m/z = 728.32($C_{55}H_{40}N_2$ = 728.92) | 2-104 | m/z = 884.29($C_{64}H_{40}N_2OS$ = 885.08) |
| 2-105 | m/z = 586.24($C_{44}H_{30}N_2$ = 586.72) | 2-106 | m/z = 718.24($C_{52}H_{34}N_2S$ = 718.90) |
| 2-107 | m/z = 732.22($C_{52}H_{32}N_2OS$ = 732.89) | 2-108 | m/z = 702.30($C_{53}H_{38}N_2$ = 702.88) |
| 2-109 | m/z = 688.29($C_{52}H_{36}N_2$ = 688.86) | 2-110 | m/z = 702.27($C_{52}H_{34}N_2O$ = 702.84) |
| 2-111 | m/z = 692.23($C_{50}H_{32}N_2S$ = 692.87) | 2-112 | m/z = 782.24($C_{56}H_{34}N_2OS$ = 782.95) |
| 2-113 | m/z = 738.30($C_{56}H_{38}N_2$ = 738.91) | 2-114 | m/z = 768.26($C_{56}H_{36}N_2S$ = 768.96) |
| 2-115 | m/z = 716.32($C_{54}H_{40}N_2$ = 716.91) | 2-116 | m/z = 857.29($C_{62}H_{39}N_3S$ = 858.06) |
| 2-117 | m/z = 738.30($C_{56}H_{38}N_2$ = 738.91) | 2-118 | m/z = 753.28($C_{55}H_{35}N_3O$ = 753.89) |
| 2-119 | m/z = 677.28($C_{50}H_{35}N_3$ = 677.83) | 2-120 | m/z = 879.32($C_{65}H_{41}N_3O$ = 880.04) |
| 2-121 | m/z = 612.26($C_{46}H_{32}N_2$ = 612.76) | 2-122 | m/z = 756.31($C_{56}H_{40}N_2O$ = 756.93) |
| 2-123 | m/z = 727.30($C_{54}H_{37}N_3$ = 727.89) | 2-124 | m/z = 866.37($C_{66}H_{46}N_2$ = 867.08) |
| 2-125 | m/z = 484.19($C_{36}H_{24}N_2$ = 484.6) | 2-126 | m/z = 484.19($C_{36}H_{24}N_2$ = 484.6) |
| 2-127 | m/z = 584.23($C_{44}H_{28}N_2$ = 584.72) | 2-128 | m/z = 776.32($C_{59}H_{40}N_2$ = 776.98) |

Hereinafter, a method for measuring a HOMO/LUMO energy level using a compound prepared according to the above synthesis example will be described in detail by way of examples, but the present invention is not limited to the following Examples.

Test Examples of Energy Level Measurement

1. Energy Level Measurement of Compound 2-43
(1) HOMO Energy Level Measurement of Compound 2-43
0.1 M TBAP electrolyte in ACN (acetonitrile) was prepared, and 2.5 mg of compound 2-43 was dissolved in 1 ml of chloroform as a solvent to prepare a measurement sample. Here, $Alq_3$ was used as the reference sample. The intrinsic HOMO energy level of $Alq_3$ is −5.8 eV.

Thereafter, cyclic voltammetry is measured for the reference sample $Alq_3$ and compound 2-43, and the HOMO energy level of each compound is obtained from the CV-graph for each.

Figure 4:
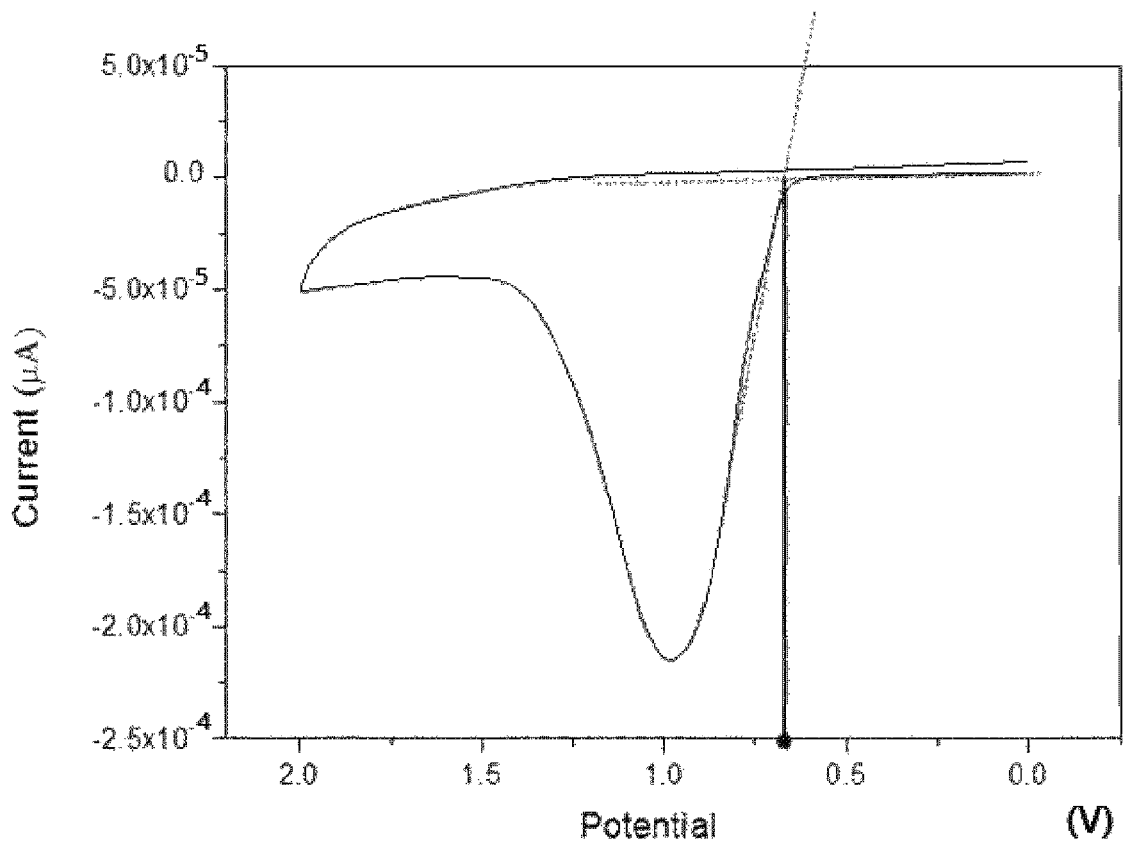
FIG. 4 is a CV-graph of a reference sample ($Alq_3$).
Figure 5:
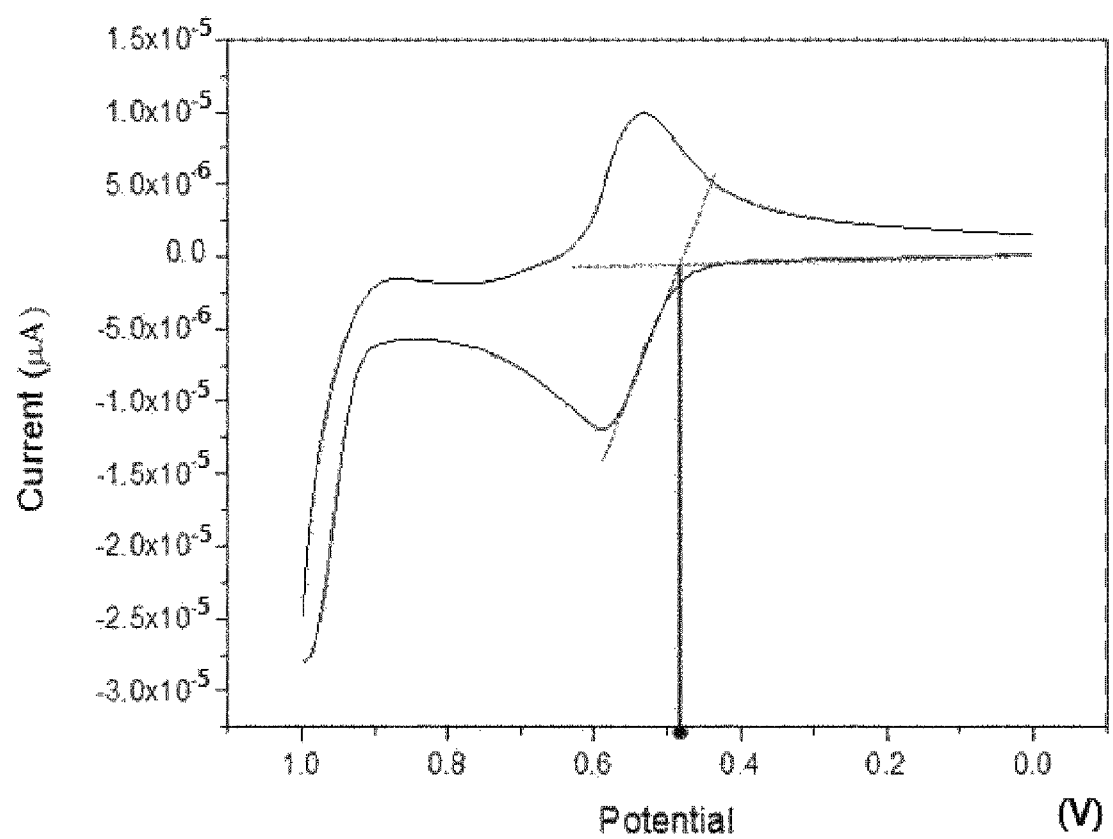
FIG. 5 is a CV-graph of compound 2-43 of the present invention.

FIG. 4 is a CV-graph for $Alq_3$, and FIG. 5 is a CV-graph for compound 2-43.

Referring to these figures, after obtaining the HOMO energy level of each compound according to the previously described method, a correction value is calculated, and the HOMO energy level of compound 2-43 is finally obtained by applying a conversion equation.

Referring to FIG. 4, the HOMO energy level in the CV-graph of $Alq_3$ is 0.70706 eV, and referring to FIG. 5, the HOMO energy level in the CV-graph of compound 2-43 is 0.54706 eV.

Therefore, the correction value is 0.16 eV, and the compound 2-43 HOMO energy level is −5.64 eV.

Correction value=(HOMO energy level in CV-graph of $Alq_3$)−(HOMO energy level in CV-graph of compound 2-43)=0.70706−0.54706 (eV)=0.16 eV HOMO energy level of Compound 2-43=intrinsic HOMO energy level of $Alq_3$+correction value=−5.8 (eV)+0.16 (eV)=−5.64 eV (2) Band Gap Measurement of Compound 2-43
After preparing a sample by adding 10 ml of THF to 1 ml of a solution prepared by dissolving 2.5 mg of compound 2-43 in 10 ml of THF, absorbance according to wavelength is measured. When measuring the absorption spectrum, lambda 35 (manufactured by Perkin Elmer) was used as a spectrophotometer.

Figure 6:
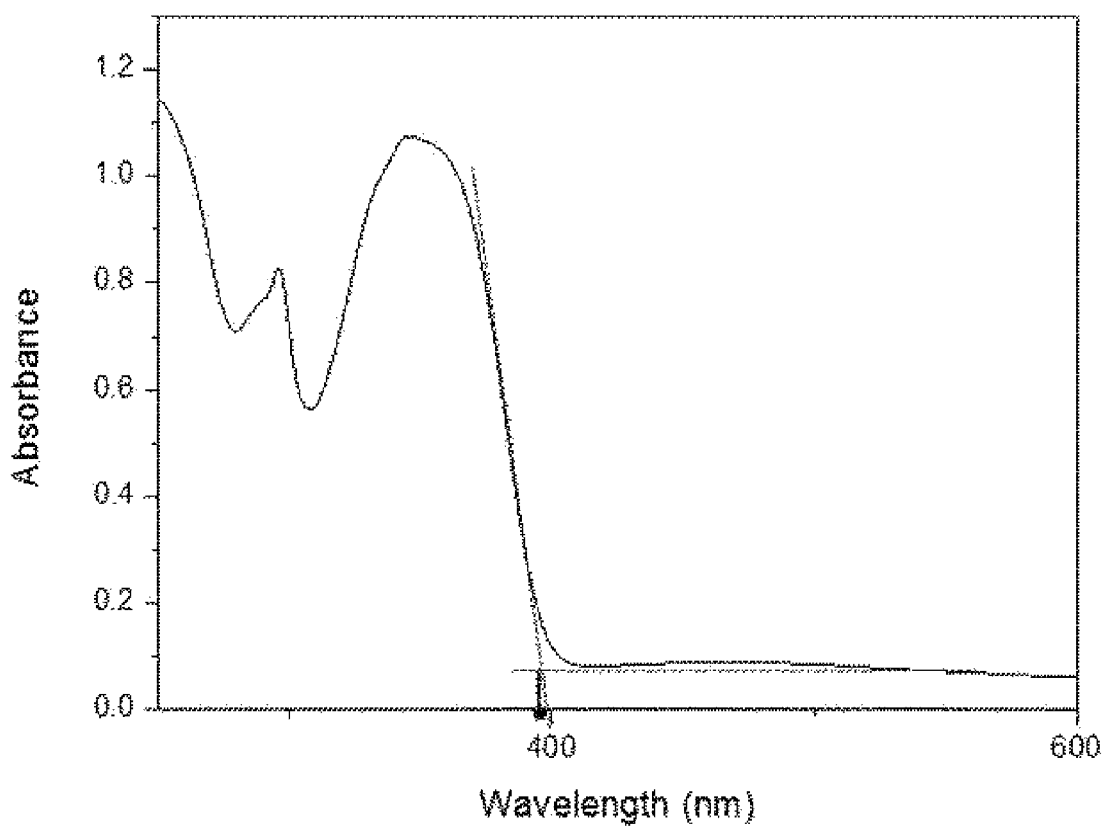
FIG. 6 is an absorption spectrum graph showing the absorbance according to the wavelength of compound 2-43 of the present invention.

FIG. 6 is a graph showing an absorption spectrum for compound 2-43.

It can be seen that the wavelength value required for calculating the energy band gap is about 383 nm, wherein the wavelength value is obtained according to the method already described with reference to FIG. 6.

Therefore, it can be seen that the energy bandgap (Eg) for compound 2-43 is 3.23 eV by applying the conversion formula.

$$Eg=[1240/383](eV)=3.23\ eV$$

(3) Calculation of LUMO Energy Level of Compound 2-43

It can be seen that the LUMO energy level of compound 2-43 is −2.41 eV when it is calculated using the HOMO energy level and the band gap of compound 2-43 measured above.

$$LUMO\ energy\ level=-5.64+3.23\ (eV)=-2.41\ eV$$

Table 3 below shows the HOMO/LUMO energy levels for the compounds of the present invention measured according to the same energy level measurement method as described above.

TABLE 3

| Compound | HOMO Energy Level | LUMO Energy Level |
|---|---|---|
| | | (Unit: eV) |
| 1-3 | −5.69 | −2.34 |
| 2-8 | −5.69 | −2.45 |
| 2-43 | −5.64 | −2.41 |
| 2-29 | −5.56 | −2.47 |
| 2-98 | −5.66 | −2.51 |
| 2-99 | −5.57 | −2.50 |
| 2-103 | −5.56 | −2.51 |
| 2-125 | −5.90 | −2.39 |
| 2-128 | −5.62 | −2.51 |

Hereinafter, examples will be given for the manufacture and evaluation of an organic electric element employing the compound of the present invention, but the present invention is not limited to the following examples.

Manufacturing and Evaluation of a Blue Organic Electric Element

[Test Example 1] Blue Organic Electric Element (Light-Emitting Auxiliary Layer)

A hole injection layer having a thickness of 60 nm was formed by vacuum-deposition of 4,4',4"-tris[2-naphthyl(phenyl)amino]triphenylamine (hereinafter, abbreviated as 2-TNATA) on an ITO layer (anode) that was formed on the glass substrate. Thereafter, N,N'-bis(1-naphthalenyl)-N,N'-bis-phenyl-(1,1'-biphenyl)-4,4'-diamine (hereinafter, abbreviated as NPB) was vacuum-deposited to a thickness of 60 nm to form a hole transport layer on the hole injection layer.

Next, light-emitting auxiliary layers comprising a first light-emitting auxiliary layer and a second light-emitting auxiliary layer were formed on the hole transport layer, wherein the first light-emitting auxiliary layer is formed by vacuum-depositing the compound 1-3 of the present invention to a thickness of 5 nm and the second light-emitting auxiliary layer is formed by vacuum-depositing the compound 2-8 of the present invention to a thickness of 5 nm. Here, it is preferable to first deposit a material having a high HOMO energy level among the first light-emitting auxiliary layer and the second light-emitting auxiliary layer.

Thereafter, a light emitting layer having a thickness of 30 nm was formed on the light-emitting auxiliary layer. Here, 9,10-di(naphthalen-2-yl)anthracene was used as a host, and BD-052X (manufactured by Idemitsu Kosan) was used as a dopant, and the dopant was doped so that the weight ratio thereof was 96:4.

Next, (1,1'-biphenyl-4-olato)bis(2-methyl-8-quinolinolato)aluminum (hereinafter, abbreviated as BAlq) was vacuum-deposited to a thickness of 10 nm on the light emitting layer to form a hole blocking layer and bis(10-hydroxybenzo[h]quinolinato)beryllium (hereinafter, abbreviated as BeBq$_2$) was vacuum-deposited to a thickness of 40 nm on the hole blocking layer to form an electron transport layer.

Thereafter, LiF was deposited to a thickness of 0.2 nm and then Al was deposited to a thickness of 150 nm.

[Test Example 2] to [Test Example 6]

An organic electroluminescent element was manufactured in the same manner as in Example 1, except that the compound shown in Table 4 was used instead of Compound 2-8 as material of the second light-emitting auxiliary layer.

[Test Example 7] to [Test Example 12]

An organic electroluminescent element was manufactured in the same manner as in Example 1, except that the Compound 2-43 was used instead of Compound 1-3 as the first light-emitting auxiliary layer material and the compounds shown in Table 4 were used as the second light-emitting auxiliary layer material.

[Test Example 13] to [Test Example 18]

An organic electroluminescent element was manufactured in the same manner as in Example 1, except that the Compound 2-125 was used instead of Compound 1-3 as the first light-emitting auxiliary layer material and the compounds shown in Table 4 were used as the second light-emitting auxiliary layer material.

Comparative Example 1

An organic electroluminescent element was manufactured in the same manner as in Example 1, except that neither the first light-emitting auxiliary layer nor the second light-emitting auxiliary layer were formed.

[Comparative Example 2] to [Comparative Example 10]

An organic electroluminescent element was manufactured in the same manner as in Example 1, except that the light-emitting auxiliary layer was formed as a single layer using the compounds shown in Table 4 below. Although the compounds of the first light-emitting auxiliary layer are specified in Table 4 below, the LUMO energy level of these compounds may be higher or lower than that of the hole transport layer. That is, the compounds used in the light-emitting auxiliary layer of the comparative examples are only specified and it is not limited to the case of having the same physical properties as the first light-emitting auxiliary layer of the present invention in relation to the neighboring organic material layer.

A forward bias DC voltage was applied to the organic electric elements manufactured in Test Examples 1 to 18 and Comparative Examples 1 to 10 and electroluminescence (EL) characteristics were measured with a PR-650 manufactured by photoresearch and lifetime(T95) was measured with a lifetime measuring device manufactured by Mc Science at 500 cd/m$^2$ standard luminance. The measurement results are shown in Table 4 below.

TABLE 4

| Compound | | Voltage | Current Density | Brightness | Efficiency | Lifetime | CIE | |
|---|---|---|---|---|---|---|---|---|
| EAL 1 | EAL 2 | (V) | (mA/cm$^2$) | (cd/m$^2$) | (cd/A) | T(95) | X | Y |
| comp. Ex(1) | — | — | 5.8 | 14.7 | 500 | 3.4 | 52.7 | 0.131 | 0.100 |
| comp. Ex(2) | 1-3 | — | 5.3 | 9.8 | 500 | 5.1 | 88.5 | 0.132 | 0.100 |
| comp. Ex(3) | 2-8 | — | 5.5 | 12.8 | 500 | 3.9 | 69.7 | 0.131 | 0.100 |
| comp. Ex(4) | 2-29 | — | 5.5 | 11.9 | 500 | 4.2 | 70.6 | 0.131 | 0.100 |
| comp. Ex(5) | 2-43 | — | 5.5 | 12.2 | 500 | 4.1 | 72.3 | 0.131 | 0.100 |
| comp. Ex(6) | 2-98 | — | 5.3 | 10.2 | 500 | 4.9 | 79.4 | 0.131 | 0.100 |
| comp. Ex(7) | 2-99 | — | 5.4 | 10.6 | 500 | 4.7 | 74.2 | 0.132 | 0.100 |
| comp. Ex(8) | 2-103 | — | 5.3 | 9.6 | 500 | 5.2 | 84.0 | 0.131 | 0.100 |
| comp. Ex(9) | 2-125 | — | 5.4 | 11.4 | 500 | 4.4 | 77.8 | 0.131 | 0.100 |
| comp. Ex(10) | 2-128 | — | 5.3 | 10.4 | 500 | 4.8 | 86.3 | 0.130 | 0.100 |
| Test Ex. (1) | 1-3 | 2-8 | 4.7 | 7.1 | 500 | 7.0 | 109.1 | 0.132 | 0.100 |
| Test Ex. (2) | | 2-29 | 4.7 | 6.9 | 500 | 7.2 | 109.5 | 0.130 | 0.100 |
| Test Ex. (3) | | 2-98 | 4.6 | 6.6 | 500 | 7.6 | 111.8 | 0.132 | 0.100 |
| Test Ex. (4) | | 2-99 | 4.7 | 6.8 | 500 | 7.3 | 109.7 | 0.130 | 0.100 |
| Test Ex. (5) | | 2-103 | 4.6 | 6.6 | 500 | 7.6 | 111.3 | 0.130 | 0.100 |
| Test Ex. (6) | | 2-128 | 4.6 | 6.8 | 500 | 7.4 | 110.9 | 0.130 | 0.100 |
| Test Ex. (7) | 2-43 | 2-8 | 4.9 | 7.9 | 500 | 6.3 | 105.7 | 0.131 | 0.100 |
| Test Ex. (8) | | 2-29 | 4.9 | 7.9 | 500 | 6.3 | 106.0 | 0.132 | 0.100 |
| Test Ex. (9) | | 2-98 | 4.8 | 7.2 | 500 | 6.9 | 108.6 | 0.131 | 0.100 |
| Test Ex. (10) | | 2-99 | 4.9 | 7.8 | 500 | 6.4 | 106.4 | 0.130 | 0.100 |
| Test Ex. (11) | | 2-103 | 4.8 | 7.2 | 500 | 6.9 | 107.9 | 0.131 | 0.100 |
| Test Ex. (12) | | 2-128 | 4.8 | 7.6 | 500 | 6.6 | 108.8 | 0.131 | 0.100 |
| Test Ex. (13) | 2-125 | 2-8 | 5.1 | 8.9 | 500 | 5.6 | 102.5 | 0.131 | 0.100 |
| Test Ex. (14) | | 2-29 | 5.1 | 8.6 | 500 | 5.8 | 102.9 | 0.132 | 0.100 |
| Test Ex. (15) | | 2-98 | 5.0 | 8.2 | 500 | 6.1 | 105.1 | 0.130 | 0.100 |
| Test Ex. (16) | | 2-99 | 5.1 | 8.5 | 500 | 5.9 | 103.6 | 0.131 | 0.100 |
| Test Ex. (17) | | 2-103 | 5.0 | 8.2 | 500 | 6.1 | 104.2 | 0.130 | 0.100 |
| Test Ex. (18) | | 2-128 | 5.0 | 8.1 | 500 | 6.2 | 104.7 | 0.130 | 0.100 |

From Table 4, it can be confirmed that the driving voltage can be lowered and the efficiency and lifespan can be significantly improved when the blue organic electric element is manufactured according to the embodiment of the present invention compared to the Comparative Examples.

Comparative Example 1 corresponds to a case in which a light-emitting auxiliary layer is not formed, and each of Comparative Examples 2 to 10 corresponds to a case in which a single light-emitting auxiliary layer is formed. Accordingly, it can be seen that it is excellent in all aspects of driving voltage, efficiency and lifespan when at least two light-emitting auxiliary layers are formed as in the present invention.

Comparative Examples 2, 4 and 9 correspond to a case in which the LUMO energy level of the light-emitting auxiliary layer is higher than that of the neighboring hole transport layer. However, it is difficult to see that the characteristics of the element are necessarily improved as compared to a typical organic electric element having a LUMO energy level lower than that of a neighboring hole transport layer.

Therefore, it is difficult to see that device characteristics are improved in the case of a single layer even if the light-emitting auxiliary layer having a higher LUMO energy level than the hole transport layer is formed, and it can be seen that the driving voltage, efficiency, lifespan, etc. of the organic electric element are all improved only when at least two or more light-emitting auxiliary layers are formed as in the present invention.

That is, it can be seen that the characteristics of the organic electric element are remarkably improved when a plurality of light-emitting auxiliary layers are formed, the LUMO energy level of the first light-emitting auxiliary layer is higher than that of the hole transport layer, and the HOMO energy level of each light-emitting auxiliary layer is lower than that of the hole transport layer and higher than the light-emitting auxiliary layer as in Examples 1 to 18 of the present invention.

Like this, the reason why the characteristics of the organic electric element are improved according to the present invention as described above seems to be because a first light-emitting auxiliary layer and a second light-emitting auxiliary layer are formed by selectively using compounds having a HOMO/LUMO energy level correlation according to the conditions defined in the present invention, as a result, injection of electrons and holes into the light emitting layer and their charge balance are improved. That is, it seems that when two or more light-emitting auxiliary layers having different energy levels are formed, charge balance in the light-emitting layer is improved, thereby improving the electrical characteristics of the element.

More specifically, in a blue organic light emitting element, the driving voltage, efficiency, and lifespan of the element are improved by forming auxiliary layers for preventing electron leakage due to relatively fast electron movement from occurring.

These results suggest that the correlation between the energy levels (HOMO, LUMO) of the compounds forming each layer of the organic material layer can act as a major factor on the performance of element.

Although the exemplary embodiments of the present invention have been described for illustrative purposes, those skilled in the art to which the present invention pertains will be capable of various modifications without departing from the essential characteristics of the present invention. Therefore, the embodiment disclosed herein is intended to illustrate the scope of the technical idea of the present invention, and the spirit and scope of the present invention are not limited by the embodiments. The scope of the present invention shall be construed on the basis of the accompanying claims, and it shall be construed that all of the technical ideas included within the scope equivalent to the claims belong to the present invention.

What is claimed is:

1. A blue organic electric element, comprising:
   an anode;
   a cathode; and
   an organic material layer formed between the anode and the cathode, the organic material layer comprising:
   a light emitting layer;
   a hole transport layer formed between the light emitting layer and the anode;
   an electron transport layer formed between the light emitting layer and the cathode; and
   at least two light-emitting auxiliary layers formed between the light emitting layer and the hole transport layer, the at least two light-emitting auxiliary layers comprising a first light-emitting auxiliary layer and a second light-emitting auxiliary layer,
   wherein a lowest unoccupied molecular orbital (LUMO) energy level of the first light-emitting auxiliary layer is higher than the LUMO energy level of the hole transport layer; and
   a highest occupied molecular orbital (HOMO) energy level of each of the first and second light-emitting auxiliary layers is lower than the HOMO energy level of the hole transport layer and higher than the HOMO energy level of the light emitting layer.

2. The blue organic electric element of claim 1, wherein the first light-emitting auxiliary layer is formed adjacent to the light-emitting layer, and the second light-emitting auxiliary layer is formed between the hole transport layer and the first light-emitting auxiliary layer.

3. The blue organic electric element of claim 1, wherein the first light-emitting auxiliary layer is formed adjacent to the hole transport layer, and the second light-emitting auxiliary layer is formed between the light-emitting layer and the first light-emitting auxiliary layer.

4. The blue organic electric element of claim 1, wherein the LUMO energy level of the first light-emitting auxiliary layer is higher than the LUMO energy level of the hole transport layer by 0.03 eV or more.

5. The blue organic electric element of claim 1, wherein the absolute value of the LUMO energy level of the first light-emitting auxiliary layer is 2.30 to 2.44 eV.

6. The blue organic electric element of claim 1, wherein the difference in HOMO energy level between the hole transport layer and a light-emitting auxiliary layer adjacent to the hole transport layer among the first light-emitting auxiliary layer and the second light-emitting auxiliary layer is 0.07 eV or more, and the difference in HOMO energy level between the light-emitting auxiliary layer adjacent to the light-emitting layer and the light-emitting auxiliary layer adjacent to the hole transport layer among the first light-emitting auxiliary layer and the second light-emitting auxiliary layer is 0 eV or more.

7. The blue organic electric element of claim 1, wherein the difference in HOMO energy level between the first light-emitting auxiliary layer and the second light-emitting auxiliary layer is 0.35 eV or less.

8. The blue organic electric element of claim 1, wherein the absolute value of the HOMO energy level of a light-emitting auxiliary layer adjacent to the hole transport layer among the first light-emitting auxiliary layer and the second light-emitting auxiliary layer is 5.55 to 5.69 eV.

9. The blue organic electric element of claim 1, wherein the absolute value of the HOMO energy level of a light-emitting auxiliary layer adjacent to the light-emitting layer among the first light-emitting auxiliary layer and the second light-emitting auxiliary layer is 5.64 to 6.00 eV.

10. The blue organic electric element of claim 1, wherein the at least two light-emitting auxiliary layers include a compound represented by the following formula 1:

<Formula 1>

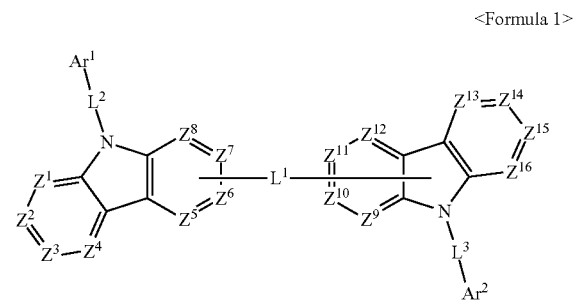

wherein, $Z^1$ to $Z^4$, $Z^{13}$ to $Z^{16}$ are each independently C(R') or N, $Z^5$ to $Z^8$, $Z^9$ to $Z^{12}$ are each independently C, C(R') or N, R' is selected from the group consisting of hydrogen, deuterium, halogen, a cyano group, a nitro group, a $C_6$-$C_{60}$ aryl group, a fluorenyl group, a $C_2$-$C_{60}$ heterocyclic group comprising at least one heteroatom selected from the group consisting of O, N, S, Si and P, a $C_3$-$C_{60}$ aliphatic ring, a $C_1$-$C_{30}$ alkyl group, a $C_2$-$C_{30}$ alkenyl group, a $C_2$-$C_{30}$ alkynyl group, a $C_1$-$C_{30}$ alkoxyl group, a $C_6$-$C_{30}$ aryloxy group and -L'-N($R_a$)($R_b$), and adjacent groups may be bonded to each other to form a ring, $L^1$ to $L^3$ are each independently selected from the group consisting of a single bond, a $C_6$-$C_{60}$ arylene group, a fluorenylene group, a $C_3$-$C_{60}$ aliphatic ring, a $C_2$-$C_{60}$ heterocyclic group comprising at least one heteroatom selected from the group consisting of O, N, S, Si and P, and a combination thereof, $Ar^1$ and $Ar^2$ are each independently selected from the group consisting of a $C_6$-$C_{60}$ aryl group, a fluorenyl group, a $C_2$-$C_{60}$ heterocyclic group comprising at least one heteroatom selected from the group consisting of O, N, S, Si and P, and a $C_3$-$C_{60}$ aliphatic ring, L' is selected from the group consisting of a single bond, a $C_6$-$C_{60}$ arylene group, a fluorenylene group, a $C_3$-$C_{60}$ aliphatic ring, and a $C_2$-$C_{60}$ heterocyclic group comprising at least one heteroatom selected from the group consisting of O, N, S, Si and P, $R_a$ and $R_b$ are each independently selected from the group consisting of a $C_6$-$C_{60}$ aryl group, a fluorenyl group, a $C_3$-$C_{60}$ aliphatic ring, and a $C_2$-$C_{60}$ heterocyclic group comprising at least one heteroatom selected from the group consisting of O, N, S, Si and P, and R', $L^1$ to $L^3$, $Ar^1$, $Ar^2$ and the ring formed by adjacent groups may be each optionally substituted with one or more substituents selected from the group consisting of deuterium, halogen, a silane group unsubstituted or substituted with a $C_1$-$C_{20}$ alkyl group or a $C_6$-$C_{20}$ aryl group, a siloxane group, a cyano group, a nitro group, a $C_1$-$C_{20}$ alkylthio group, a $C_1$-$C_{20}$ alkoxy group, a $C_6$-$C_{20}$ aryloxy group, a $C_6$-$C_{20}$ arylthio, a $C_1$-$C_{20}$ alkyl group, a $C_2$-$C_{20}$ alkenyl group, a $C_2$-$C_{20}$ alkynyl group, a $C_6$-$C_{20}$ aryl group, a fluorenyl group, a $C_2$-$C_{20}$ heterocyclic group containing at least one heteroatom of O, N, S, Si, and P, a $C_3$-$C_{20}$ aliphatic ring group, a $C_7$-$C_{20}$ arylalkyl group and $C_8$-$C_{20}$ arylalkenyl.

11. The blue organic electric element of claim 1, wherein the at least two light-emitting auxiliary layers include a compound represented by the following formula 2:

<Formula 2>

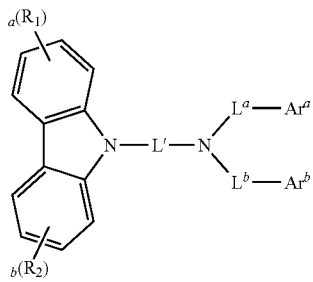

wherein, $R_1$ and $R_2$ are each independently elected from the group consisting of hydrogen, deuterium, halogen, a cyano group, a nitro group, a $C_6$-$C_{60}$ aryl group, a fluorenyl group, a $C_2$-$C_{60}$ heterocyclic group comprising at least one heteroatom selected from the group consisting of O, N, S, Si and P, a $C_3$-$C_{60}$ aliphatic ring, a $C_1$-$C_{30}$ alkyl group, a $C_2$-$C_{30}$ alkenyl group, a $C_2$-$C_{30}$ alkynyl group, a $C_1$-$C_{30}$ alkoxyl group, a $C_6$-$C_{30}$ aryloxy group and -L'-N($R_a$) ($R_b$), and adjacent groups may be bonded to each other to form a ring, a and b are each an integer of 0 to 4, and when each of these is an integer of 2 or more, $R_1$s are each the same as or different from each other and Res are each the same as or different from each other, L', $L^a$ and $L^b$ are each independently selected from the group consisting of a single bond, a $C_6$-$C_{60}$ arylene group, a fluorenylene group, a $C_3$-$C_{60}$ aliphatic ring and a $C_2$-$C_{60}$ heterocyclic group comprising at least one heteroatom selected from the group consisting of O, N, S, Si and P, $Ar^a$ and $Ar^b$ are each independently selected from the group consisting of a $C_6$-$C_{60}$ aryl group, a fluorenyl group, a $C_2$-$C_{60}$ heterocyclic group comprising at least one heteroatom selected from the group consisting of O, N, S, Si and P, and a $C_3$-$C_{60}$ aliphatic ring, L is selected from the group consisting of a single bond, a $C_6$-$C_{60}$ arylene group, a fluorenylene group, a $C_3$-$C_{60}$ aliphatic ring and a $C_2$-$C_{60}$ heterocyclic group comprising at least one heteroatom selected from the group consisting of O, N, S, Si and P, $R_a$ and $R_b$ are each independently selected from the group consisting of a $C_6$-$C_{60}$ aryl group, a fluorenyl group, a $C_3$-$C_{60}$ aliphatic ring, and a $C_2$-$C_{60}$ heterocyclic group comprising at least one heteroatom selected from the group consisting of O, N, S, Si and P, and $R_1$, $R_2$, L', $L^a$, $L^b$, $Ar^a$, $Ar^b$ and the ring formed by adjacent groups may be each optionally substituted with one or more substituents selected from the group consisting of deuterium, halogen, a silane group unsubstituted or substituted with a $C_1$-$C_{20}$ alkyl group or a $C_6$-$C_{20}$ aryl group, a siloxane group, a cyano group, a nitro group, a $C_1$-$C_{20}$ alkylthio group, a $C_1$-$C_{20}$ alkoxy group, a $C_6$-$C_{20}$ aryloxy group, a $C_6$-$C_{20}$ arylthio, a $C_1$-$C_{20}$ alkyl group, a $C_2$-$C_{20}$ alkenyl group, a $C_2$-$C_{20}$ alkynyl group, a $C_6$-$C_{20}$ aryl group, a fluorenyl group, a $C_2$-$C_{20}$ heterocyclic group containing at least one heteroatom of O, N, S, Si, and P, a $C_3$-$C_{20}$ aliphatic ring group, a $C_7$-$C_{20}$ arylalkyl group and $C_8$-$C_{20}$ arylalkenyl.

12. The blue organic electric element of claim 10, wherein the compound represented by Formula 1 is one of the following compounds:

1-1

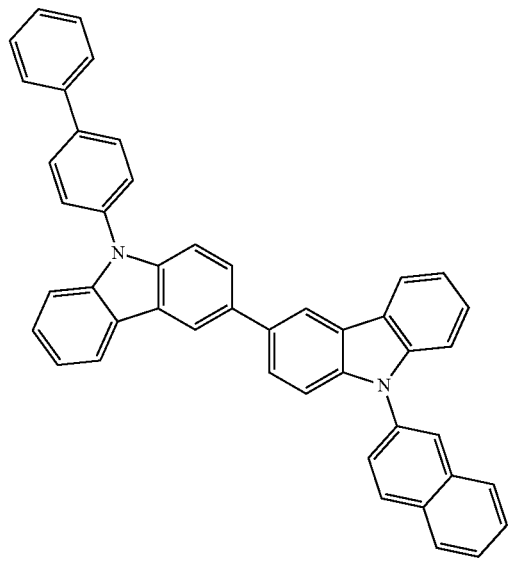

1-2

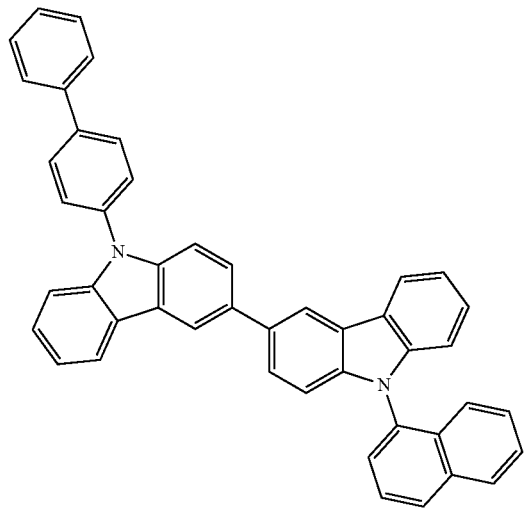

1-3
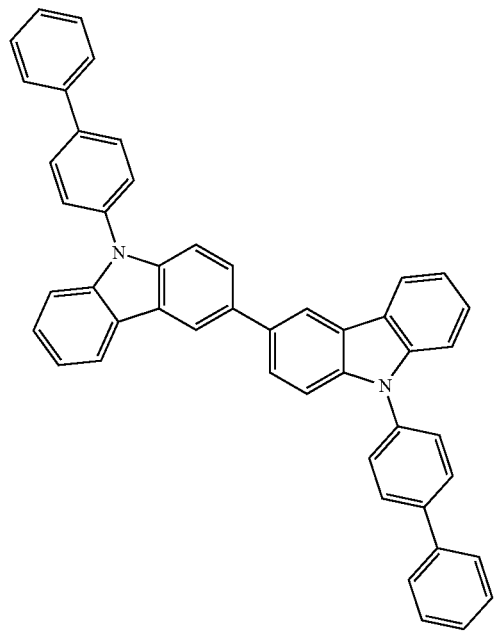
1-5
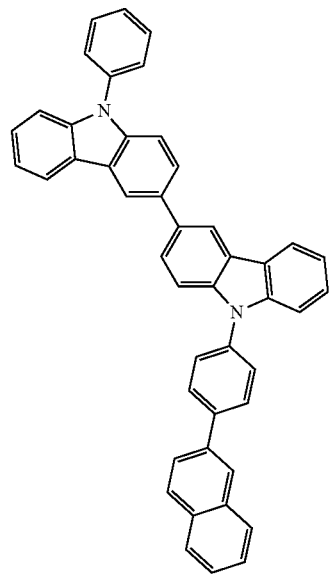
1-4
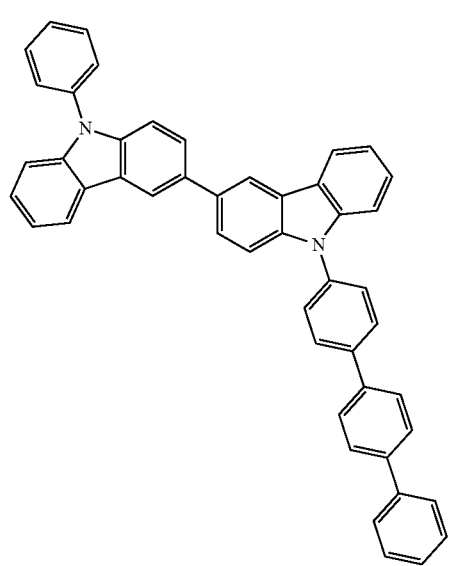
1-6
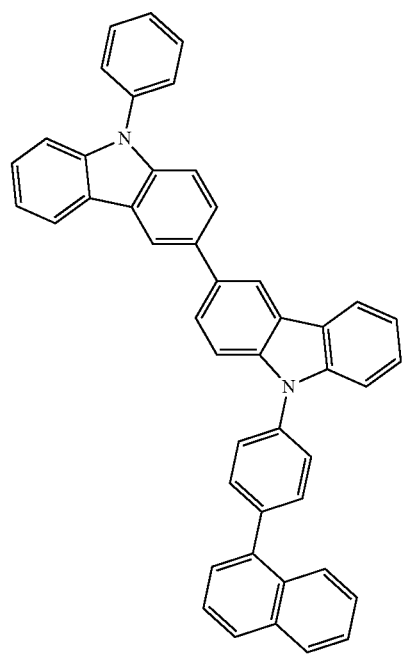

1-7
1-8
1-9
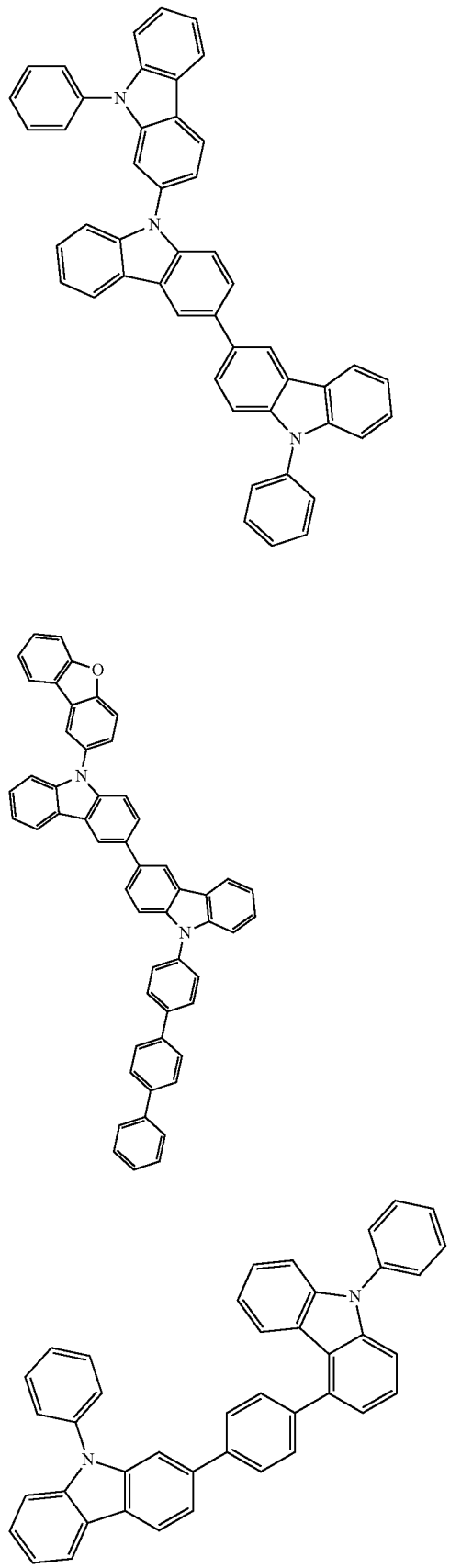
1-10
1-11
1-12
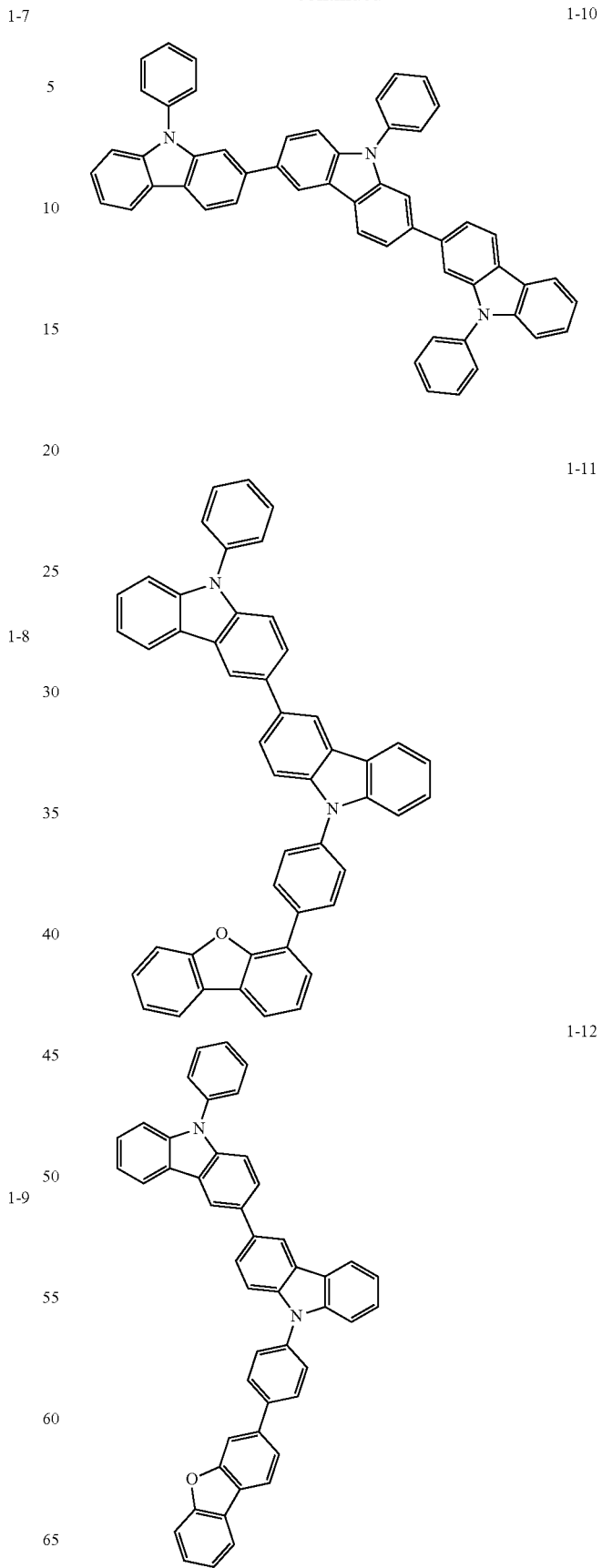

1-13
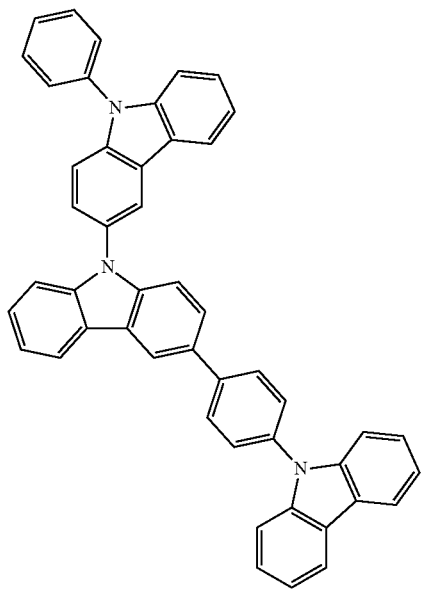
1-14
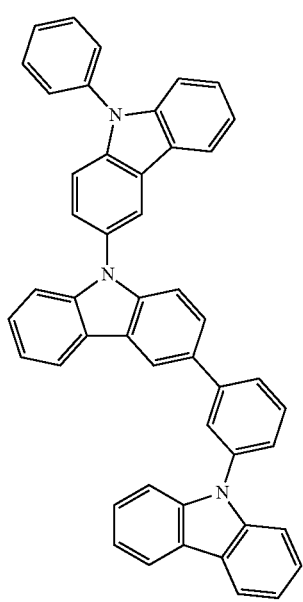
1-15
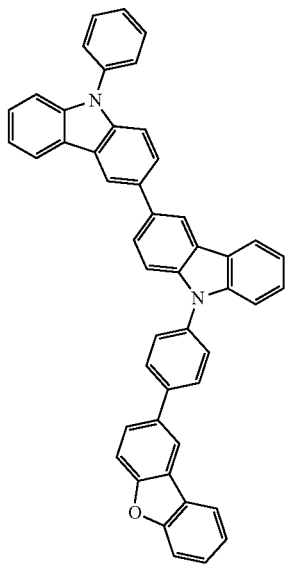
1-16
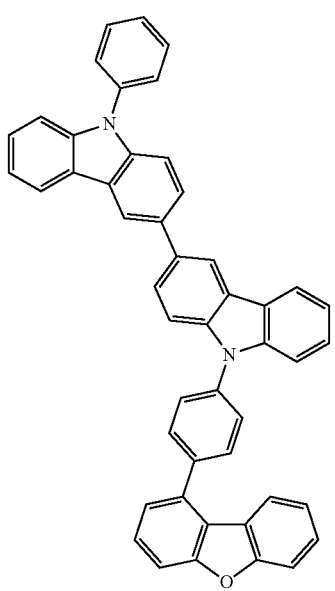

1-17
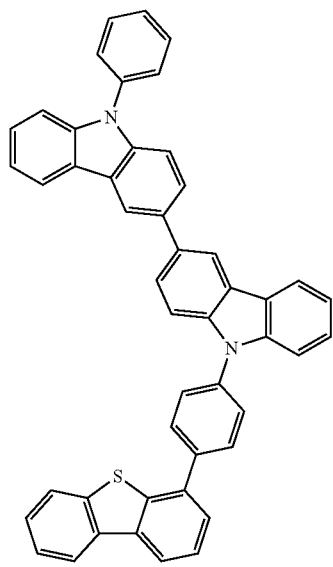
1-18
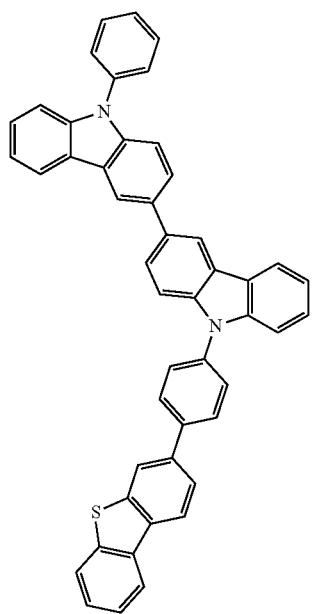
1-19
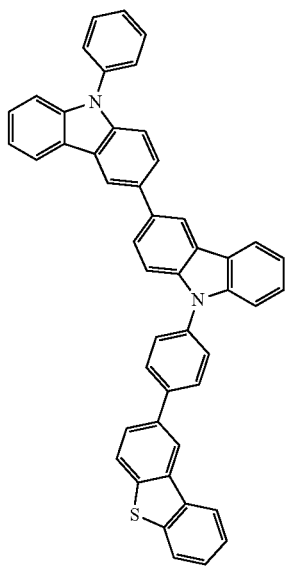
1-20
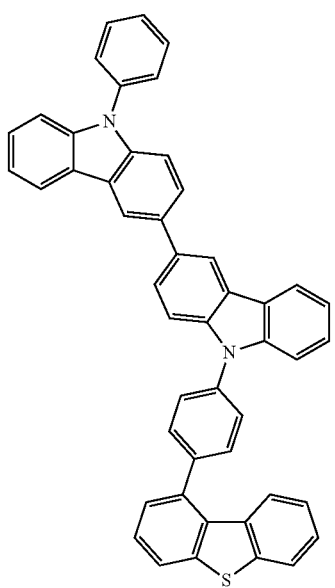

1-21
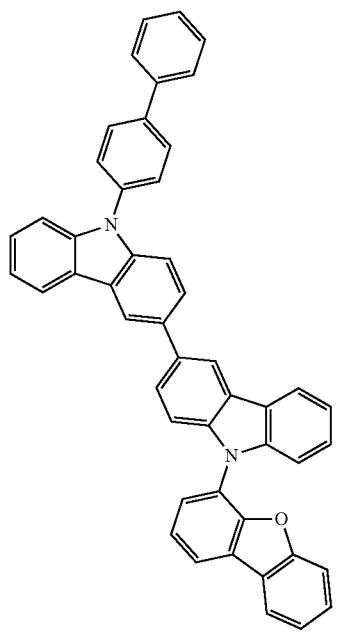
1-23
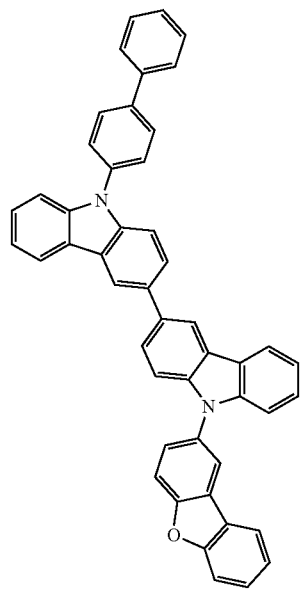
1-22
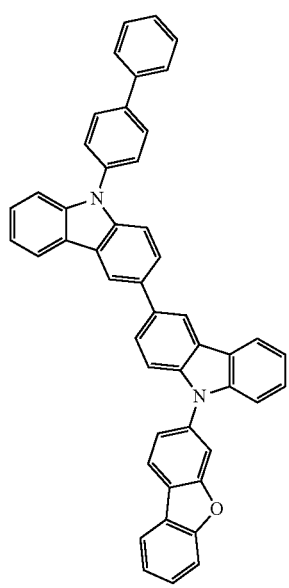
1-24
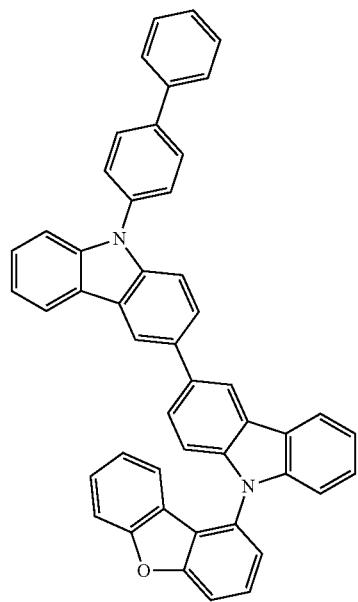

1-25
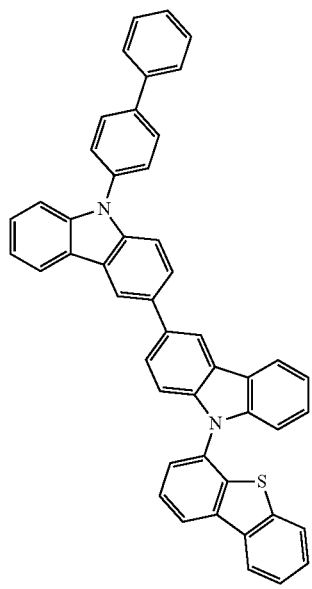
1-26
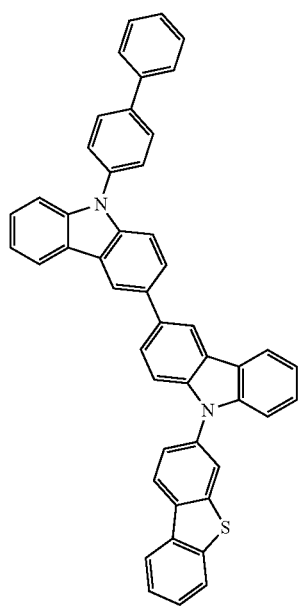
1-27
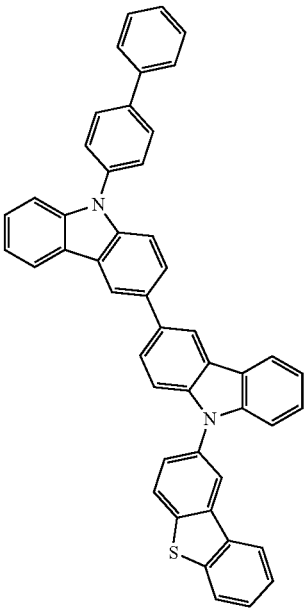
1-28
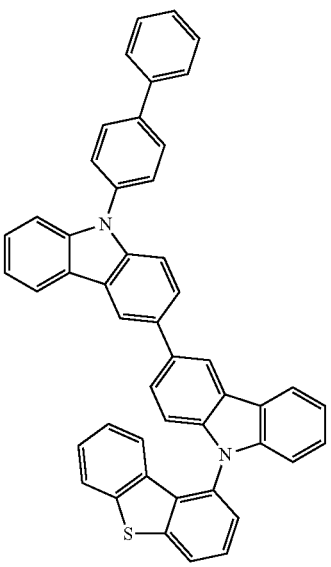

1-29
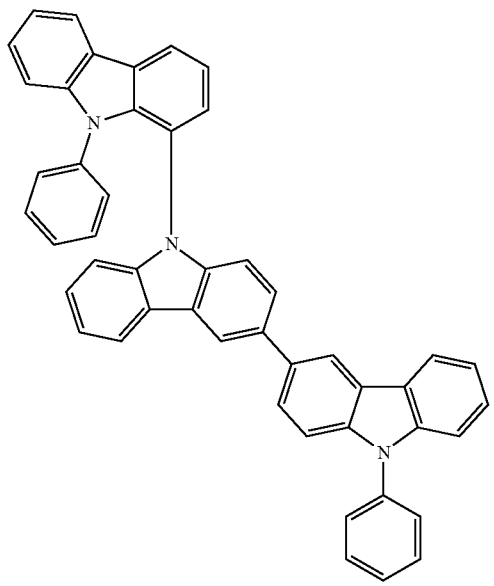
1-31
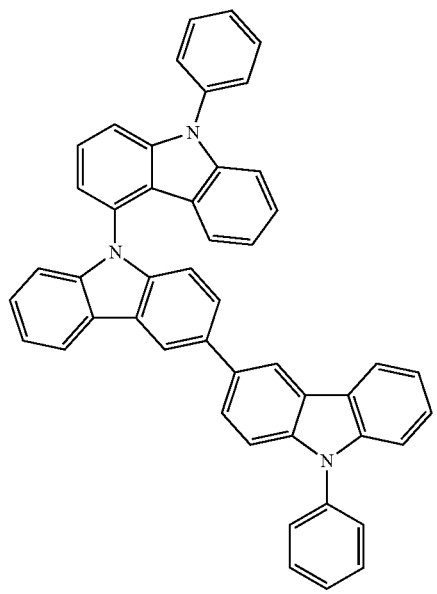
1-30
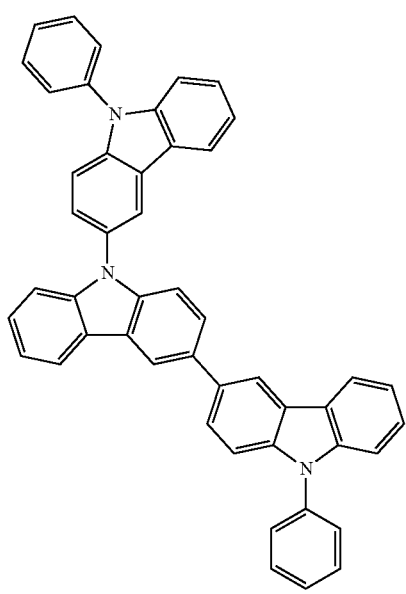
1-32
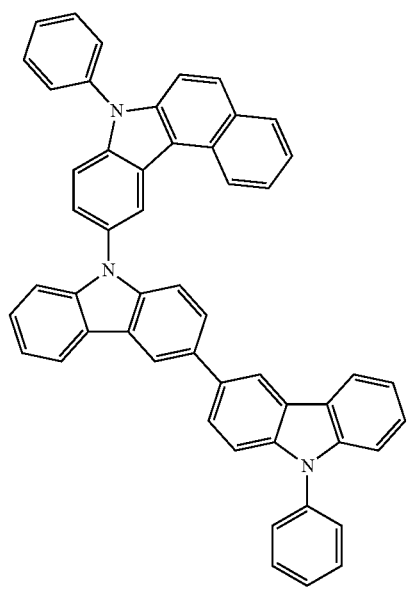

1-33
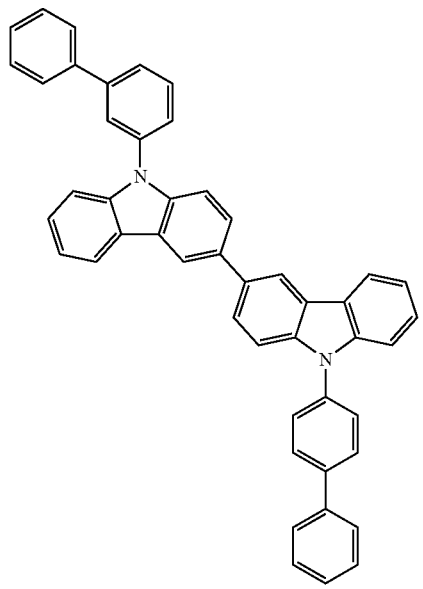
1-35
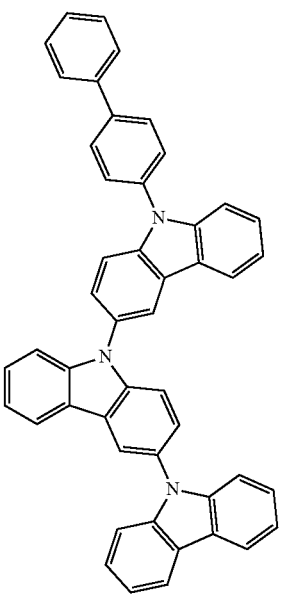
1-34
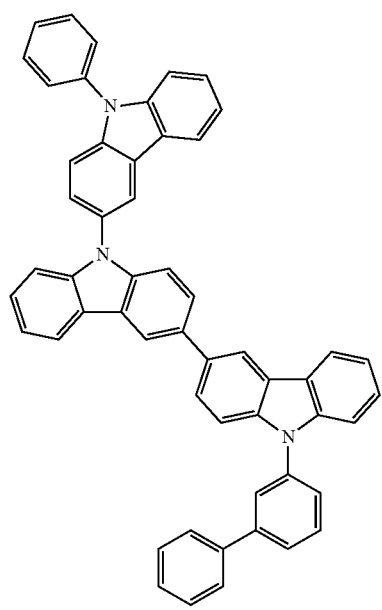
1-36
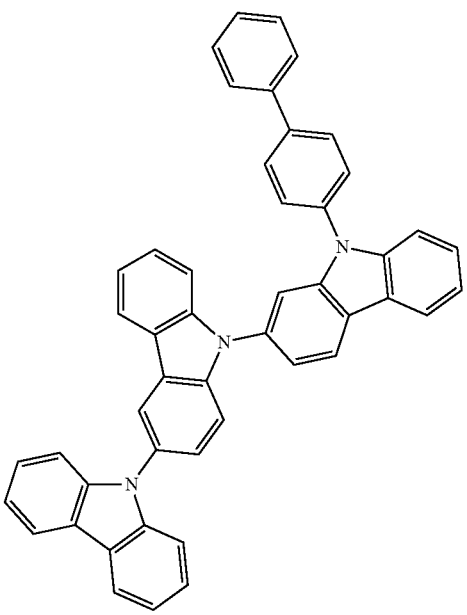
13. The blue organic electric element of claim 11, wherein the compound represented by Formula 2 is one of the following compounds:

2-1
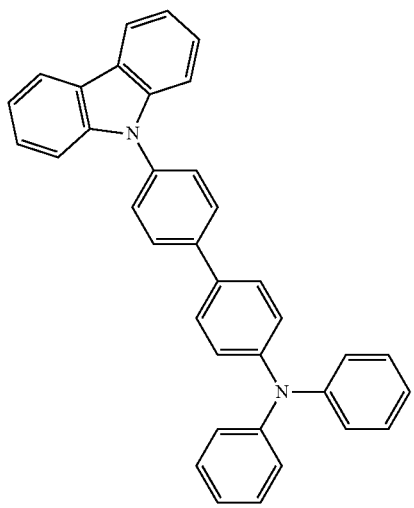
2-2
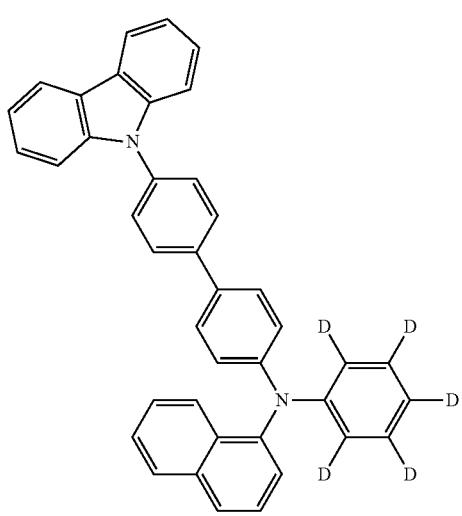
2-3
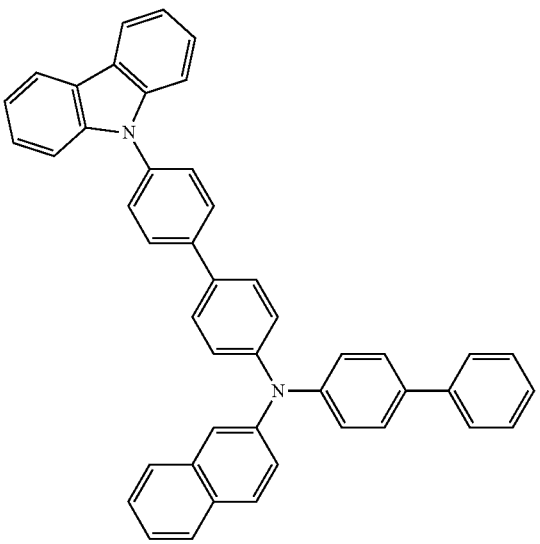
2-4
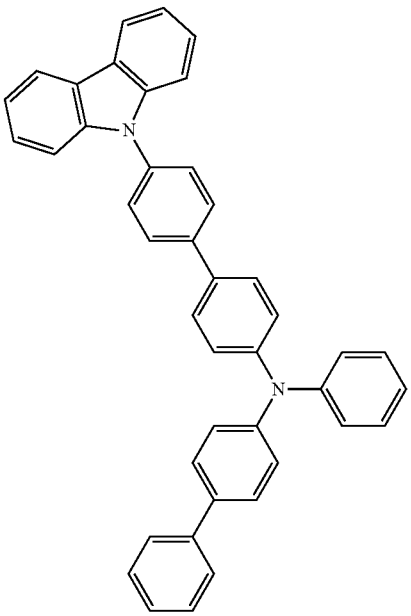
2-5
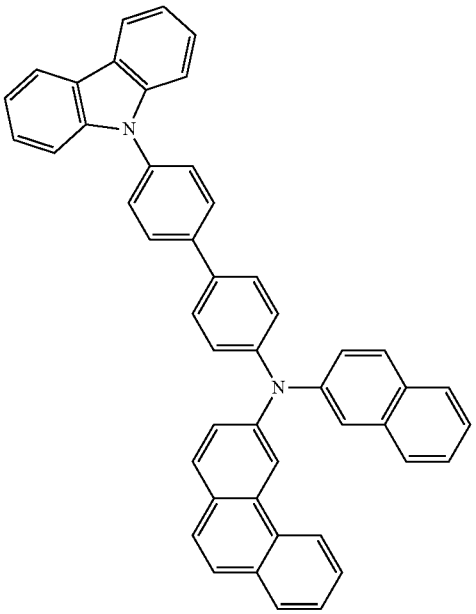

2-6
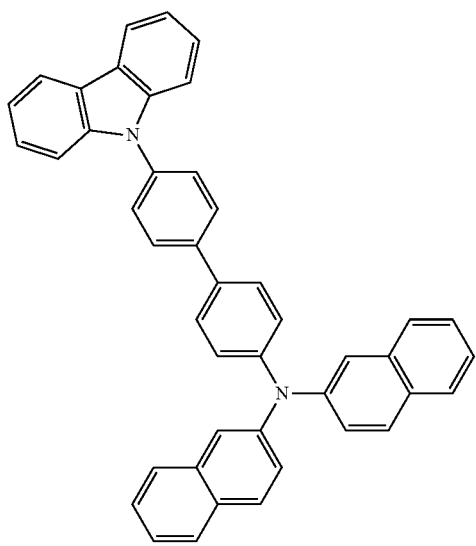
2-8
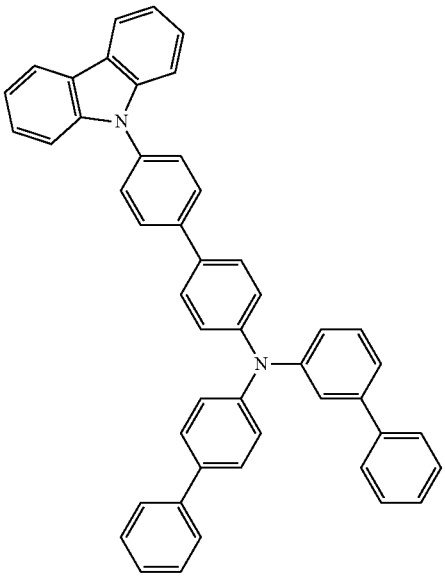
2-7
2-9

2-10
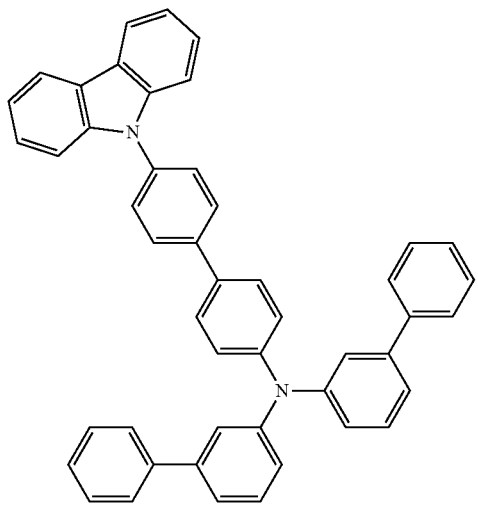
2-11
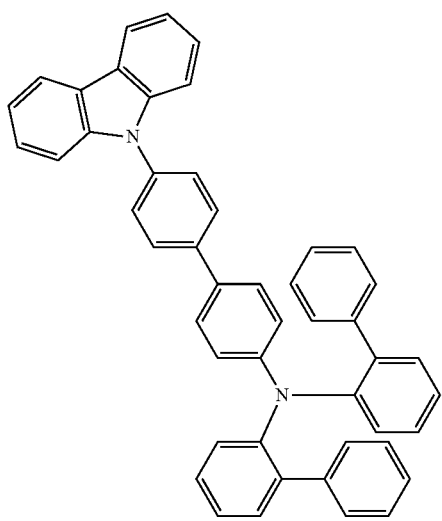
2-12
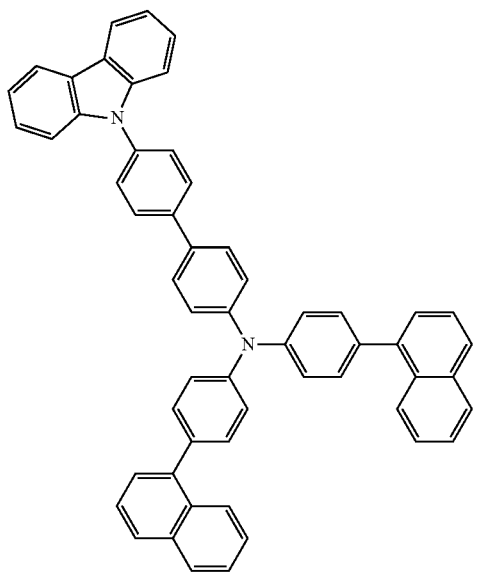
2-13
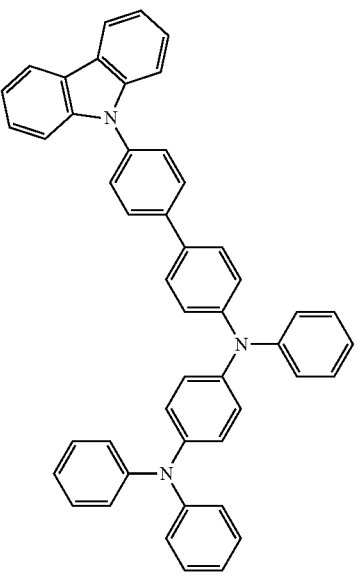
2-14
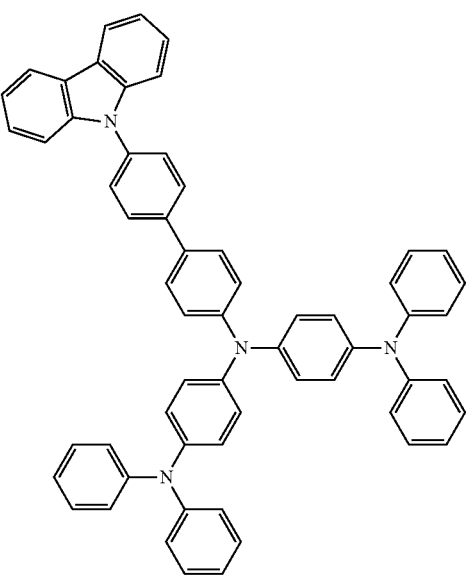

2-15
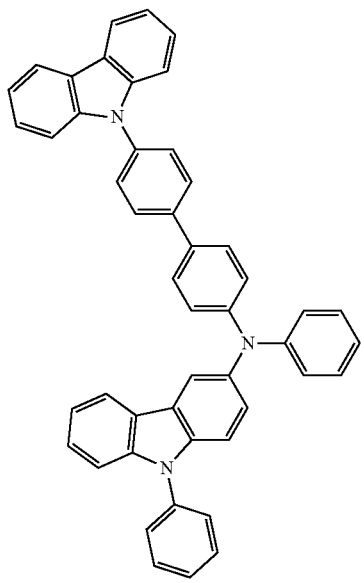
2-17
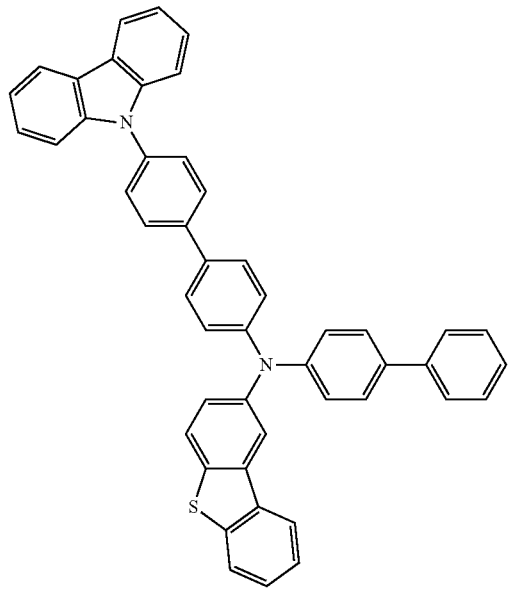
2-16
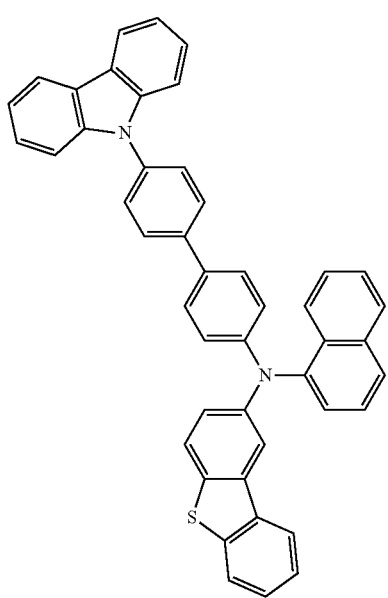
2-18
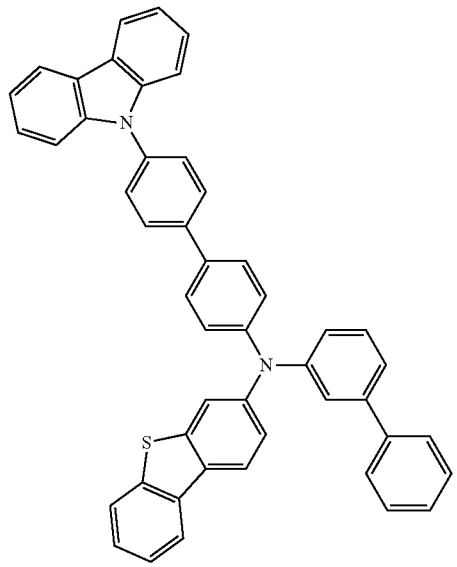

2-19
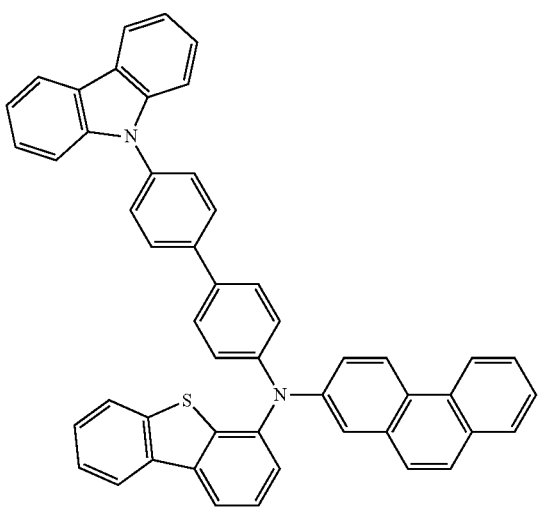
2-20
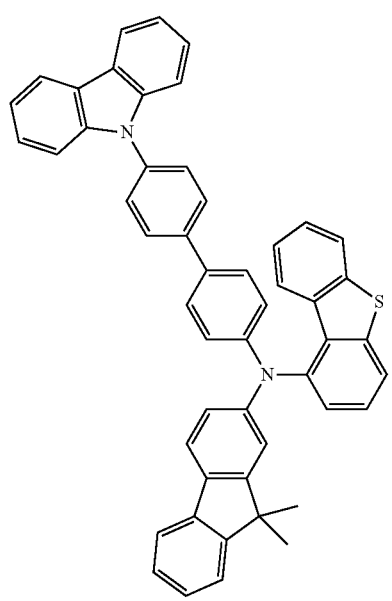
2-21
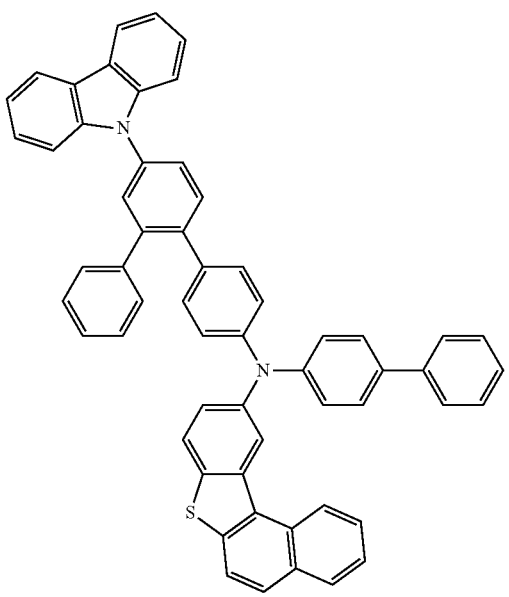
2-22

-continued
2-23
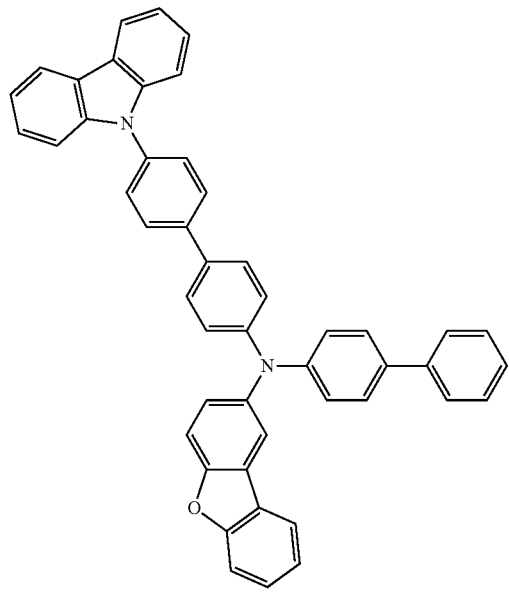
2-25
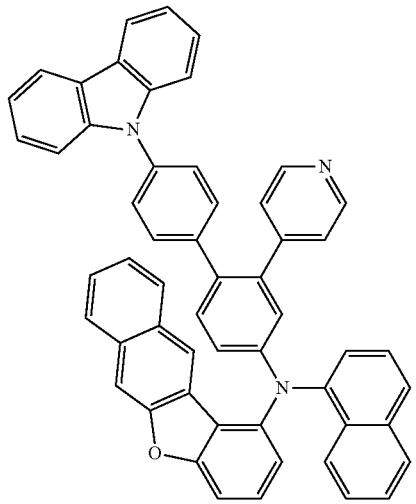
2-24
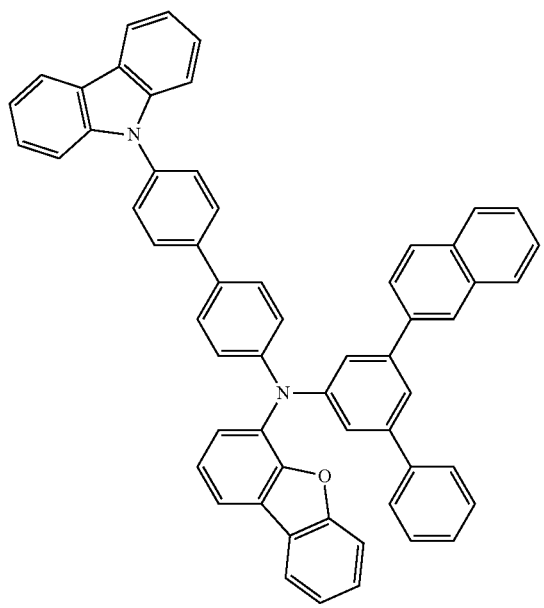
2-26
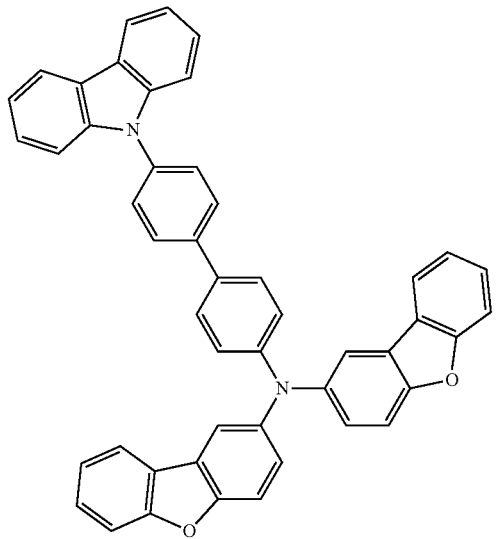

2-27
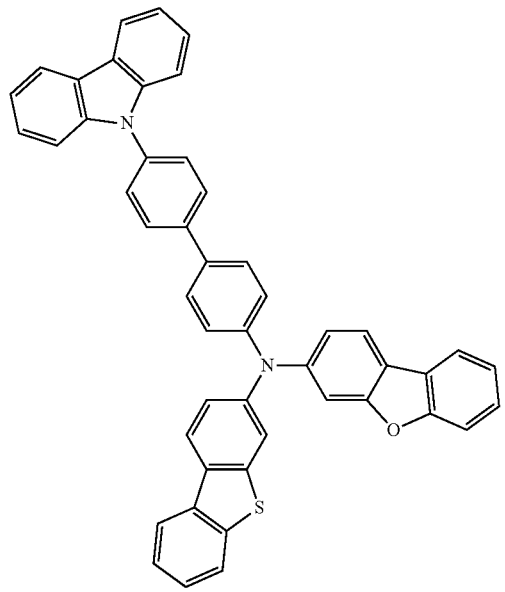
2-28
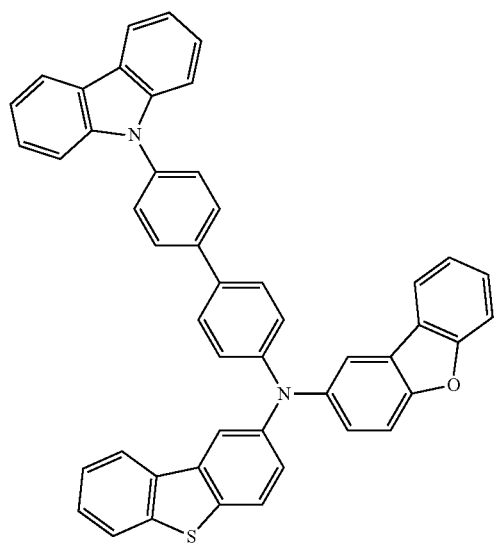
2-29
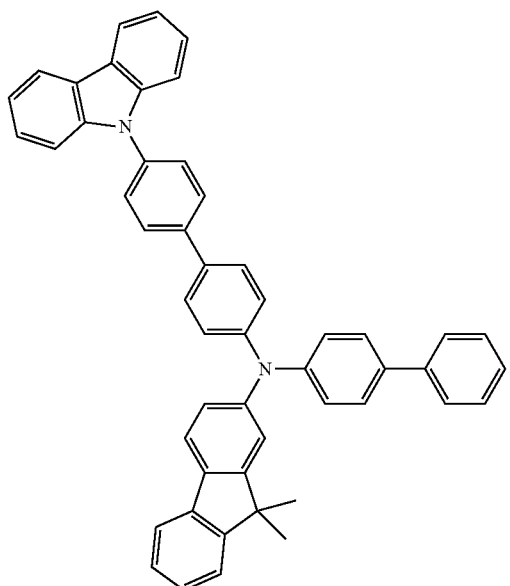
2-30
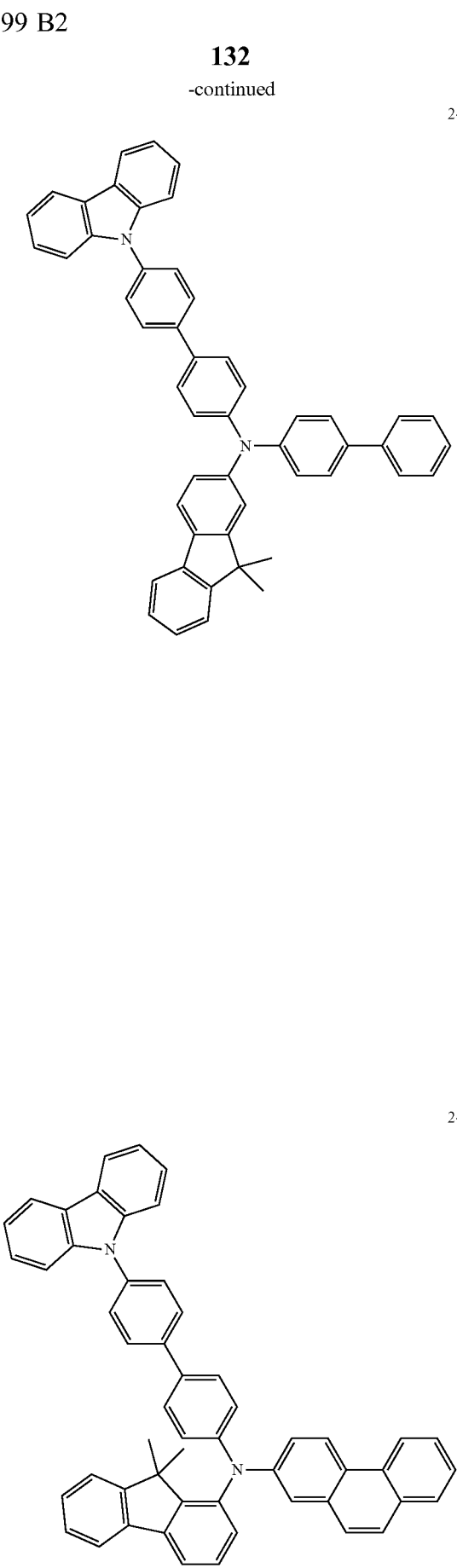

2-31
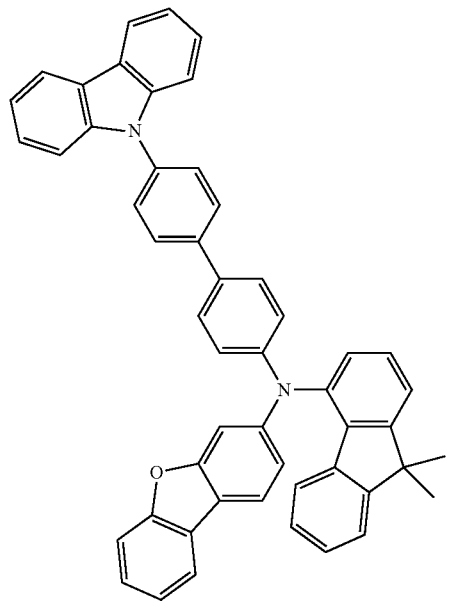
2-33
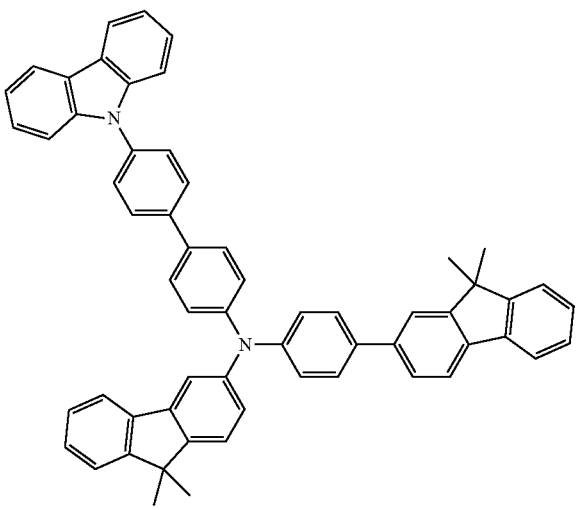
2-32
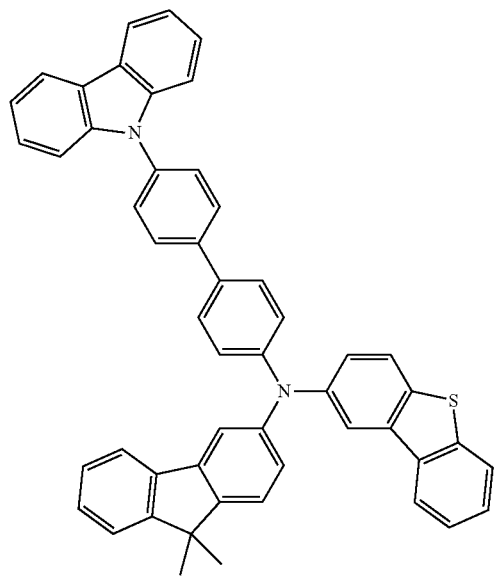
2-34
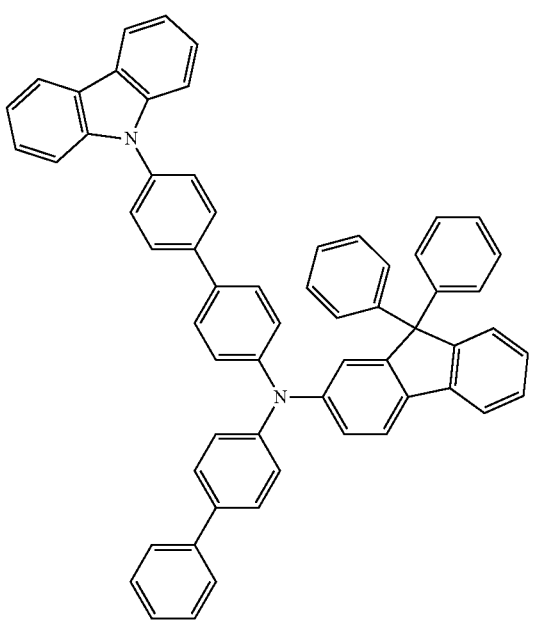

2-35
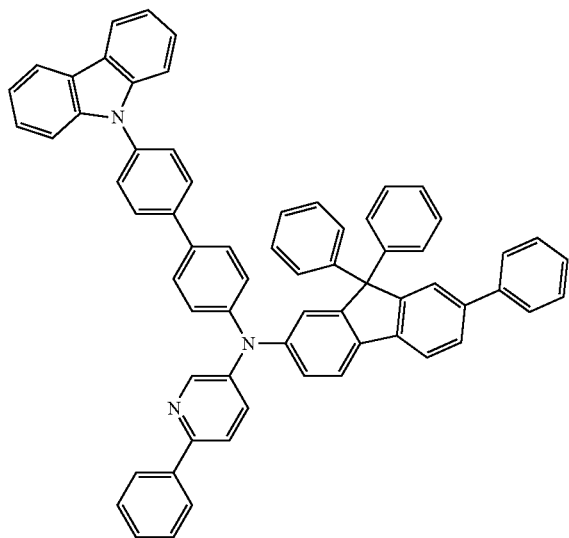
2-37
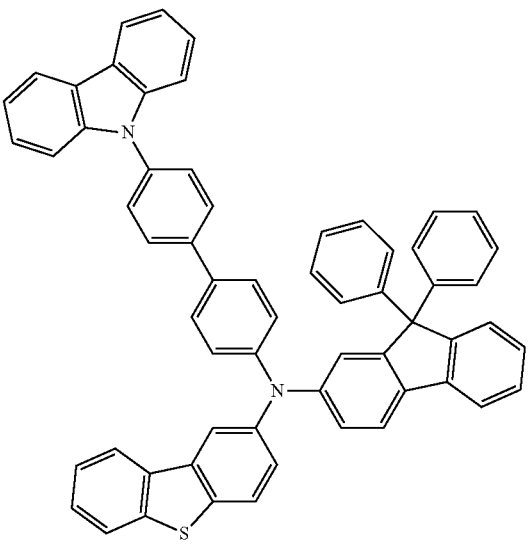
2-36
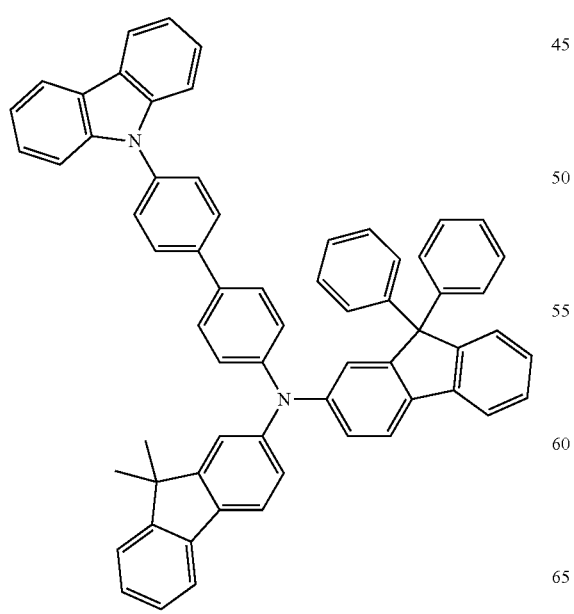
2-38
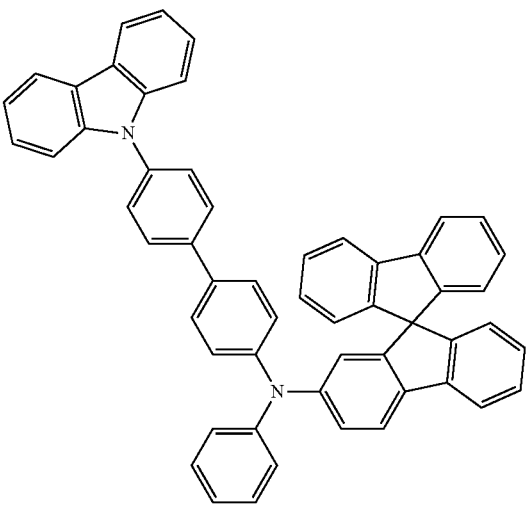

2-39
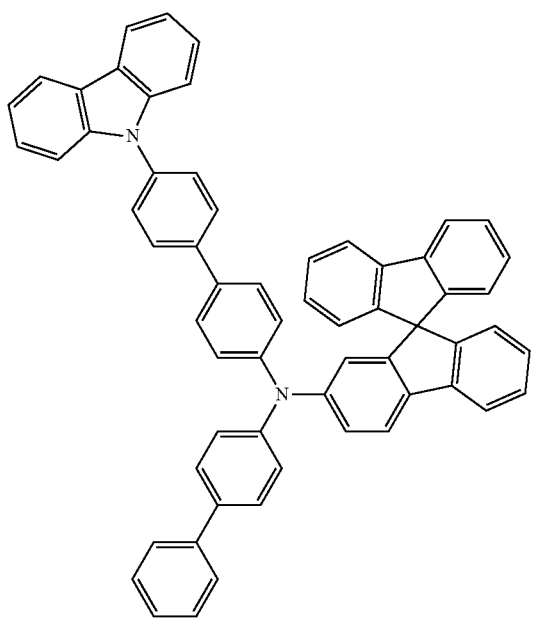
2-40
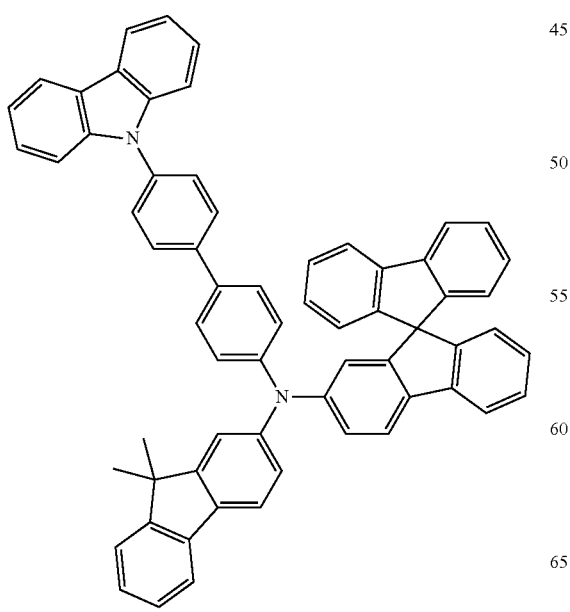
2-41
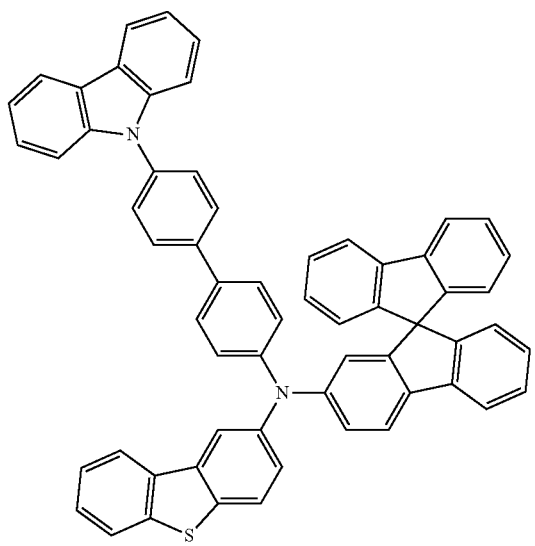
2-42
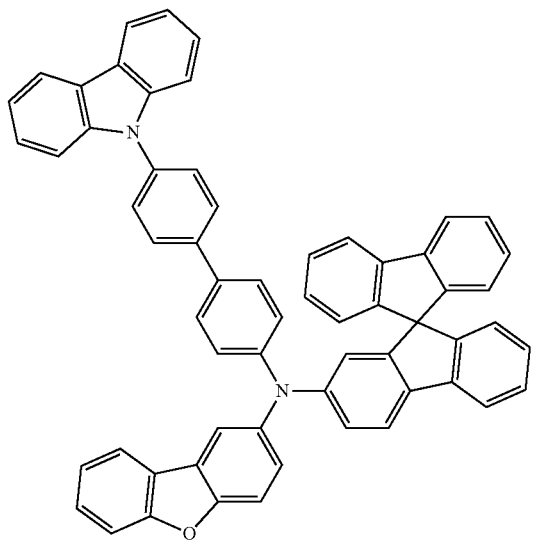

2-43
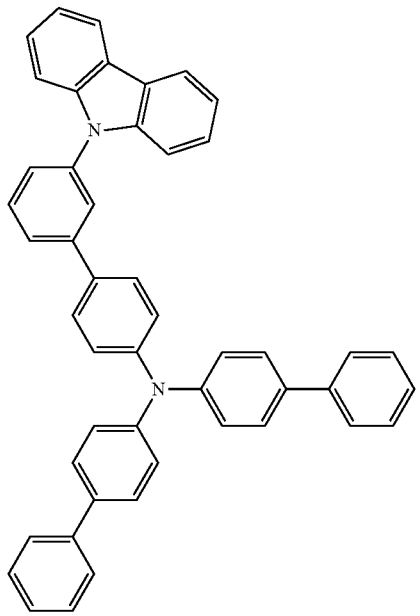
2-45
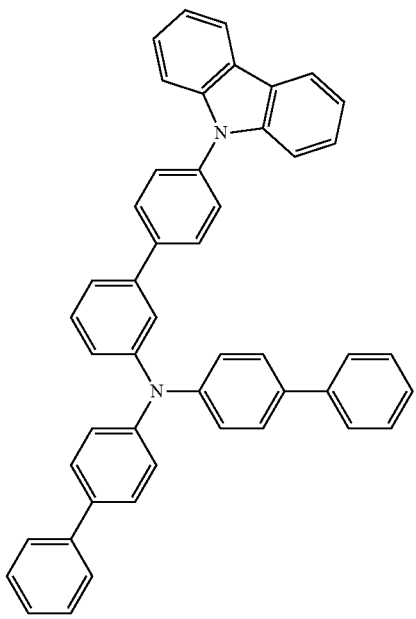
2-44
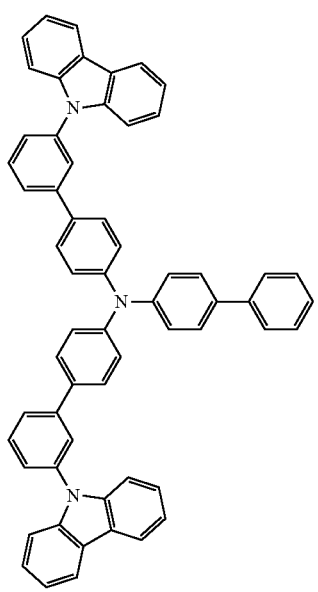
2-46
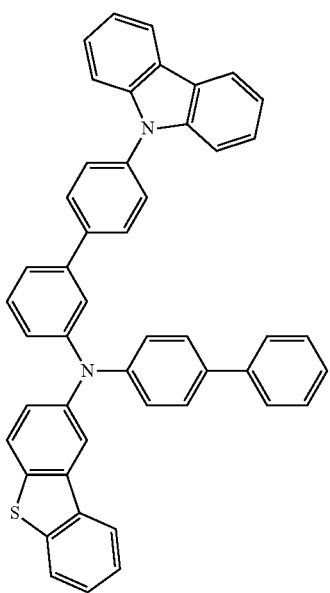

2-47
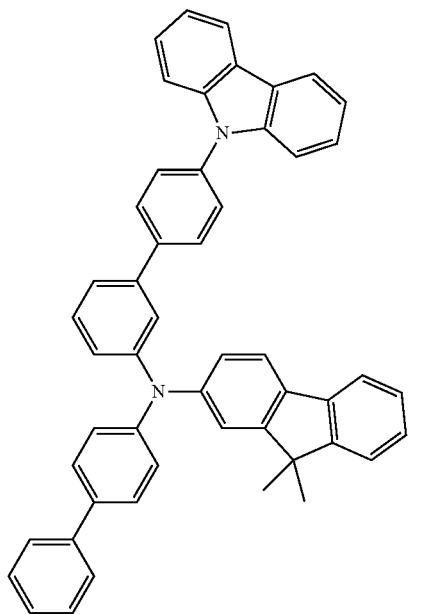
2-48
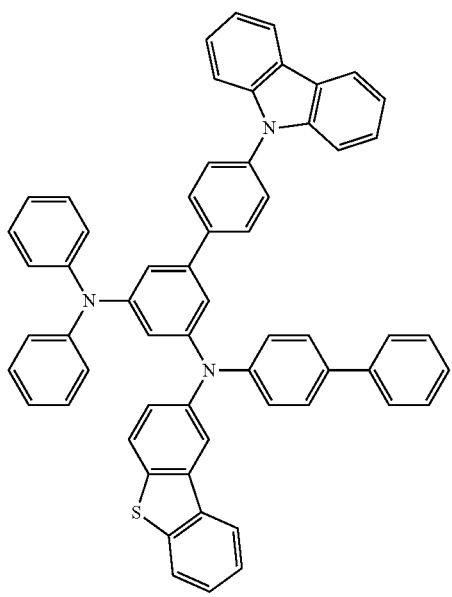
2-49
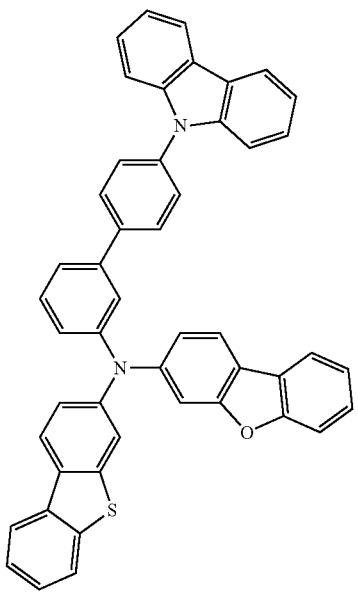
2-50
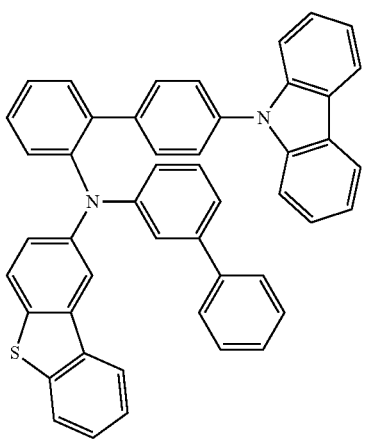
2-51
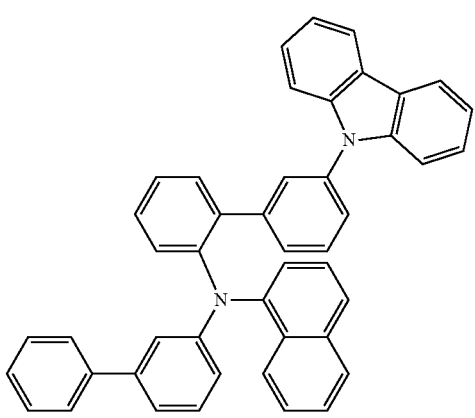

-continued
2-52
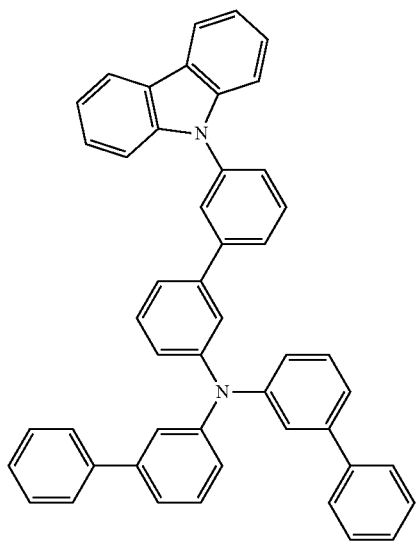
2-53
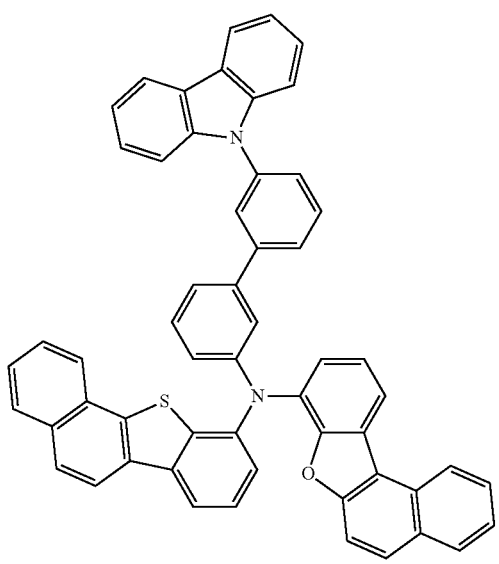
2-54
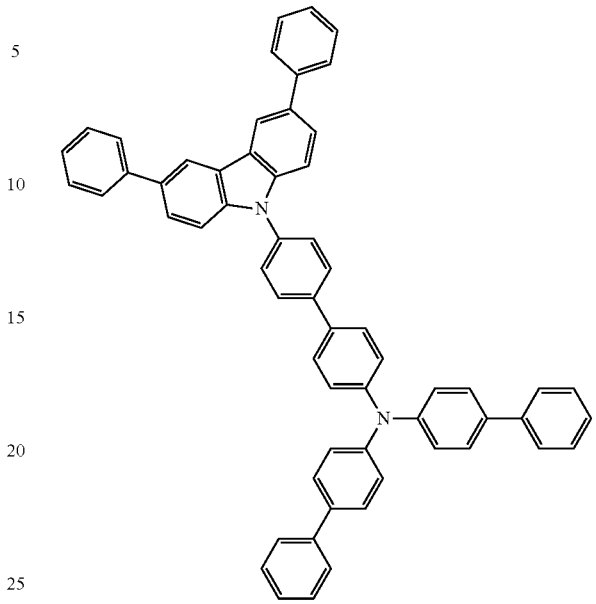
2-55
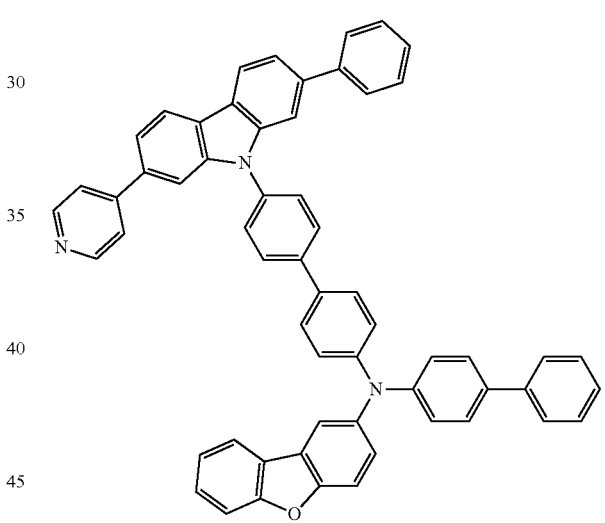
2-56
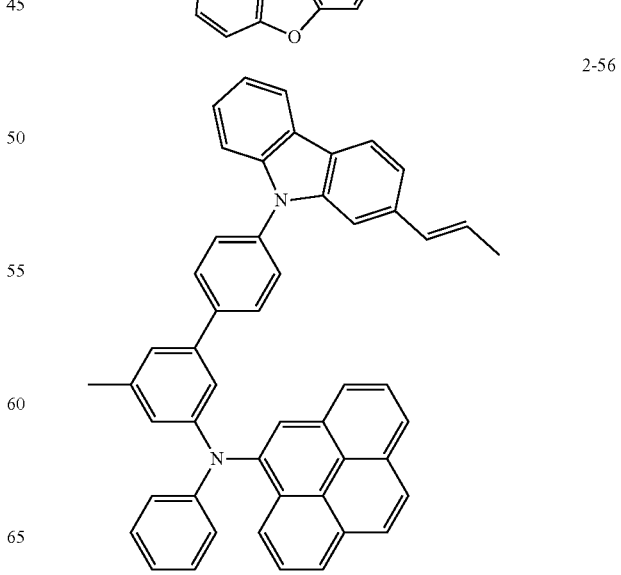

2-57
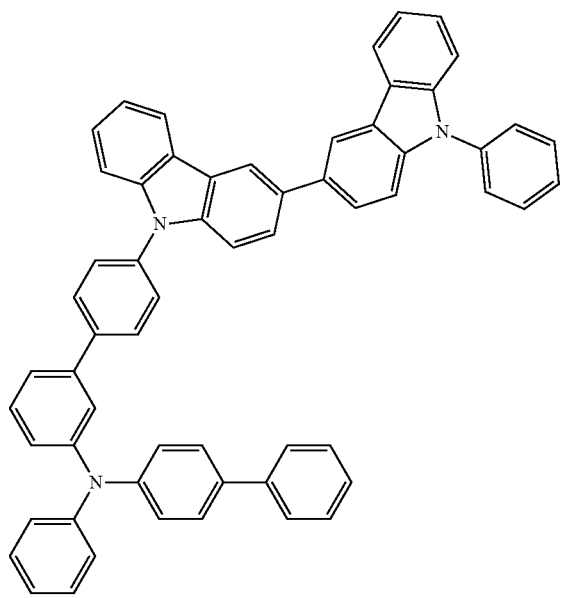
2-60
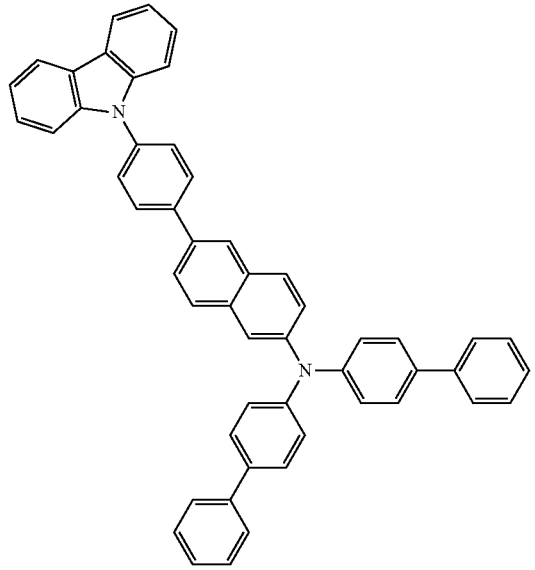
2-58
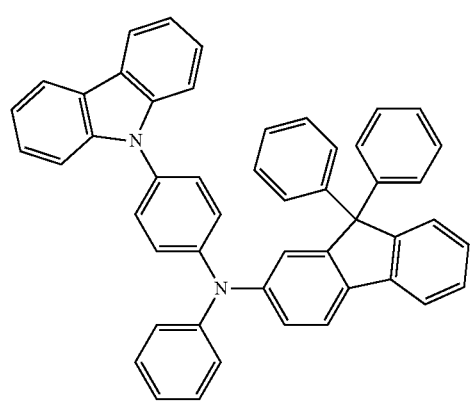
2-61
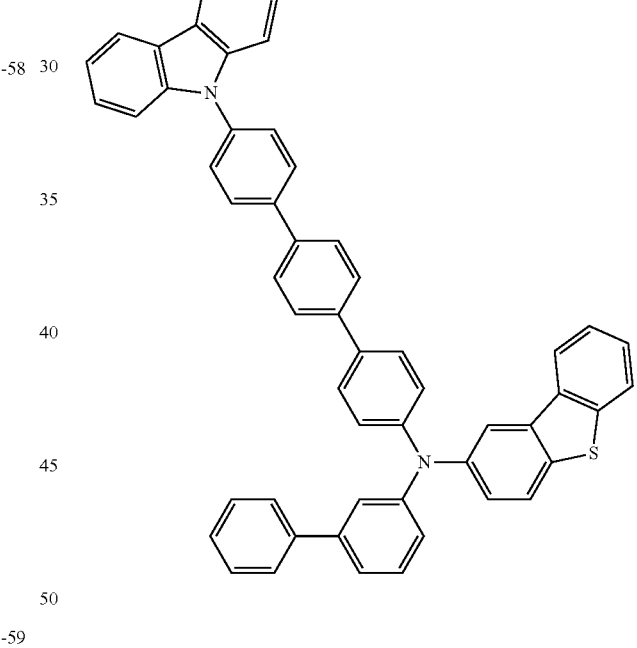
2-59
2-62
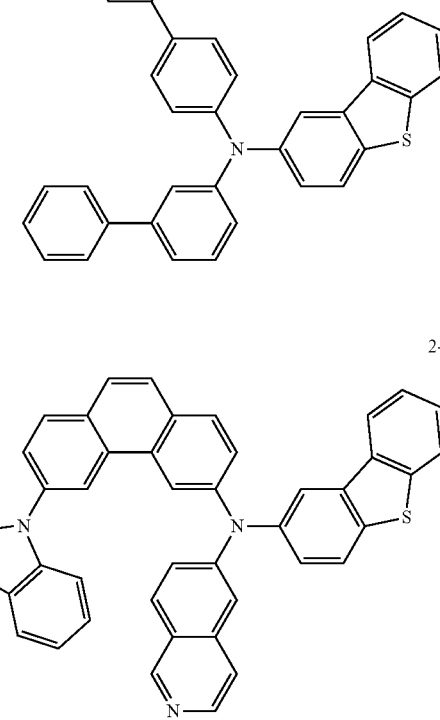

2-63
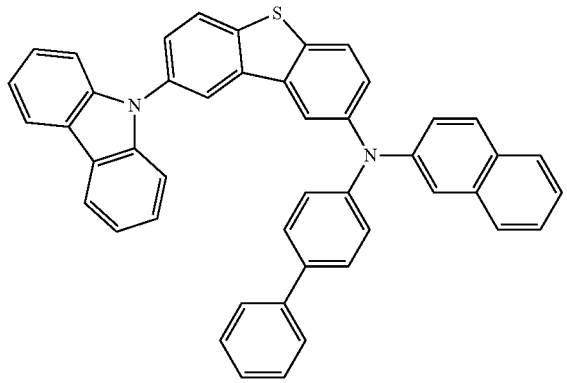
2-64
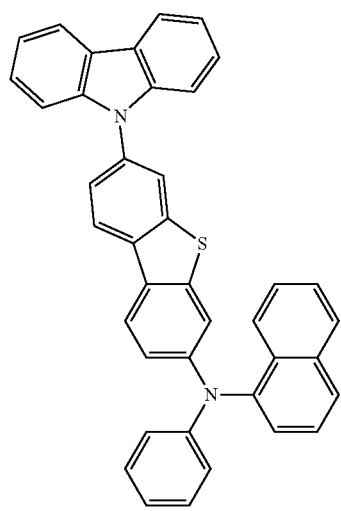
2-65
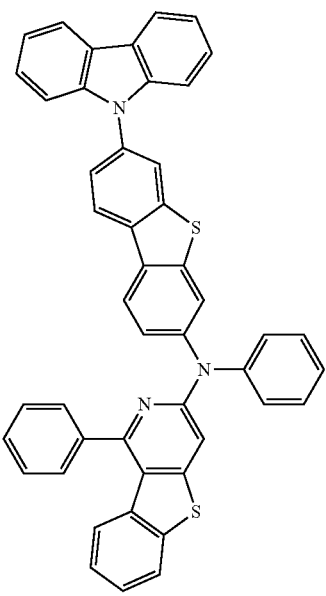
2-66
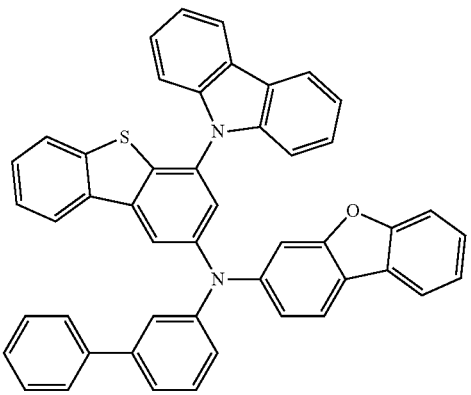
2-67
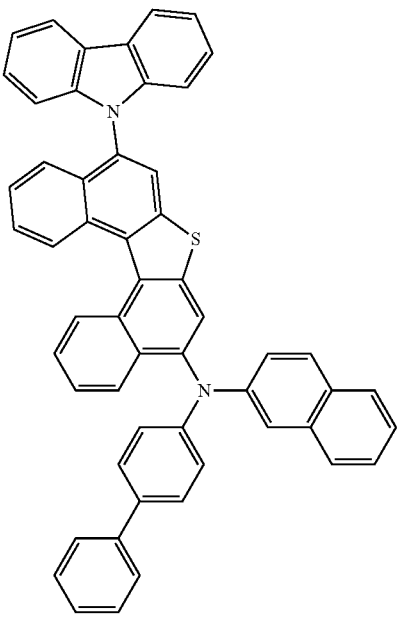
2-68
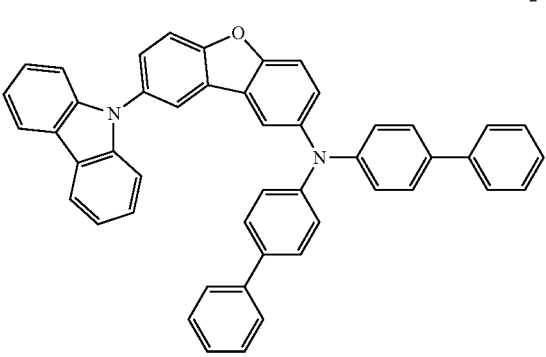

2-69
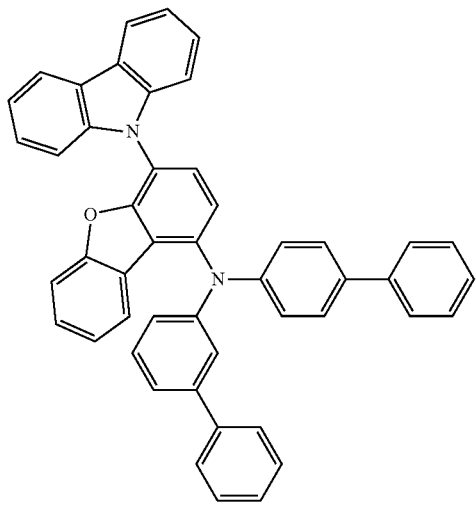
2-70
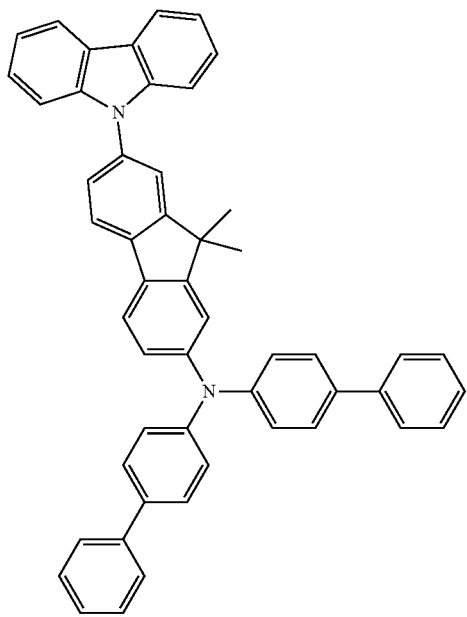
2-71
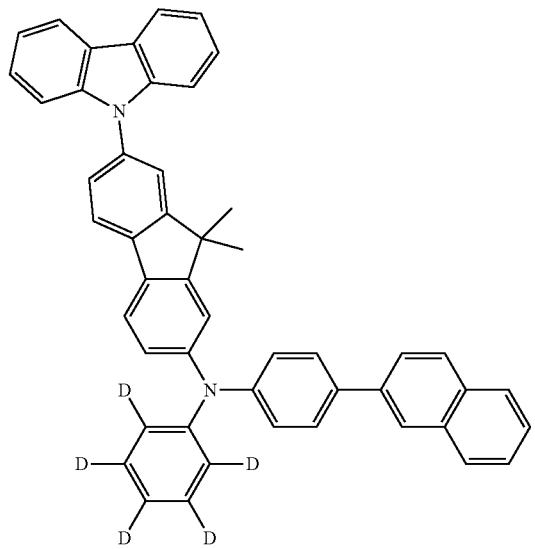
2-72
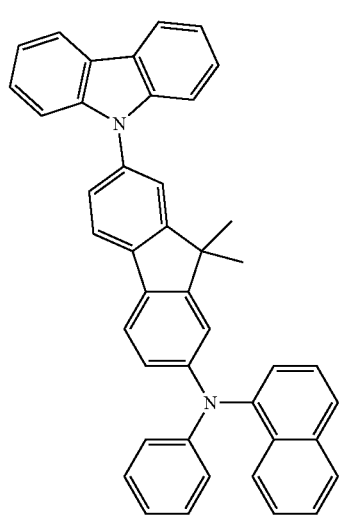
2-73
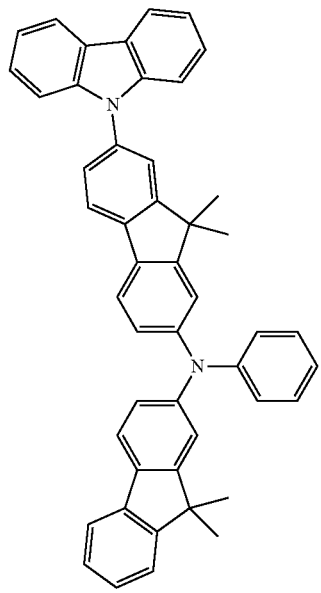

2-74
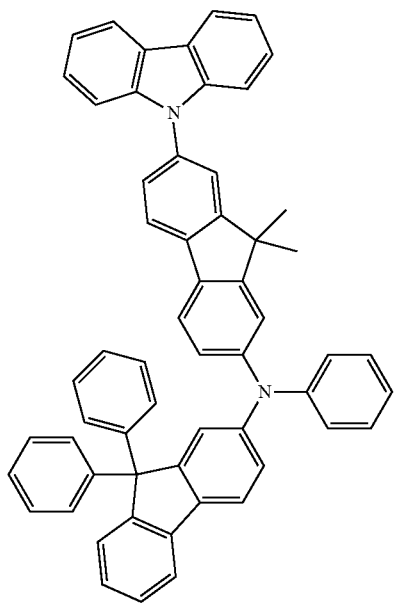
2-76
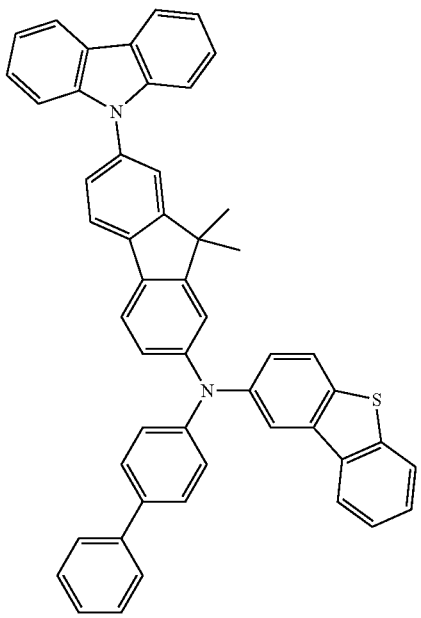
2-75
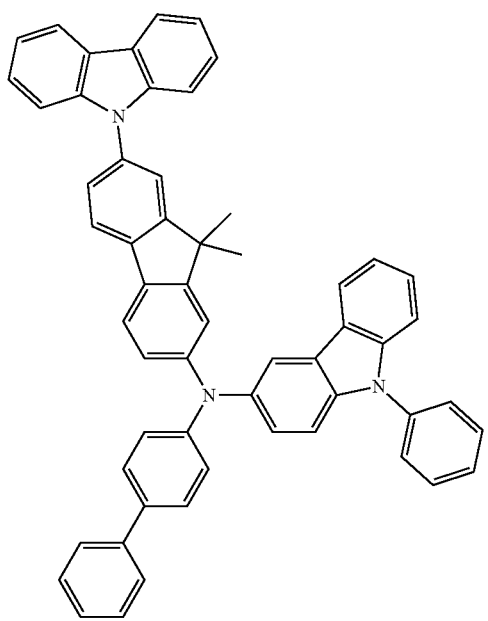
2-77
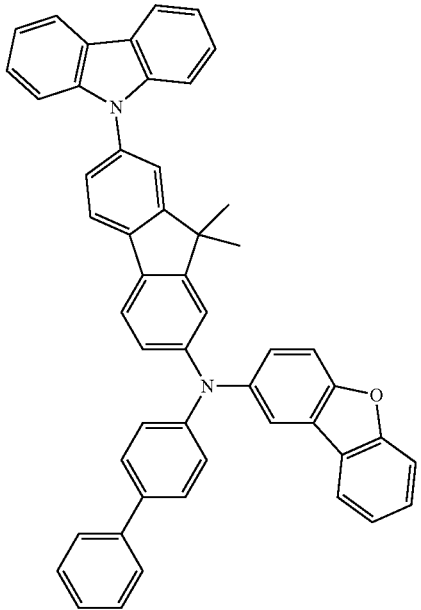

2-78
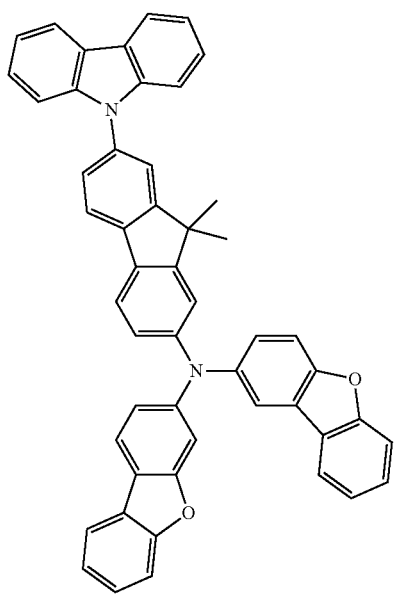
2-79
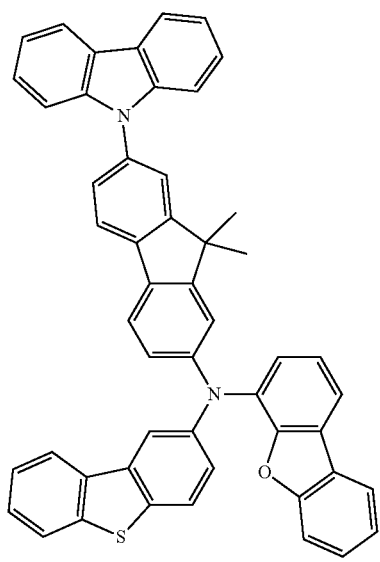
2-80
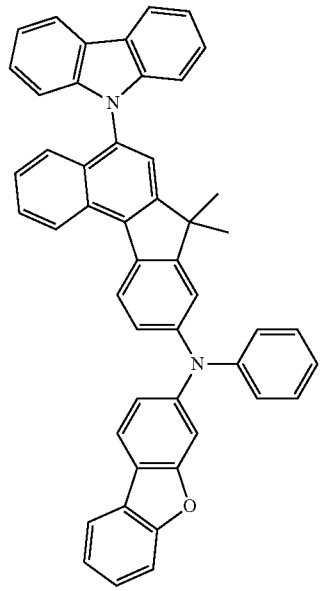
2-81
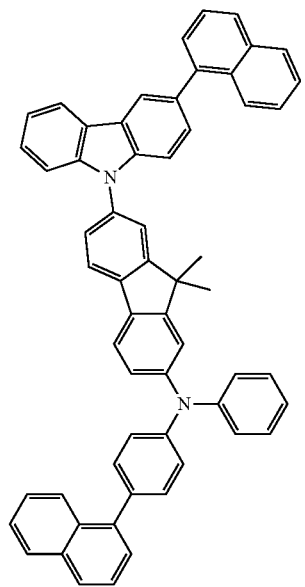
2-82

2-83
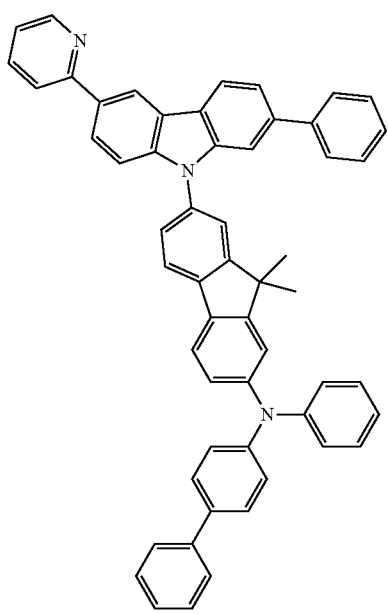
2-85
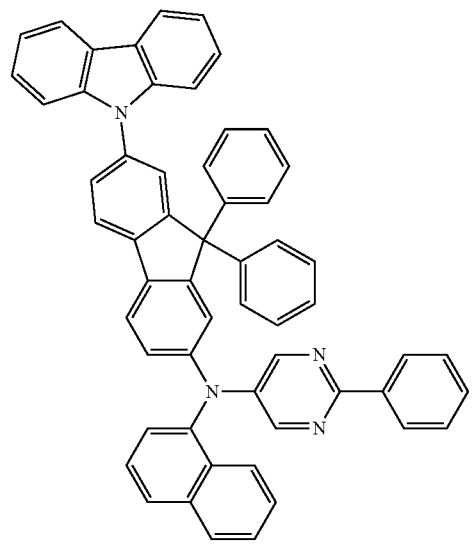
2-84
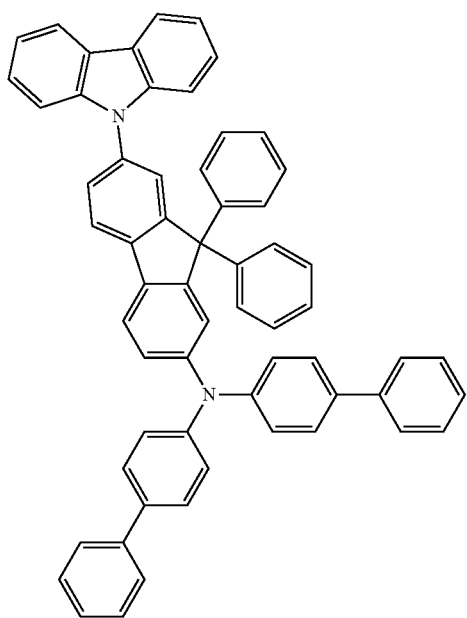
2-86
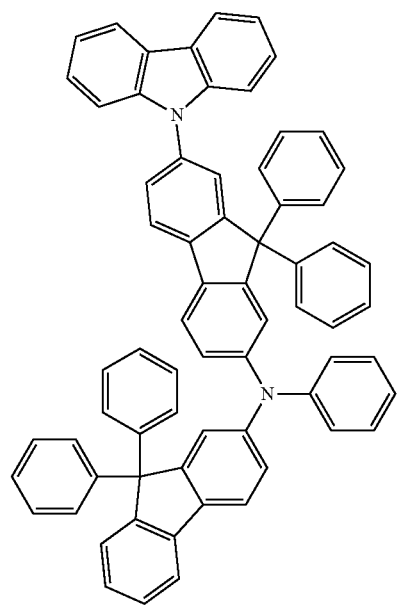

2-87
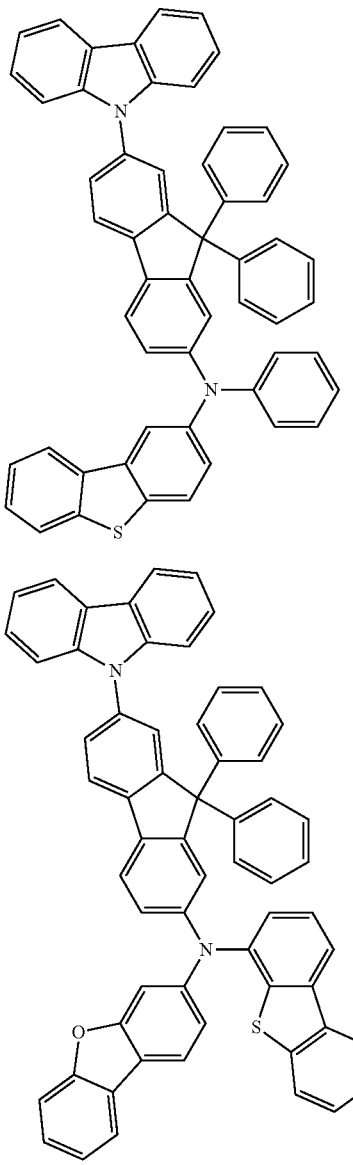
2-88
2-89
2-90
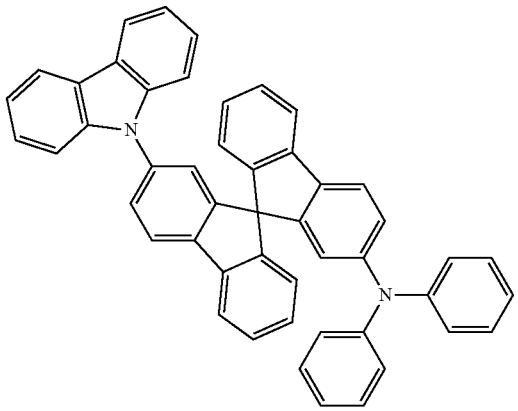
2-91
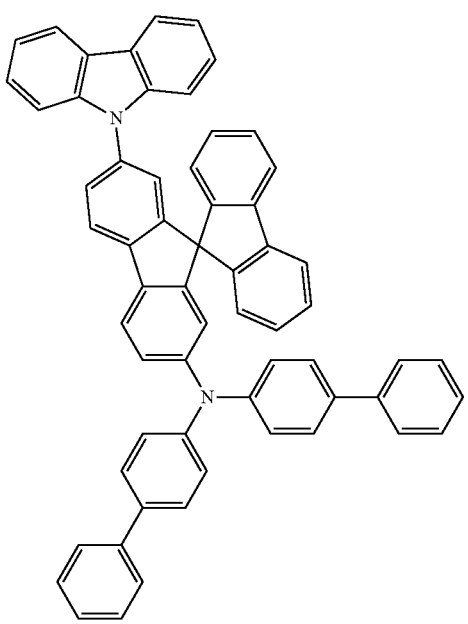
2-92
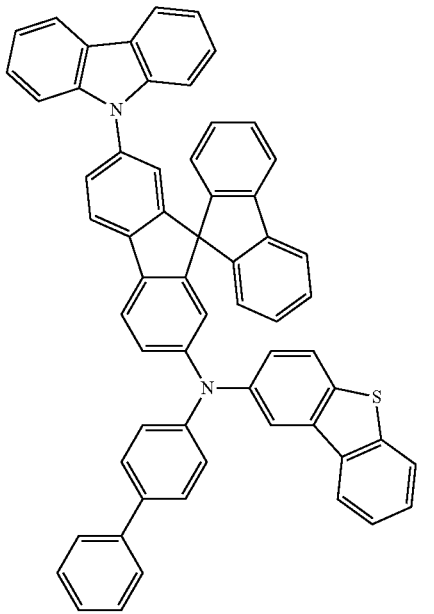

2-93
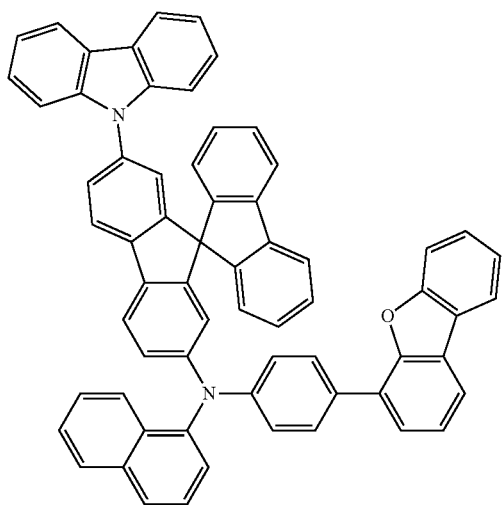
2-95
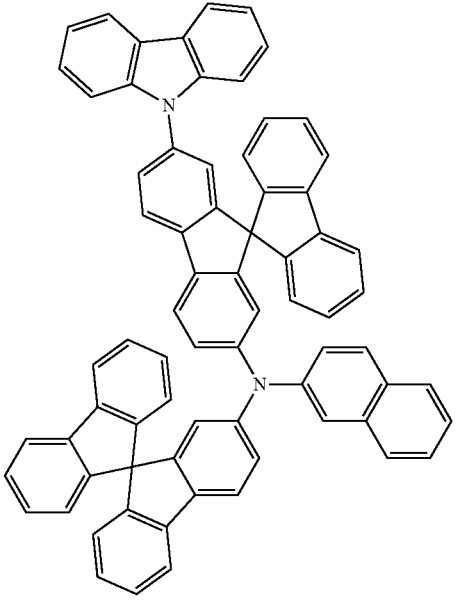
2-94
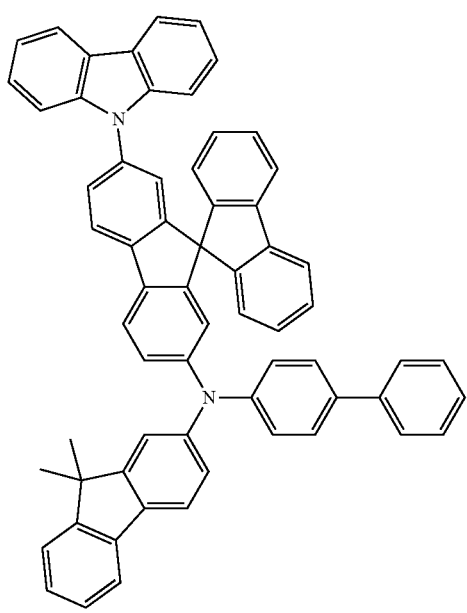
2-96
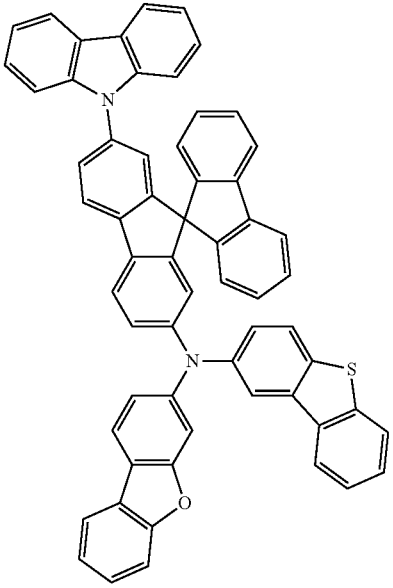

2-97
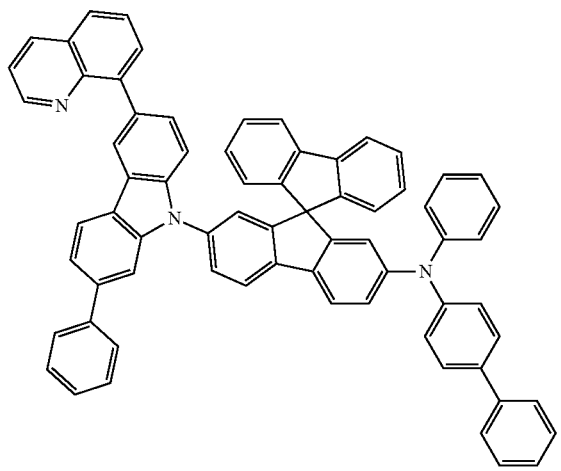
2-98
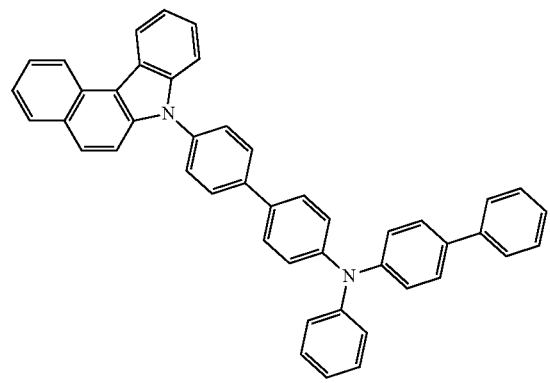
2-99
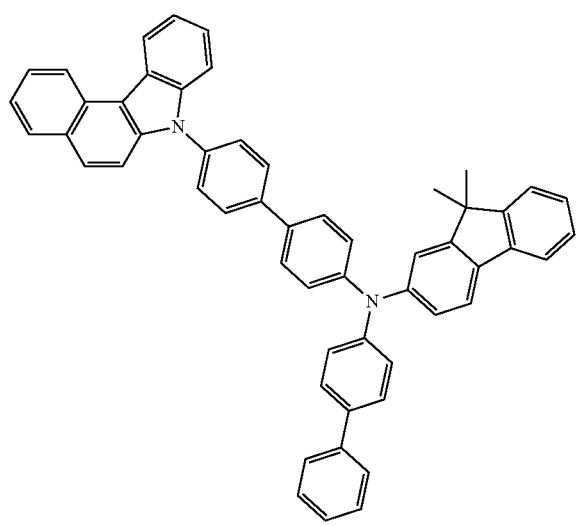
2-100
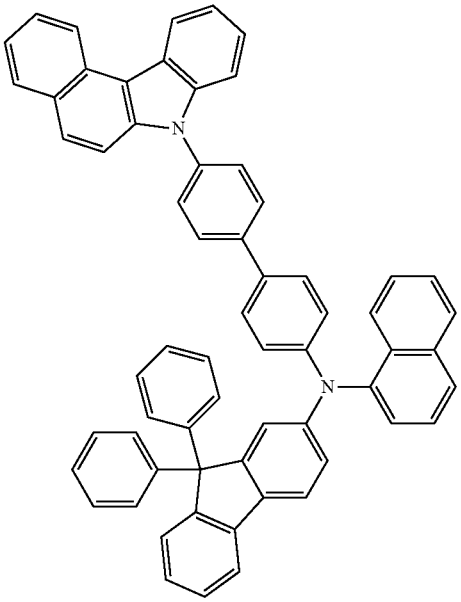
2-101
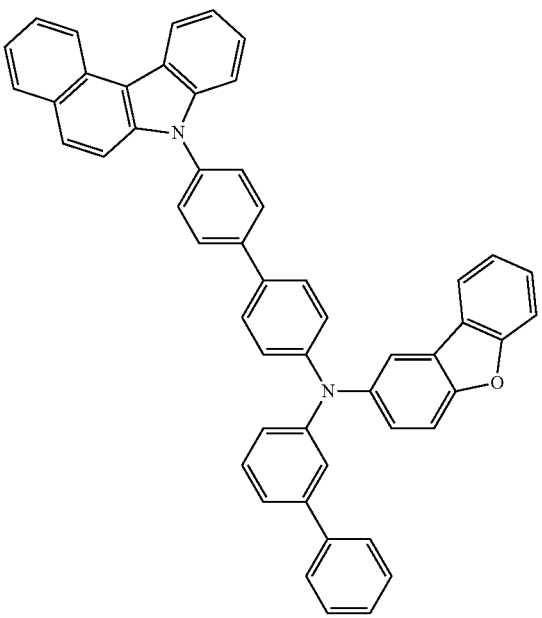

2-102
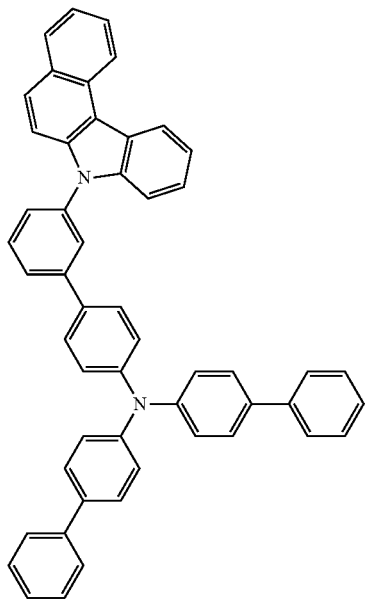
2-104
2-105
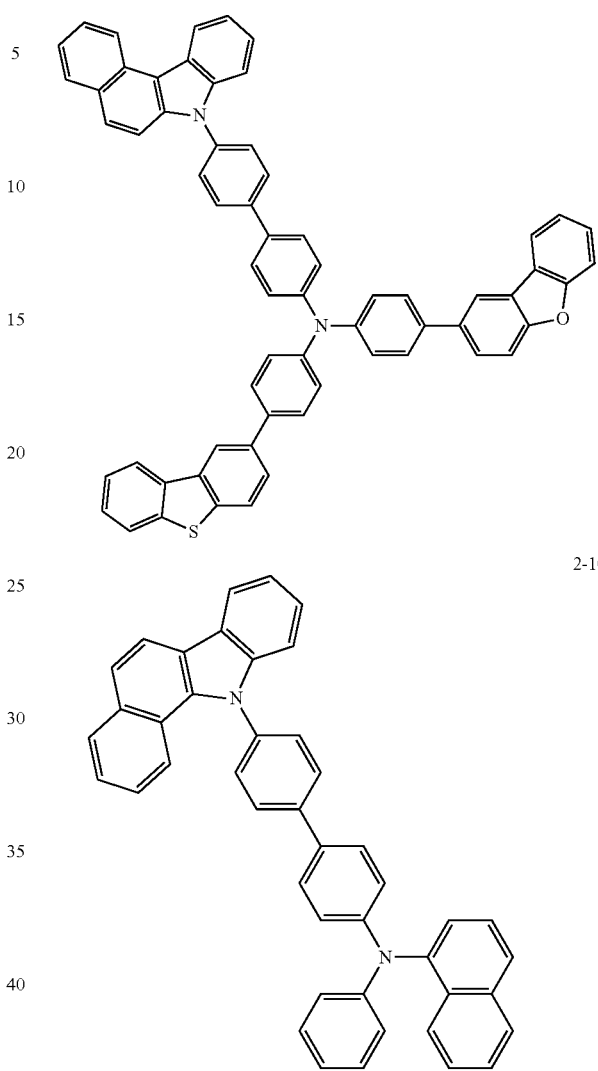
2-103
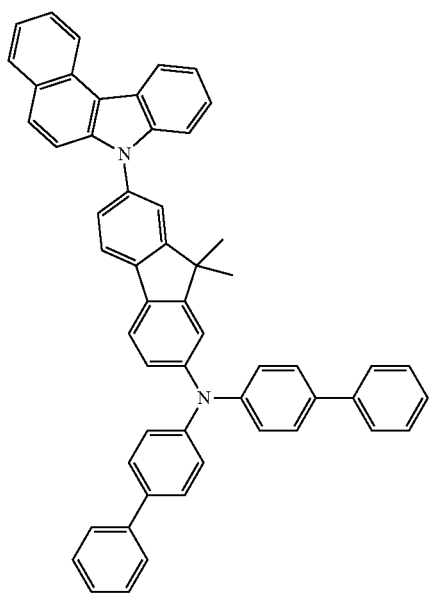
2-106
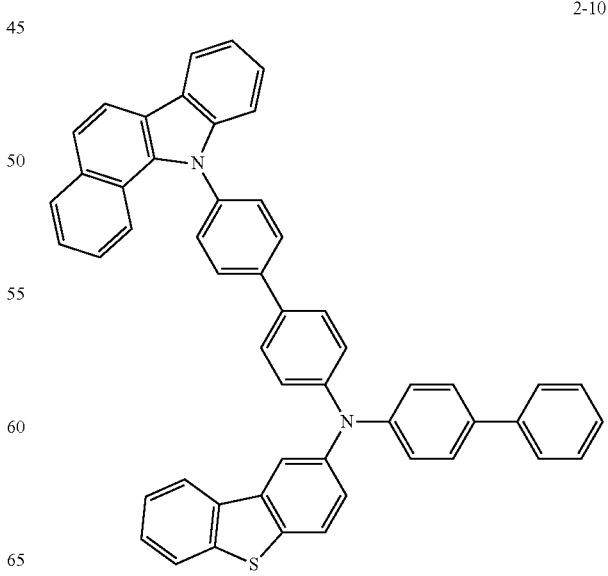

2-107
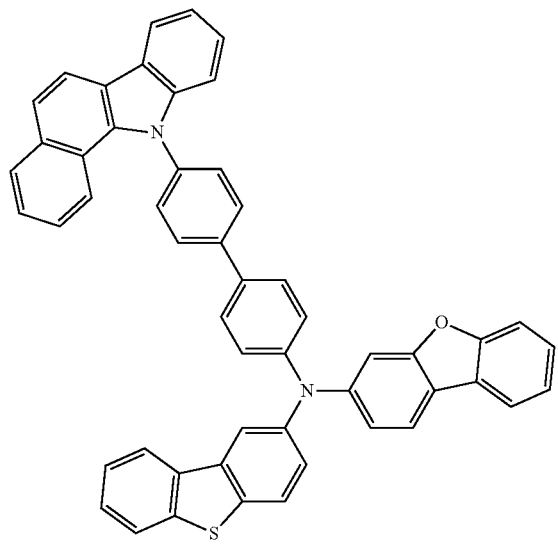
2-109
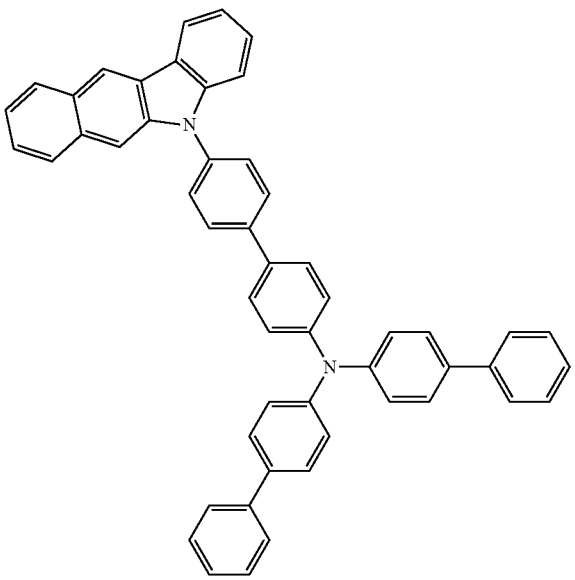
2-108
2-110
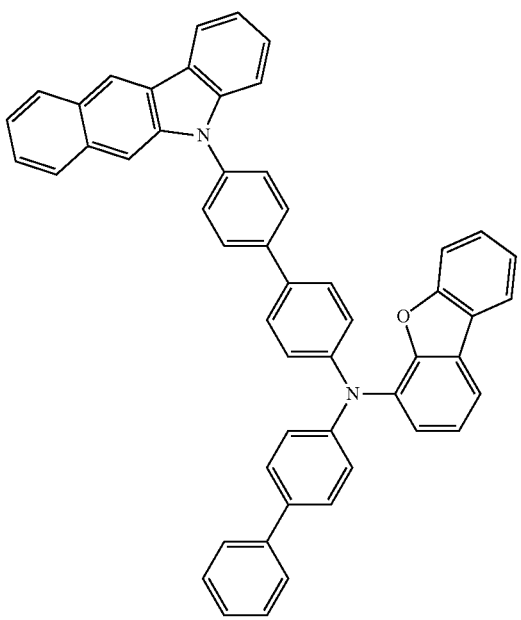

2-111
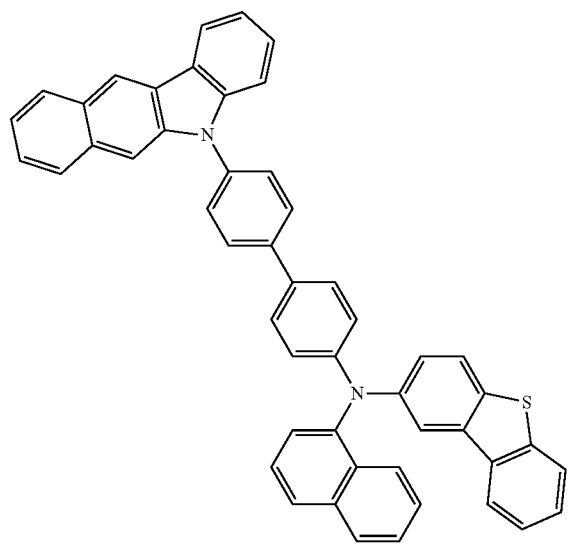
2-112
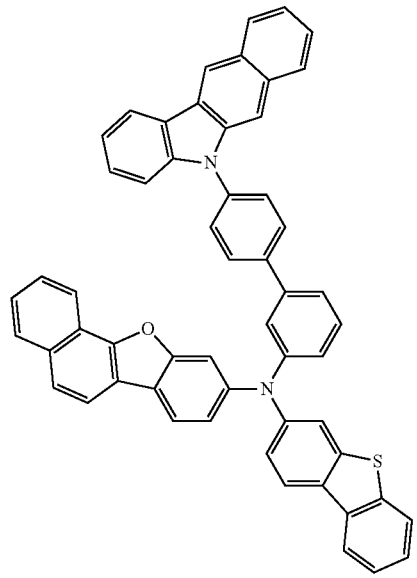
2-113
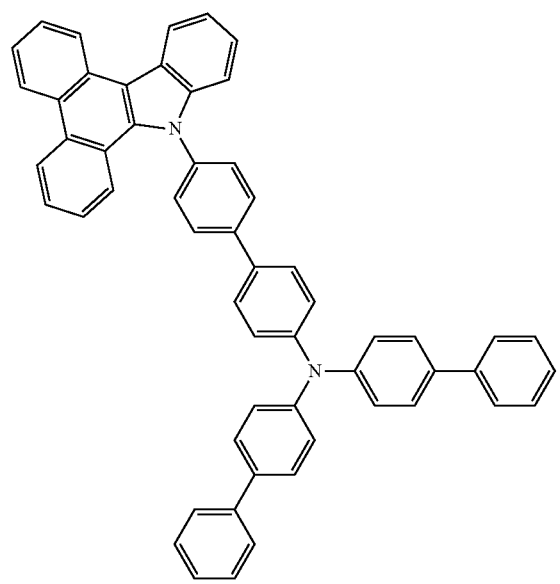
2-114
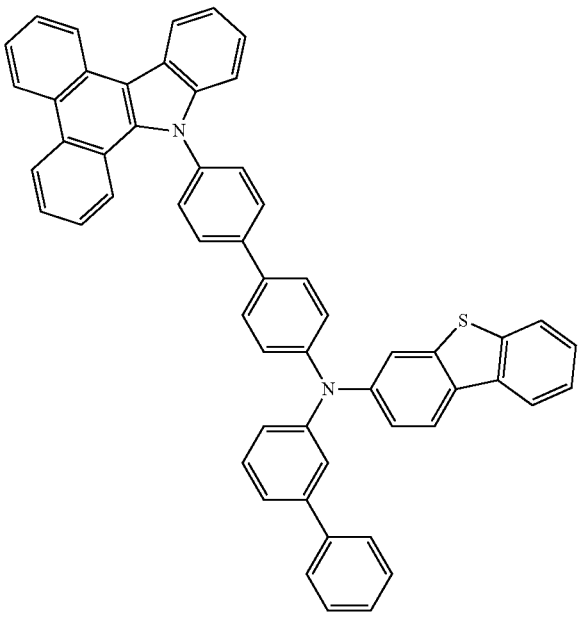

-continued
2-115
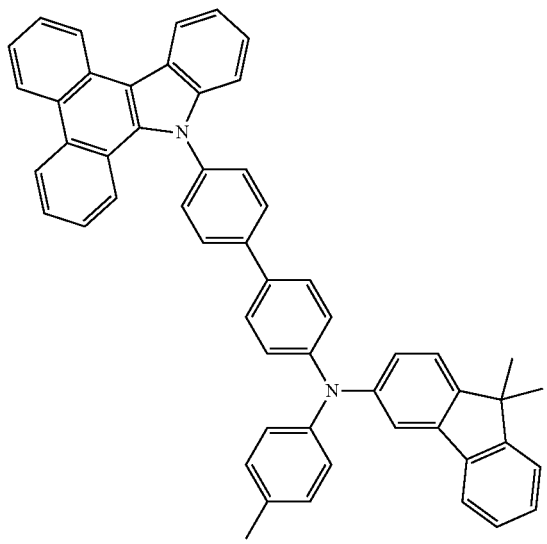
2-116
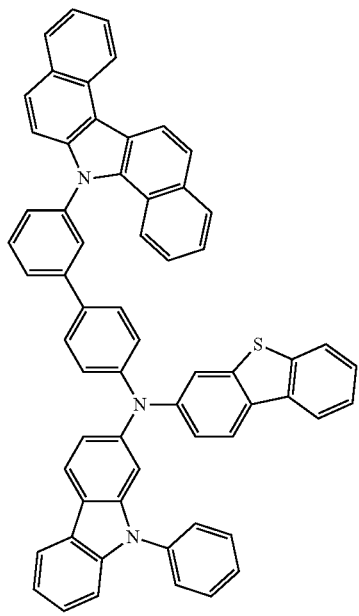
2-117
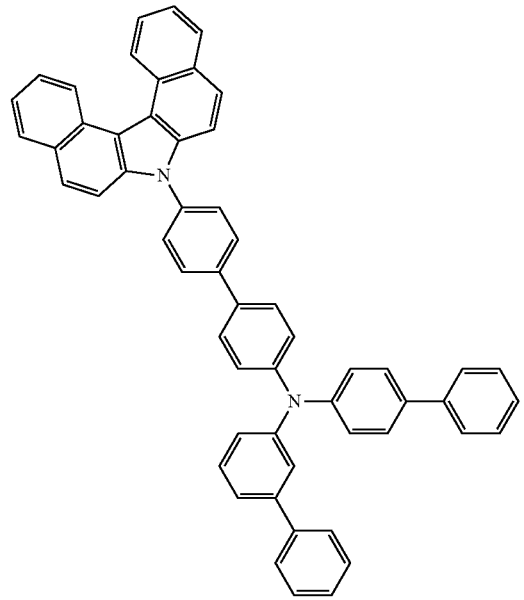
2-118
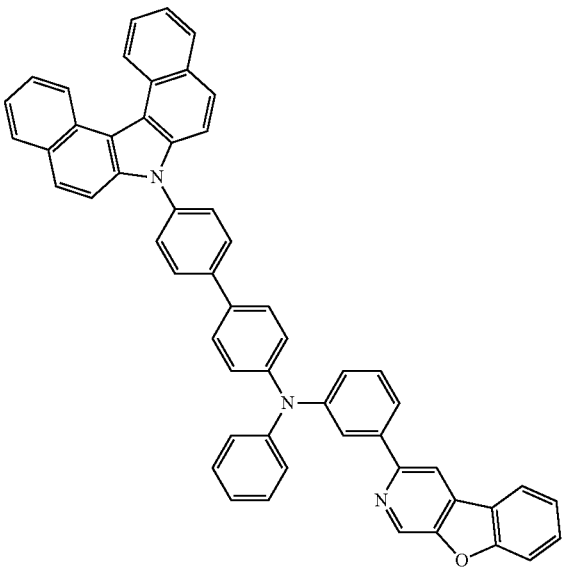

2-119
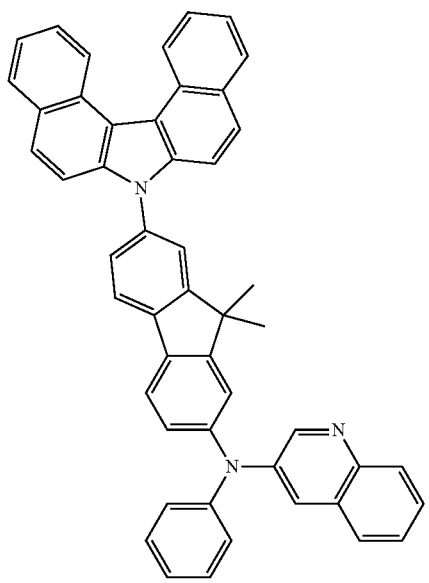
2-121
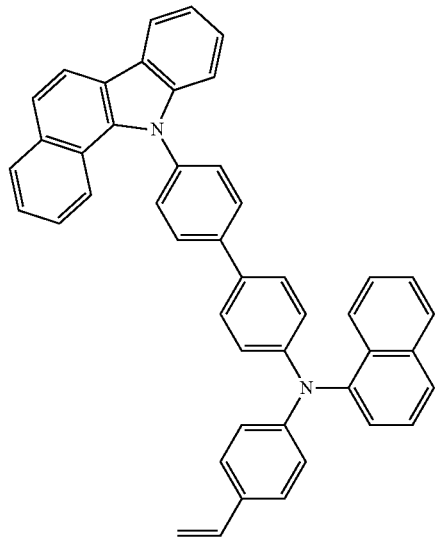
2-120
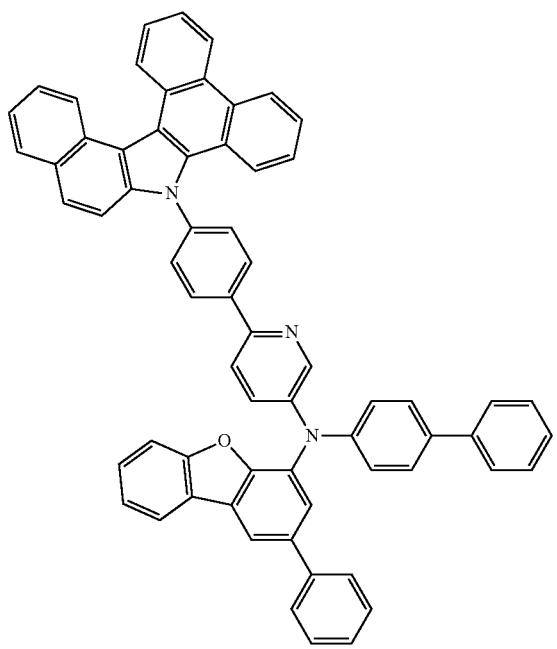
2-122
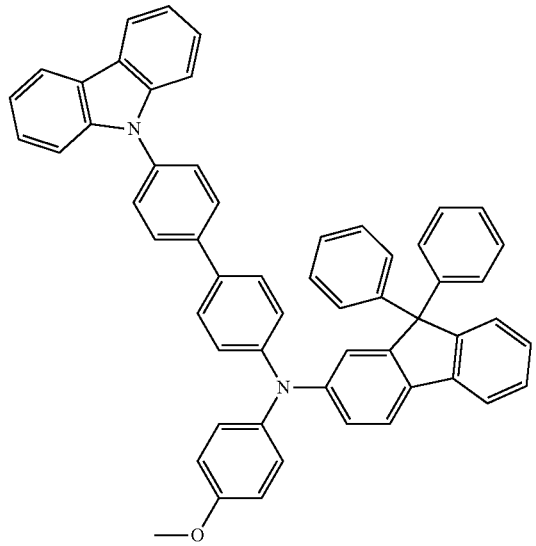

2-123

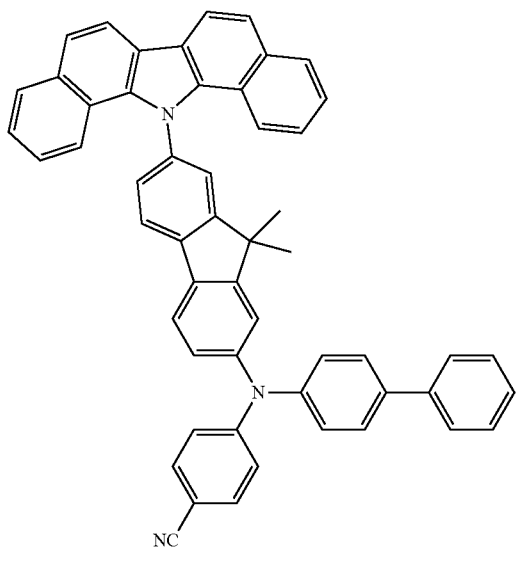

2-124

2-125

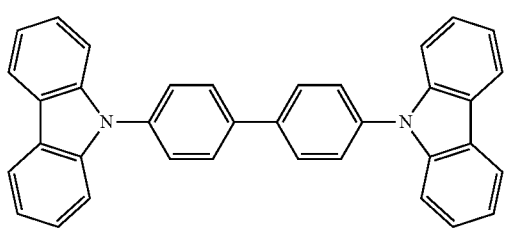

2-126

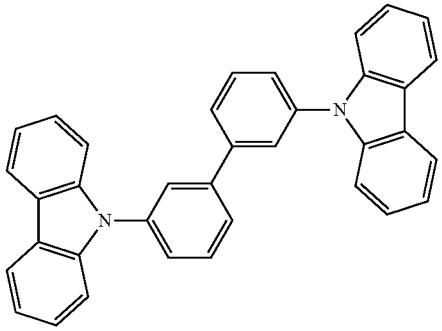

2-127

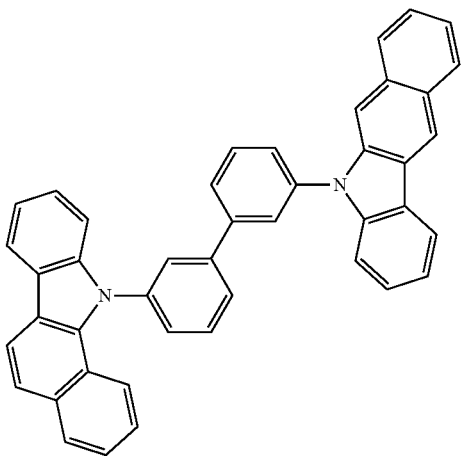

2-128

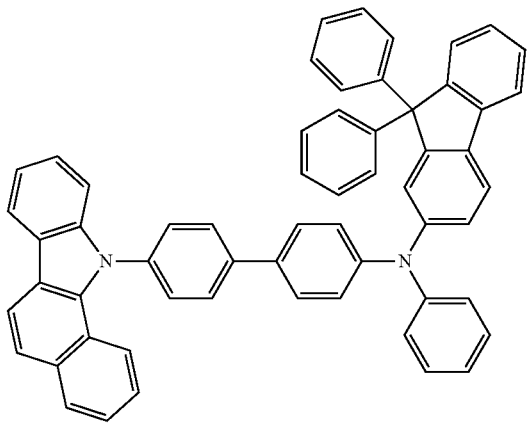

14. The blue organic electric element of claim 1, wherein a thickness of the first light-emitting auxiliary layer and the second light-emitting auxiliary layer is 1:9 to 5:5.

15. The blue organic electric element of claim 1, further comprising a layer for improving luminous efficiency on one side of the anode or the cathode and the one side, wherein the one side is not facing the organic material layer.

16. The blue organic electric element of claim 1, wherein the organic material layer comprises two or more stacks, and the stacks each comprise a hole transport layer, a light emitting layer and an electron transport layer formed sequentially on the anode.

17. The blue organic electric element of claim 16, wherein the organic material layer further comprises a charge generation layer formed between the two or more stacks.

18. An electronic device comprising a display device and a control unit for driving the display device, wherein the display device comprises the blue organic electric element of claim 1.

19. The electronic device of claim 18, wherein the blue organic electric element is selected from the group consisting of an organic electroluminescent element, an organic solar cell, an organic photo conductor, an organic transistor, an element for monochromatic illumination, and a quantum dot display.

* * * * *